United States Patent
Kinugawa et al.

(10) Patent No.: US 10,069,280 B2
(45) Date of Patent: Sep. 4, 2018

(54) SEMICONDUCTOR OPTICAL ELEMENT, SEMICONDUCTOR LASER ELEMENT, AND METHOD FOR MANUFACTURING SEMICONDUCTOR OPTICAL ELEMENT AND SEMICONDUCTOR LASER ELEMENT, AND METHOD FOR MANUFACTURING SEMICONDUCTOR LASER MODULE AND SEMICONDUCTOR ELEMENT

(71) Applicant: FURUKAWA ELECTRIC CO., LTD., Tokyo (JP)

(72) Inventors: Kouhei Kinugawa, Tokyo (JP); Hidehiro Taniguchi, Tokyo (JP); Masafumi Tajima, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 14/825,660

(22) Filed: Aug. 13, 2015

(65) Prior Publication Data
US 2015/0349495 A1    Dec. 3, 2015

Related U.S. Application Data

(63) Continuation of application No. PCT/JP2014/053361, filed on Feb. 13, 2014.

(30) Foreign Application Priority Data

Feb. 13, 2013  (JP) .................................. 2013-026084
Feb. 13, 2013  (JP) .................................. 2013-026085
(Continued)

(51) Int. Cl.
*H01S 5/20*   (2006.01)
*H01S 5/042*  (2006.01)
(Continued)

(52) U.S. Cl.
CPC ............ *H01S 5/2072* (2013.01); *G02B 6/122* (2013.01); *G02B 6/1342* (2013.01);
(Continued)

(58) Field of Classification Search
None
See application file for complete search history.

(56) References Cited

U.S. PATENT DOCUMENTS 5,228,047 A   7/1993  Matsumoto et al.
5,376,582 A   12/1994 Behfar-Rad et al.
(Continued)

FOREIGN PATENT DOCUMENTS

EP   1 699 121 A1   9/2006
JP   06-77596 A     3/1994
(Continued)

OTHER PUBLICATIONS

U.S. Office Action dated Dec. 10, 2015 in co-pending U.S. Appl. No. 14/460,090.
(Continued)

*Primary Examiner* — Jack Chen
(74) *Attorney, Agent, or Firm* — Oblon, McClelland, Maier & Neustadt, L.L.P.

(57) ABSTRACT

A semiconductor optical element includes a semiconductor layer portion that includes an optical waveguide layer. The semiconductor layer portion contains a first impurity having a function of suppressing atomic vacancy diffusion and a second impurity having a function of promoting atomic vacancy diffusion, between a topmost surface of the semiconductor layer portion and the optical waveguide layer. The semiconductor layer portion includes two or more regions that extend in a deposition direction with different contents of at least one of the impurities. At least one of the two or more regions contains both the first impurity and the second
(Continued)

impurity. The two or more regions have different degrees of disordering in the optical waveguide layer achieved through atomic vacancy diffusion and different band gap energies of the optical waveguide layer.

16 Claims, 62 Drawing Sheets

(30) Foreign Application Priority Data

| | | |
|---|---|---|
| Mar. 21, 2013 | (JP) | 2013-058841 |
| Mar. 21, 2013 | (JP) | 2013-058842 |
| Sep. 30, 2013 | (JP) | 2013-205286 |

(51) Int. Cl.

| | |
|---|---|
| *G02B 6/122* | (2006.01) |
| *H01S 5/16* | (2006.01) |
| *H01S 5/22* | (2006.01) |
| *G02B 6/134* | (2006.01) |
| *H01S 5/028* | (2006.01) |
| *H01S 5/30* | (2006.01) |

(52) U.S. Cl.
CPC ............ *H01S 5/0421* (2013.01); *H01S 5/162* (2013.01); *H01S 5/22* (2013.01); *H01S 5/0287* (2013.01); *H01S 5/2205* (2013.01); *H01S 5/3054* (2013.01)

(56) References Cited

U.S. PATENT DOCUMENTS

| | | |
|---|---|---|
| 5,513,199 A | 4/1996 | Haase et al. |
| 5,568,501 A | 10/1996 | Otsuka et al. |
| 5,594,749 A | 1/1997 | Behfar-Rad et al. |
| 5,699,375 A | 12/1997 | Paoli |
| 5,708,674 A | 1/1998 | Beernink et al. |
| 5,764,669 A | 6/1998 | Nagai |
| 5,843,802 A | 12/1998 | Beernink et al. |
| 6,005,881 A | 12/1999 | Ikoma |
| 6,590,918 B1 | 7/2003 | Mannou et al. |
| 6,674,778 B1 | 1/2004 | Lin et al. |
| 7,590,158 B2 | 9/2009 | Ono et al. |
| 8,030,224 B2 | 10/2011 | Taniguchi et al. |
| 8,615,026 B2 | 12/2013 | Taniguchi |
| 8,660,160 B2 | 2/2014 | Taniguchi et al. |
| 8,842,707 B2 | 9/2014 | Taniguchi et al. |
| 2003/0042492 A1 | 3/2003 | Watanabe |
| 2003/0128730 A1 | 7/2003 | Ohkubo |
| 2003/0206566 A1 | 11/2003 | Ohitsu et al. |
| 2004/0066822 A1 | 4/2004 | Ohkubo |
| 2004/0119081 A1 | 6/2004 | Takemi et al. |
| 2004/0125842 A1 | 7/2004 | Watanabe |
| 2006/0126688 A1 | 6/2006 | Kneissl |
| 2007/0026620 A1 | 2/2007 | Yamada |
| 2007/0045651 A1 | 3/2007 | Suzuki |
| 2007/0096142 A1 | 5/2007 | Tachibana et al. |
| 2010/0105158 A1 | 4/2010 | Yamada |
| 2014/0027809 A1 | 1/2014 | Taniguchi et al. |
| 2015/0180203 A1* | 6/2015 | Kinugawa ............... H01S 5/162 372/45.01 |

FOREIGN PATENT DOCUMENTS

| | | | |
|---|---|---|---|
| JP | 7-122816 A | | 5/1995 |
| JP | 08-236860 A | | 9/1996 |
| JP | 09-023037 A | | 1/1997 |
| JP | 10-065278 A | | 3/1998 |
| JP | 10-200190 A | | 7/1998 |
| JP | 2001-015859 A | | 1/2001 |
| JP | 2007-242718 A | | 9/2007 |
| JP | 2011-103494 A | | 5/2011 |
| JP | 2011-233644 A | | 11/2011 |
| WO | WO 2009/031206 A1 | | 3/2009 |
| WO | WO 2009/066739 A1 | | 5/2009 |
| WO | WO 2012/137426 A1 | | 10/2012 |

OTHER PUBLICATIONS

Office Action dated Apr. 26, 2016 in U.S. Appl. No. 14/622,363.
Office Action dated Aug. 17, 2017 in co-pending U.S. Appl. No. 14/622,363.
Office Action dated Aug. 8, 2011 in U.S. Appl. No. 12/716,315.
Office Action dated Feb. 2, 2012 in U.S. Appl. No. 12/716,315.
Office Action dated May 29, 2012 in U.S. Appl. No. 12/716,315.
Office Action dated Nov. 28, 2012 in U.S. Appl. No. 12/716,315.
Office Action dated May 16, 2013 in U.S. Appl. No. 12/716,315.
Office Action dated Oct. 29, 2013 in U.S. Appl. No. 12/716,315.
Office Action dated Jul. 15, 2015 in U.S. Appl. No. 14/460,090.
Office Action dated Feb. 3, 2015 in U.S. Appl. No. 14/460,090.
H. Taniguchi et al. "9xx nm High Power Lasers with Window Structure Fabricated by Impurity Free Vacancy Disordering (IFVD)", IEICE Technical Report, Dec. 2006, 5 pages (with English abstract).
Extended European Search Report dated Jun. 10, 2014 in European Application No. 07806686.7.
H. Taniguchi et al. "25W 915nm Lasers with Window Structure Fabricated by Impurity Free Vacancy Disordering (IFVD)", IEEE, 20th International Semiconductor Laser Conference, (IEEE Cat. No. 06CH37738), 2006, XP002724666, 2 pages.
G. E. Höfler et al. "Direct Evidence for Interstitial Carbon in Heavily Carbon-Doped GaAs", Mat. Res. Soc. Symp. Proc., vol. 240, 1992, XP002724667, 6 pages.
Nguyen Hong KY et al. "Self-Interstitial Mechanism for Zn Diffusion-Induced Disordering of GaAs/$Al_xGa_{1-x}As$ (x=0.1-1) Multiple-Quantum-Well Structures", J. Appl. Phys. vol. 73, No. 8, Apr. 15, 1993, XP002724668, 13 pages.
T. Ahlgren "Identification of Silicon Interstitials in Ion Implanted GaAs", Physical Review Letters, vol. 81, No. 4, Jul. 27, 1998, XP002724669, 6 pages.
U.S. Appl. No. 14/460,090, filed Aug. 14, 2014, Taniguchi, et al.
International Search Report dated May 27, 2014 for PCT/JP2014/053361 filed on Feb. 13, 2014 with English Translation.

* cited by examiner

|  |  | EXAMPLE 1-1 | EXAMPLE 1-2 | EXAMPLE 1-3 | COMPARATIVE EXAMPLE 1 |
|---|---|---|---|---|---|
| NON-WINDOW REGION | C CONTENT [cm$^{-2}$] | \multicolumn{4}{c|}{$9.52 \times 10^{14}$} |
| | Zn CONTENT [cm$^{-2}$] | \multicolumn{4}{c|}{$1.60 \times 10^{14}$} |
| | AMOUNT OF Eg SHIFT [meV] | \multicolumn{4}{c|}{5} |
| WINDOW REGION | C CONTENT [cm$^{-2}$] | \multicolumn{4}{c|}{$9.52 \times 10^{14}$} |
| | ETCHED AMOUNT D [nm] | 99 | 72 | 30 | 0 |
| | Zn CONTENT [cm$^{-2}$] | $3.88 \times 10^{13}$ | $7.25 \times 10^{13}$ | $1.25 \times 10^{14}$ | $1.60 \times 10^{14}$ |
| | AMOUNT OF Eg SHIFT [meV] | 136 | 124 | 105 | 95 |
| ΔEg [meV] | | 131 | 119 | 100 | 90 |

| | | EXAMPLE 2 | COMPARATIVE EXAMPLE 2 |
|---|---|---|---|
| NON-WINDOW REGION | C CONTENT [$cm^{-2}$] | | $8.53 \times 10^{14}$ |
| | Zn CONTENT [$cm^{-2}$] | | $1.25 \times 10^{14}$ |
| | AMOUNT OF Eg SHIFT [meV] | | 9 |
| WINDOW REGION | C CONTENT [$cm^{-2}$] | $9.52 \times 10^{14}$ | $8.53 \times 10^{14}$ |
| | Zn CONTENT [$cm^{-2}$] | | $1.25 \times 10^{14}$ |
| | AMOUNT OF Eg SHIFT [meV] | 105 | 22 |
| ΔEg [meV] | | 96 | 13 |

|  |  | EXAMPLE 3-1 | EXAMPLE 3-2 | COMPARA-TIVE EXAMPLE 3 |
|---|---|---|---|---|
| NON-WINDOW REGION | Zn CONTENT [$cm^{-2}$] | $4.38 \times 10^{14}$ | $1.45 \times 10^{15}$ | $1.91 \times 10^{15}$ |
|  | AMOUNT OF Eg SHIFT [meV] | 2 | 14 | 30 |
| WINDOW REGION | Zn CONTENT [$cm^{-2}$] | $1.91 \times 10^{15}$ | | |
|  | AMOUNT OF Eg SHIFT [meV] | 52 | | |
| ΔEg [meV] | | 50 | 38 | 22 |

|  |  | EXAMPLE 4-1 | EXAMPLE 4-2 | COMPARA-TIVE EXAMPLE 4 |
|---|---|---|---|---|
| NON-WINDOW REGION | Zn CONTENT [cm$^{-2}$] | 4.38×10$^{14}$ | 1.23×10$^{15}$ | 1.50×10$^{15}$ |
| | AMOUNT OF Eg SHIFT [meV] | 21 | 16 | 14 |
| WINDOW REGION | Zn CONTENT [cm$^{-2}$] | 4.38×10$^{14}$ | | |
| | AMOUNT OF Eg SHIFT [meV] | 29 | | |
| ΔEg [meV] | | 8 | 13 | 15 |

| | | EXAMPLE 5-1 | EXAMPLE 5-2 | COMPARATIVE EXAMPLE 5 |
|---|---|---|---|---|
| NON-WINDOW REGION | C CONTENT [cm$^{-2}$] | 5.80×10$^{14}$ | 7.20×10$^{14}$ | 1.20×10$^{15}$ |
| | AMOUNT OF Eg SHIFT [meV] | 3 | 4 | 14 |
| WINDOW REGION | C CONTENT [cm$^{-2}$] | 1.20×10$^{15}$ | | |
| | AMOUNT OF Eg SHIFT [meV] | 24 | | |
| ΔEg [meV] | | 21 | 20 | 10 |

SEMICONDUCTOR OPTICAL ELEMENT, SEMICONDUCTOR LASER ELEMENT, AND METHOD FOR MANUFACTURING SEMICONDUCTOR OPTICAL ELEMENT AND SEMICONDUCTOR LASER ELEMENT, AND METHOD FOR MANUFACTURING SEMICONDUCTOR LASER MODULE AND SEMICONDUCTOR ELEMENT

CROSS-REFERENCE TO RELATED APPLICATIONS

This application is a continuation of PCT International Application No. PCT/JP2014/053361 filed on Feb. 13, 2014, which claims the benefit of priority from Japanese Patent Application Nos. 2013-026084 filed on Feb. 13, 2013, 2013-026085 filed on Feb. 13, 2013, 2013-058841 filed on Mar. 21, 2013, 2013-058842 filed on Mar. 21, 2013, and 2013-205286 filed on Sep. 30, 2013, entire contents of which are incorporated herein by reference.

BACKGROUND OF THE INVENTION

1. Field of the Invention

The present invention relates to a semiconductor optical element, a semiconductor laser element, and method for manufacturing a semiconductor optical element and a semiconductor laser element, and method for manufacturing a semiconductor laser module and a semiconductor element.

2. Description of the Related Art

An essential part of semiconductor element designing is in the use of a plurality of semiconductors having different physical properties in different regions of a semiconductor element to achieve a semiconductor element with functions suitable for an intended use. Physical properties such as the band gap or the refractive index of the semiconductor are important factors that determine an element design. A semiconductor can be designed to have desired physical properties by changing the semiconductor materials to be deposited, and the type, the concentration, and a combination of doping impurities.

One way to change the physical properties of a semiconductor is disordering of crystal. Exemplary techniques for disordering of crystal include impurity free vacancy disordering (IFVD), in which semiconductor disordered crystals are obtained by atomic vacancy diffusion, and impurity diffusion, in which semiconductor disordered crystals are obtained by diffusion of impurities. These techniques are used in semiconductor laser elements, for example. When the optical power of a laser element is increased, however, the output facet may absorb the laser light and become heated. When the facet becomes heated, a phenomenon known as catastrophic optical damage (COD) might occur, and the reliability might become degraded. COD is a phenomenon in which the heat causes the facet to melt down, thereby causing an interruption in the functions of the laser element. To avoid COD, a technology making the facet transparent by disordering crystals is disclosed. Use of such a technology can raise the optical power limit at which COD occurs.

This technology of making the facet transparent by disordering crystals is aimed to reduce the laser light absorbed at the facet of the semiconductor element by increasing the band gap energy of a semiconductor region near the facet by semiconductor disordered crystals, thereby making the region near the facet transparent to the emission wavelength (see Japanese Patent Application Laid-open Nos. 2007-242718, H09-23037, H10-200190, 2001-15859, 2011-10349, for example). This transparent region is referred to as a window region. The area that is not transparent is referred to as a non-window region.

Also disclosed is a technology for manufacturing a semiconductor optical element having various functions by making the degrees of disordering of crystals different among a plurality of regions extending in the deposition direction of the semiconductor layers (see Japanese Patent Application Laid-open No. H06-77596, for example).

SUMMARY OF THE INVENTION

A semiconductor optical element according to an aspect of the present invention includes a semiconductor layer portion that includes an optical waveguide layer. The semiconductor layer portion contains a first impurity having a function of suppressing atomic vacancy diffusion and a second impurity having a function of promoting atomic vacancy diffusion, between a topmost surface of the semiconductor layer portion and the optical waveguide layer. The semiconductor layer portion includes two or more regions that extend in a deposition direction with different contents of at least one of the impurities. At least one of the two or more regions contains both the first impurity and the second impurity. The two or more regions have different degrees of disordering in the optical waveguide layer achieved through atomic vacancy diffusion and different band gap energies of the optical waveguide layer.

A semiconductor laser element that is an edge emitting semiconductor laser element according to another aspect of the present invention, includes a semiconductor layer portion including an active layer. The semiconductor layer portion has a non-window region including a part of the active layer and extending in a deposition direction, and a window region provided at least in a region adjacent to a facet from which laser light is output, the window region including another part of the active layer, having a higher band gap energy increased through atomic vacancy diffusion than that in the non-window region, and extending in the deposition direction. The semiconductor layer portion contains a first impurity having a function of suppressing the atomic vacancy diffusion and a second impurity having a function of promoting the atomic vacancy diffusion, between a topmost surface of the semiconductor layer portion and the active layer. The non-window region has a higher content of the first impurity than in the window region, and contains the second impurity.

A semiconductor laser element that is an edge emitting semiconductor laser element according to still another aspect of the present invention, includes a semiconductor layer portion including an active layer. The semiconductor layer portion has a non-window region including a part of the active layer and extending in a deposition direction, and a window region provided at least in a region adjacent to a facet from which laser light is output, the window region including another part of the active layer, having a higher band gap energy increased through atomic vacancy diffusion than that in the non-window region, and extending in the deposition direction. The semiconductor layer portion contains a first impurity having a function of suppressing the atomic vacancy diffusion and a second impurity having a function of promoting the atomic vacancy diffusion, between a topmost surface of the semiconductor layer portion and the active layer. The window region has a higher content of the second impurity than in the non-window region, and contains the first impurity.

A semiconductor laser element that is an edge emitting semiconductor laser element according to still another aspect of the present invention, includes a semiconductor layer portion including an active layer. The semiconductor layer portion has a non-window region including a part of the active layer, and a window region provided at least in a region adjacent to a facet from which laser light is output, the window region including another part of the active layer and having a higher band gap energy increased through atomic vacancy diffusion than that in the non-window region. A topmost layer region of the non-window region in the semiconductor layer portion contains a first impurity of a first conductivity type having a function of suppressing atomic vacancy diffusion and a second impurity of the first conductivity type having a function of promoting atomic vacancy diffusion. The topmost layer region has a higher content of one of the first impurity and the second impurity with a lower diffusion coefficient.

A semiconductor laser module according to still another aspect of the present invention includes the semiconductor laser element according to an aspect of the present invention, and capable of operating without adjusting temperature of the semiconductor laser element.

A method for manufacturing a semiconductor optical element that includes a semiconductor layer portion including an optical waveguide layer, and having two or more regions with different degrees of disordering in the optical waveguide layer achieved through atomic vacancy diffusion and different band gap energies of the optical waveguide layer, according to still another aspect of the present invention includes: forming a semiconductor layer portion; depositing a dielectric film on the semiconductor layer portion; and annealing to form atomic vacancies in a first region that is at least one of the two or more regions. The forming includes forming a second impurity-containing layer on a topmost layer of the semiconductor layer portion, the second impurity-containing layer containing a second impurity of a first conductivity type having a function of promoting atomic vacancy diffusion; forming a first impurity-containing layer on a surface of the second impurity-containing layer, the first impurity-containing layer containing a first impurity of the first conductivity type having a function of suppressing atomic vacancy diffusion; and removing at least a part of the first impurity-containing layer formed at the forming of the first impurity-containing layer from the first region.

A method for manufacturing a semiconductor optical element that includes a semiconductor layer portion including an optical waveguide layer, and having two or more regions with different degrees of disordering in the optical waveguide layer achieved through atomic vacancy diffusion and different band gap energies of the optical waveguide layer, according to still another aspect of the present invention includes: forming a semiconductor layer portion; depositing a dielectric film on the semiconductor layer portion; and annealing to form atomic vacancies in a first region that is at least one of the two or more regions. The forming includes forming a first impurity-containing layer on a topmost layer of the semiconductor layer portion, the first impurity-containing layer containing a first impurity of a first conductivity type having a function of suppressing atomic vacancy diffusion; forming a second impurity-containing layer on a surface of the first impurity-containing layer, the second impurity-containing layer containing a second impurity of the first conductivity type having a function of promoting atomic vacancy diffusion; and removing at least a part of the second impurity-containing layer formed in a second region that is not the first region and that is at least one of the two or more regions.

A method for manufacturing a semiconductor laser element that is an edge emitting semiconductor laser element that includes a semiconductor layer portion including an active layer, the semiconductor layer portion having a non-window region including a part of the active layer and a window region provided at least in a region adjacent to a facet from which laser light is output, the window region including another part of the active layer and having a higher band gap energy increased through atomic vacancy diffusion than that in the non-window region, according to still another aspect of the present invention includes: forming the semiconductor layer portion; depositing a dielectric film on the semiconductor layer portion; and annealing to form and to diffuse atomic vacancies in the window region. The forming of the semiconductor layer portion includes allowing a topmost layer region of the semiconductor layer portion to contain one of the first impurity having a function of suppressing atomic vacancy diffusion and the second impurity having a function of promoting atomic vacancy diffusion with a lower diffusion coefficient in a larger amount.

A method for manufacturing a semiconductor element that includes a semiconductor layer structure having a first region, and a second region with a higher degree of disordering achieved through atomic vacancy diffusion than that in the first region, according to still another aspect of the present invention includes: forming the semiconductor layer structure with doping a first impurity having a function of suppressing atomic vacancy diffusion or a second impurity having a function of promoting atomic vacancy diffusion; enabling disordered crystals to grow more easily in the second region than in the first region of the semiconductor layer structure; bringing a topmost surface of the first region and a topmost surface of the second region into contact with a uniform medium; and annealing to form and to diffuse the atomic vacancies in the second region. The enabling includes at least one of: allowing an amount of the first impurity having a function of suppressing atomic vacancy diffusion to be smaller in the second region than in the first region, and allowing an amount of the second impurity having a function of promoting atomic vacancy diffusion to be smaller in the first region than in the second region.

The above and other features, advantages, and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
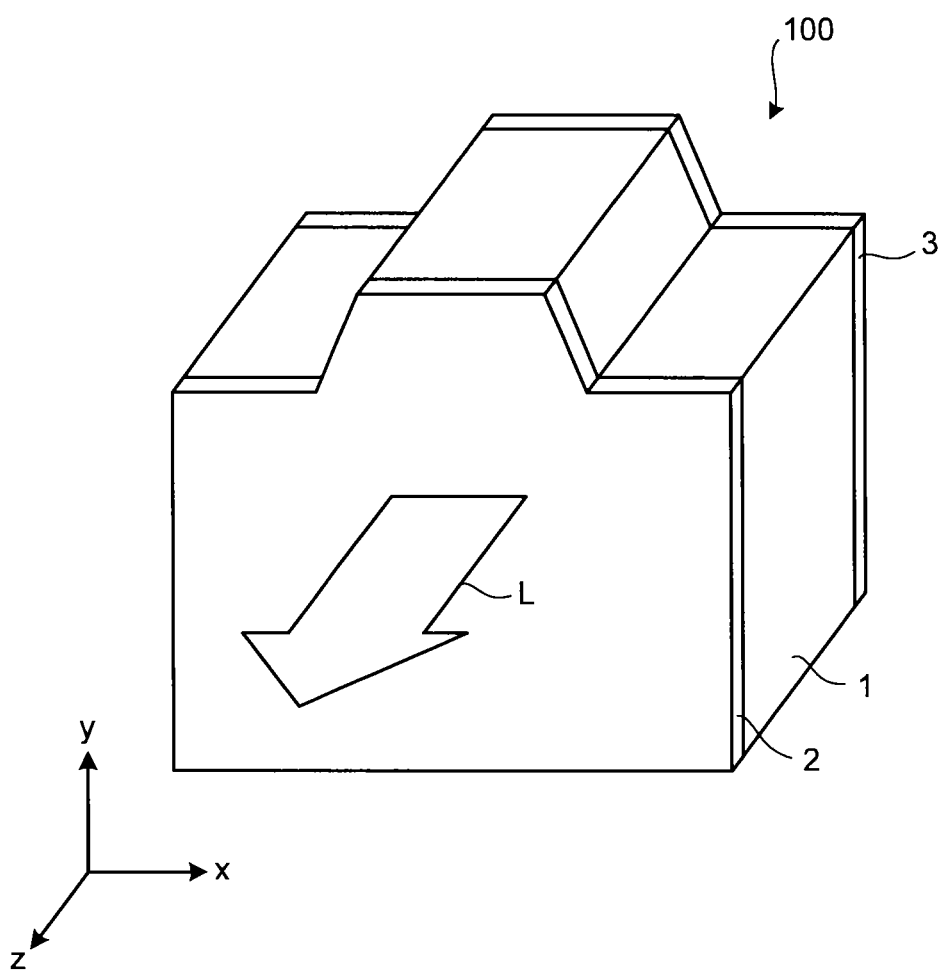
FIG. 1 is a perspective view of a semiconductor laser element according to a first embodiment.

Embodiments of a semiconductor optical element, a semiconductor laser element, and method for manufacturing a semiconductor optical element and a semiconductor laser element, and method for manufacturing a semiconductor laser module and a semiconductor element according to the present invention formed using the IFVD method will be explained below with reference to the accompanying drawings. The present invention is not limited by these embodiments. Furthermore, in the drawings, like parts are denoted by like reference numerals. Further, the drawings are schematic, and it should be noted that the relationship between a thickness and a width of each layer and the ratios among the layers may be different from the actual. The relationship between sizes and the ratios may also be different among the drawings.

There is also a demand for an increased band gap energy difference between such regions to improve the properties of a semiconductor optical element such as a semiconductor laser element. The semiconductor disordered crystals using the conventional IFVD, however, is particularly found to have difficulties in increasing the band gap difference.

Furthermore, a semiconductor laser element with a transparent facet achieved with the technology using the conventional IFVD might result in lower power conversion efficiency, which is a ratio of an optical power with respect to an input electric power.

Furthermore, in the method for manufacturing a semiconductor element with a transparent facet achieved with the technology using the conventional IFVD, two or more dielectric films with different compositions need to be formed on the top surface of the semiconductors in order to achieve the non-window region and the window region with different degrees of disordered crystals.

In contrast, according to the embodiments, a semiconductor optical element, a semiconductor laser element, and a method for manufacturing the semiconductor optical element and the semiconductor laser element, and a method for manufacturing a semiconductor laser module and a semiconductor element capable of addressing at least one of the challenges in disordered crystal can be provided.

First Embodiment

A semiconductor optical element according to a first embodiment of the present invention will be explained. The semiconductor optical element according to the first embodiment is a semiconductor laser element, and has a ridge structure providing optical confinement in the width direction and providing a current confining structure.

FIG. 1 is a schematic perspective view of a semiconductor laser element according to the first embodiment. Hereinafter, a direction perpendicular to the deposition direction of the semiconductor layers, and perpendicular to the direction in which the laser light is output is referred to as an x axis. The deposition direction of the semiconductor layers is referred to as a y axis, and the direction in which the laser light is output is referred to as a z axis, as illustrated in FIG. 1. As illustrated in FIG. 1, this semiconductor laser element 100 includes a low reflection film 2 that is applied on one facet of the element body 1, the facet being from which the light is output, and that has a reflectivity equal to or lower than 10 percent, for example, and a high reflection film 3 that is applied on the rear facet that is on the opposite side of the outgoing-side facet, and that has a reflectivity equal to or higher than 90 percent, for example. The semiconductor laser element 100 outputs laser light L through the low-reflectivity coating 2.

Figure 2A:
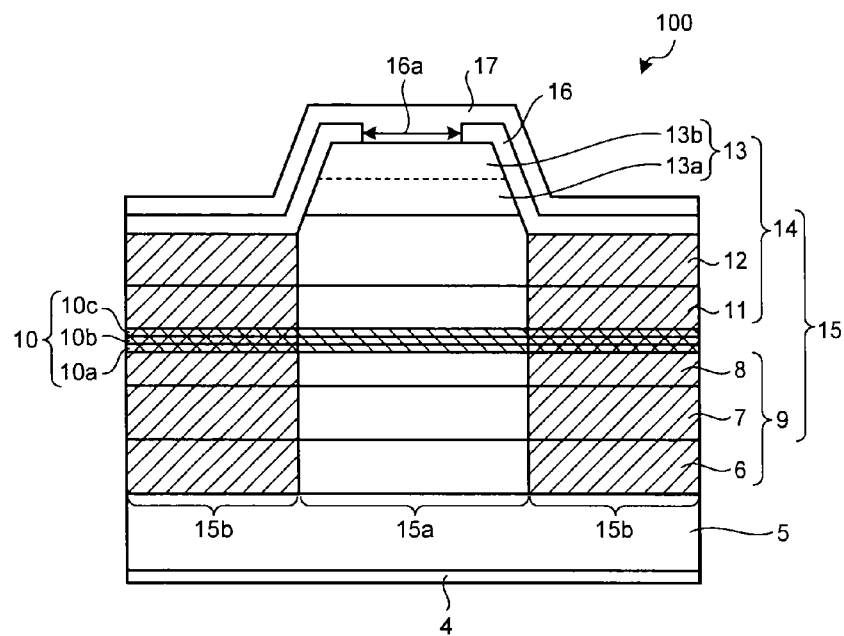
FIG. 2A is a cross-sectional view along an x-y plane in the semiconductor laser element illustrated in FIG. 1.
Figure 2B:
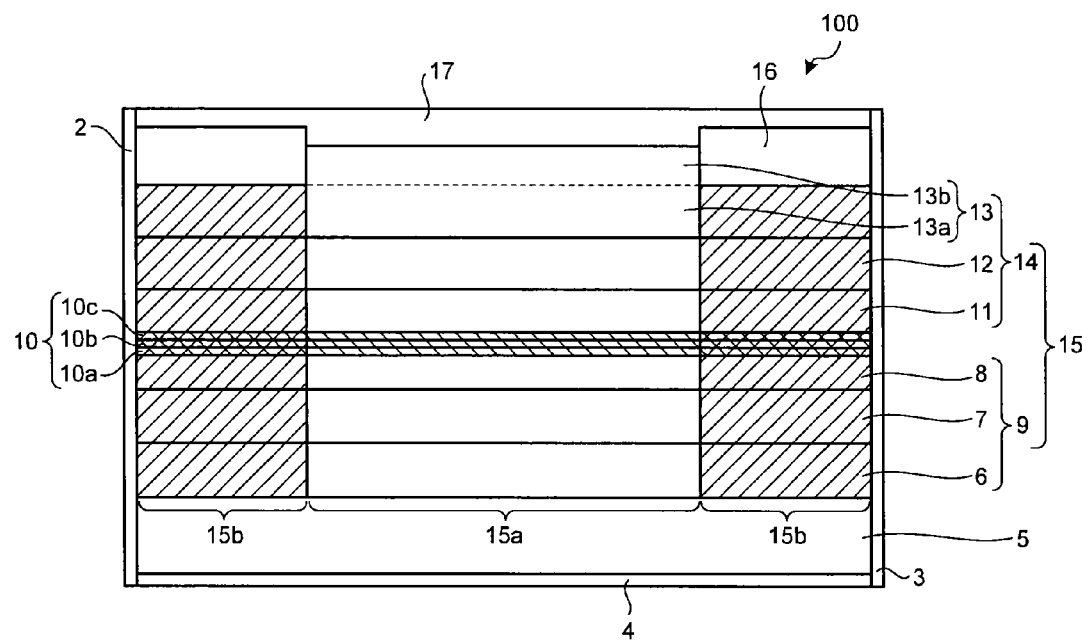
FIG. 2B is a cross-sectional view along a y-z plane in the semiconductor laser element illustrated in FIG. 1.

FIG. 2A is a cross-sectional view along the x-y plane in the semiconductor laser element illustrated in FIG. 1, and FIG. 2B is a cross-sectional view along the y-z plane in the semiconductor laser element illustrated in FIG. 1. As illustrated in FIG. 2A, this semiconductor laser element 100 is provided with a substrate 5 the bottom surface of which is provided with a lower electrode 4 that is an n-side electrode made of n-type gallium arsenide (GaAs), and a semiconductor layer portion 15 including an n-type semiconductor layer section 9, an active layer 10, and a p-type semiconductor layer section 14. The n-type semiconductor layer section 9 includes an n-type buffer layer 6, an n-type cladding layer 7, and an n-type guide layer 8, and the p-type semiconductor layer section 14 includes a p-type guide layer 11, a p-type cladding layer 12, and a p-type contact layer 13. The n-type semiconductor layer section 9, the active layer 10, and the p-type semiconductor layer section 14 are sequentially formed on the substrate 5. The p-type contact layer 13 includes two layers of a p-type contact layer 13a and a p-type contact layer 13b. The p-type contact layer 13 has a trapezoidal cross section, and has stripes extending in the z-axial direction. This p-type contact layer 13 provides the ridge structure to the semiconductor laser element 100. The semiconductor laser element 100 also includes an insulating film 16 that is formed on the p-type semiconductor layer section 14, and an upper electrode 17 that is a p-side electrode that is brought into contact with the p-type contact layer 13 via a part of the upper base of the trapezoidal ridge structure, the part being not provided with the insulating film 16.

The n-type buffer layer 6 is made of GaAs, and is a buffer layer allowing high-quality epitaxial layers to be grown on the substrate 5. The n-type cladding layer 7 and the n-type guide layer 8 are made of AlGaAs, with refractive index and thickness set in such a manner that desired optical confinement in the deposition direction is achieved. It is desirable for the Al composition of the n-type guide layer 8 to be equal to or higher than 20 percent and equal to or lower than 40 percent. The refractive index of the n-type cladding layer 7 is smaller than that of the n-type guide layer 8. It is preferable for the n-type guide layer 8 to have a thickness equal to or more than 50 nanometers, e.g., approximately 1000 nanometers. It is preferable for the n-type cladding layer 7 to have a thickness equal to or more than 1 micrometer, and approximately 3 micrometers. The n-type semiconductor layer section 9 contains silicon (Si), for example, as an n-type dopant.

The active layer 10 is provided with a lower barrier layer 10a, a quantum well layer 10b, and an upper barrier layer 10c, and has a single quantum well (SQW) structure. The lower barrier layer 10a and the upper barrier layer 10c serve as barriers for confining carriers to the quantum well layer 10b, and are made of highly-pure AlGaAs that is intentionally kept undoped. The quantum well layer 10b is made of highly-pure InGaAs that is intentionally kept undoped. The In composition and the film thickness of the quantum well layer 10b, and the compositions of the lower barrier layer 10a and the upper barrier layer 10c are set based on a desired central wavelength (e.g., 0.98 micrometer). The active layer 10 may have a multiple quantum well (MQW) structure including repetitions of a layered structure having the quantum well layer 10b and the barrier layers formed on top of and on the bottom of the quantum well layer 10b, respectively, or may have a bulk structure not having the lower barrier layer 10a and the upper barrier layer 10c. Although explained herein is a structure with highly-pure layers that are intentionally kept undoped, the quantum well layer 10b, the lower barrier layer 10a, and the upper barrier layer 10c may alternatively be intentionally doped with a donor or an acceptor.

The p-type guide layer 11 and the p-type cladding layer 12 are paired with the n-type cladding layer 7 and the n-type guide layer 8, respectively, and are made of AlGaAs the refractive index and thickness of which are set to achieve desired optical confinement in the deposition direction. The Al composition of the p-type guide layer 11 is preferably equal to or higher than 20 percent and equal to or lower than 40 percent. The refractive index of the p-type cladding layer 12 is smaller than that of the p-type guide layer 11. The Al composition of the p-type cladding layer 12 is set somewhat higher than that of the n-type cladding layer 7 so that the optical field in the layers is shifted toward the n-type cladding layer 7 to reduce a waveguide loss. The Al composition of the p-type guide layer 11 is set lower than that of the p-type cladding layer 12. The thickness of the p-type guide layer 11 is preferably equal to or more than 50 nanometers, and, for example, 1000 nanometers or so. The thickness of the p-type cladding layer 12 is preferably 1 micrometer to 3 micrometers or so. The p-type semiconductor layer section 14 contains carbon (C) as a p-type dopant. The C concentration of the p-type guide layer 11 is set to $0.1 \times 10^{17}$ $cm^{-3}$ to $1.0 \times 10^{17}$ $cm^{-3}$, for example, and is preferably $0.5 \times 10^{17}$ $cm^{-3}$ to $1.0 \times 10^{17}$ $cm^{-3}$ or so. The C concentration of the p-type cladding layer 12 is set to equal to or more than $1.0 \times 10^{17}$ $cm^{-3}$, for example.

The p-type contact layer 13 includes the p-type contact layer 13a made of GaAs that is doped with C as a p-type impurity at a concentration of approximately $1.0 \times 10^{17}$ $cm^{-3}$ to $5.0 \times 10^{19}$ $cm^{-3}$ to $5.0 \times 10^{20}$ $cm^{-3}$, for example, and the p-type contact layer 13b made of GaAs that is doped with zinc (Zn) as a p-type impurity in a concentration of $1.0 \times 10^{17}$ $cm^{-3}$ to $5.0 \times 10^{19}$ $cm^{-3}$ to $5.0 \times 10^{20}$ $cm^{-3}$ or so, for example. C and Zn have functions of promoting and suppressing atomic vacancy diffusion during rapid thermal annealing (RTA) in the manufacture process. The C and the Zn themselves might become diffused in the RTA, but, in the first embodiment, the conditions of the RTA such as temperature and time are adjusted so that the C and the Zn do not diffuse into the active layer 10 in the RTA. The insulating film 16 is made of SiNx, for example. The upper electrode 17 is made of a metallic material that brought into an ohmic contact with the semiconductor material in the p-type contact layer 13.

In a window region 15b, the insulating film 16 separates the upper electrode 17 from the p-type contact layer 13 that is at the topmost surface of the semiconductor layer portion 15. With this structure, a current injection area is selectively formed in a non-window region 15a of the semiconductor laser element 100. Alternatively, to suppress the current injection into the window region 15b without using the insulating film 16, the upper electrode 17 may be deposited directly on top of the non-window region 15a in a selective manner.

Furthermore, in the semiconductor laser element 100, a current confining structure is achieved by using the insulating film 16 to limit the area in which the upper electrode 17 is brought into contact with the p-type semiconductor layer section 14. In other words, the current path of the hole carriers injected from the upper electrode 17 via the p-type semiconductor layer section 14 is limited to the current injection area that is confined by the opening 16a, and that is in contact with the p-type contact layer 13 at the topmost surface of the semiconductor layer portion 15, so that a high density current is efficiently injected into the active layer 10, and used in oscillating the laser light L.

Figure 2C:
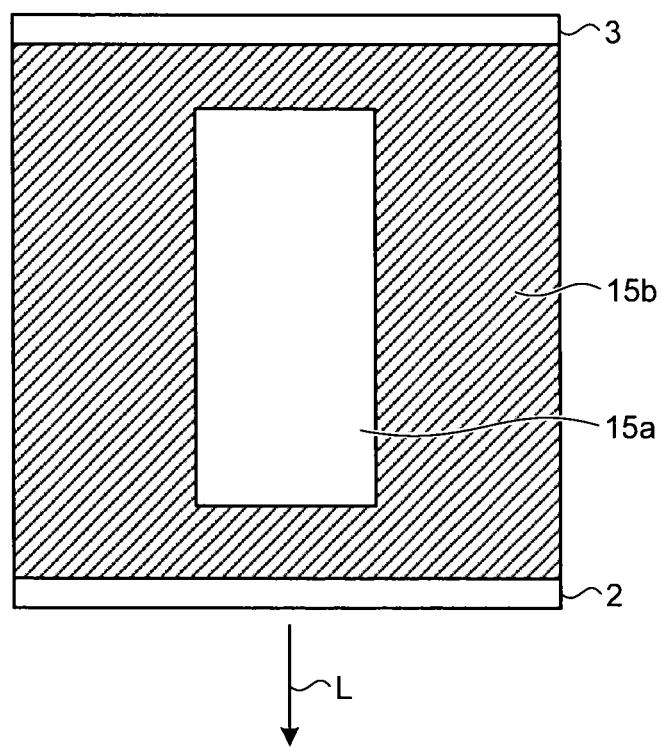
FIG. 2C is a cross-sectional view of along an x-z plane in the semiconductor laser element illustrated in FIG. 1.

The semiconductor layer portion 15 has the non-window region 15a, and the window region 15b in which the active layer 10 has larger band gap energy than that in the non-window region 15a. The non-window region 15a and the window region 15b are two areas extending in the deposition direction in the semiconductor layer portion 15. FIG. 2C is a cross-sectional view along the x-z plane in the semiconductor laser element illustrated in FIG. 1. As illustrated in FIG. 2C, the window region 15b is formed along the four facets of the semiconductor laser element 100, in a manner surrounding the non-window region 15a. In other words, two sides of the border between the non-window region 15a and the window region 15b are provided along the light guiding direction at the center of the semiconductor laser element 100, and the remaining two sides at the ends of facets of the semiconductor laser element 100 are provided in a manner traversing the light guiding direction, being at the ends with respect to the light guiding direction in the semiconductor laser element 100. The window region 15b is a region in which disordered crystals through atomic vacancy diffusion are obtained sufficiently by the RTA, and has a higher degree of disordering than in the non-window region 15a. With this structure, the difference between the band gap energy in the active layer 10 in the window region 15b and that in the non-window region 15a is set to 10 milli electron volts or higher, for example. One electron volt is approximately $1.60 \times 10^{-19}$ joules.

The window region is a region with a higher band gap energy than the region near the center of the active layer that is caused to emit light by current injection, and is a region in which disordered crystals are sufficiently obtained. The non-window region is a region that is not the window region, and in which disordering is suppressed. Larger differences in the degree of disordering obtained by atomic vacancy diffusion and band gap energy between the window region and the non-window region can make a window region that absorbs a smaller amount of laser light and reduce the risk of COD.

The semiconductor laser element 100 also has a structure in which the current injection area is positioned away from the window region 15b so that the current injected into the window region 15b is reduced. If a current is injected into the window region 15b, the window region 15b becomes heated by the injected current. The band gap in a semiconductor is generally known to be smaller when the temperature is higher. This means that, if a current is injected into the window region 15b, the band gap in the window region 15b will be lower. When a band gap in the window region 15b is smaller, the difference between the band gap energy in the window region 15b and that in the non-window region 15a becomes smaller, despite such a difference is achieved by disordered crystals in the active layer 10.

Because the semiconductor laser element 100 according to the first embodiment is provided with the current injection area positioned at the topmost surface of the non-window region 15a and positioned away from the window region 15b in the semiconductor layer portion 15, the difference between the band gap energy in the window region 15b and that in the non-window region 15a is prevented from being reduced. Therefore, a semiconductor laser element with a larger band gap energy difference can be achieved.

An operation of the semiconductor laser element 100 will now be explained. To begin with, a voltage is applied between the lower electrode 4 and the upper electrode 17, and carriers are injected into the active layer 10 via the n-type semiconductor layer section 9 and the p-type semiconductor layer section 14. The opening 16a on the insulating film 16 confines the current path followed by the hole carriers injected from the upper electrode 17 via the p-type semiconductor layer 14, so that the high density current is efficiently injected into the active layer 10. The width of the opening 16a that is the width at which the current is injected is referred to as a current injection width. The active layer 10 receiving the current injection emits light at a given central wavelength. The emitted light is confined and guided near the active layer 10 by the ridge structure in the x-axial direction, and by the refractive index difference between the guide layers and the cladding layers in the y-axial direction, and the laser is oscillated by the light amplifying effect of the active layer 10 and the optical resonator formed by the low reflection film 2 and the high reflection film 3. As a result, the semiconductor laser element 100 outputs the laser light L, same as illustrated in FIG. 1.

The semiconductor laser element 100 may be configured to oscillate in single-mode when the current injection width is 6 micrometers, for example, and the optical intensity is 500 milliwatts or higher. In such a configuration, the semiconductor laser element 100 can achieve a maximum optical power per micrometer of the current injection width of 80 mW/µm or higher. The semiconductor laser element 100 may also be configured to oscillate in multi-mode when the current injection width is 100 micrometers, for example, and when the optical intensity is 11 watts or higher. In this configuration, the semiconductor laser element 100 can achieve a maximum optical power per micrometer of the current injection width of 110 mW/µm or higher. Because the optical power per unit current injection width reaches an extremely high level in high-output lasers as described above, COD is more likely to occur. In the semiconductor laser element 100 according to the first embodiment, however, because the risk of COD is reduced, a semiconductor laser element that is reliable even with a high level output can be provided.

In the semiconductor laser element 100, the p-type contact layer 13b is not provided on the window region 15b, as illustrated in FIG. 2B. In other words, the thickness of the p-type semiconductor layer section 14, which is positioned between the topmost surface of the semiconductor layer portion 15 and the active layer 10, is different in the window region 15b and in the non-window region 15a. This is because, after the p-type contact layer 13b uniformly doped with Zn is formed on the non-window region 15a and the window region 15b, the p-type contact layer 13b is removed from the window region 15b by etching or the like, before being processed with the RTA. Because the p-type contact layer 13b is thus removed, higher Zn content of the p-type semiconductor layer section 14 can be ensured in the non-window region 15a, compared with that in the window region 15b, even after being processed with the RTA.

When Zn is used as a dopant together with C, Zn is a first impurity having a function of suppressing disordering in the active layer 10, for reasons described later. Therefore, when the p-type semiconductor layer section 14 has a higher Zn content in the non-window region 15a than in the window region 15b, disordering in the non-window region 15a is suppressed. As a result, the differences in the degree of disordering obtained by atomic vacancy diffusion and band gap energy difference between the non-window region 15a and the window region 15b are increased. In this manner, the amount of laser light absorbed at the facets is reduced, and the risk of COD is reduced.

As mentioned earlier, the difference in the band gap energy in the active layer 10 in the window region 15b and that in the non-window region 15a is set to 10 million electron volts or higher, for example. Such a band gap energy difference can be ensured by setting the first impurity content of the window region 15b lower by $3.5 \times 10^{13}$ cm$^{-2}$ or more than that of the non-window region 15a, or by setting a second impurity content of the window region 15b higher by $3.5 \times 10^{13}$ cm$^{-2}$ or more than that of the non-window region 15a. The impurity content of the p-type semiconductor layer section 14 is the gross impurity content of the layers from the p-type guide layer 11 to the p-type contact layer 13 containing impurities, and can be acquired by calculating an integral of the dopant concentration with respect to the layer thickness of the layers containing impurities.

As described above, in the semiconductor laser element 100 according to the first embodiment, because the p-type semiconductor layer section 14 has a higher Zn content in the non-window region 15a than in the window region 15b, a semiconductor laser element with a larger band gap energy difference can be achieved.

Figure 3:
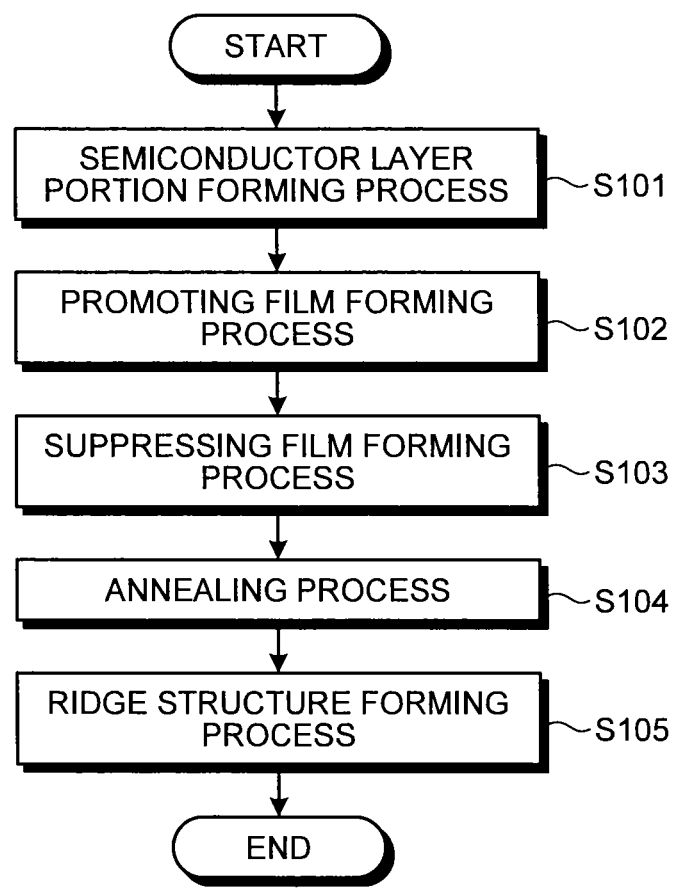
FIG. 3 is a flowchart of a method for manufacturing a semiconductor laser element.

An exemplary method for manufacturing a semiconductor laser element 100 will now be explained. FIG. 3 is a flowchart of the method for manufacturing the semiconductor laser element. As illustrated in FIG. 3, the method for manufacturing semiconductor laser element 100 according to the first embodiment includes a semiconductor layer portion forming process (Step S101), a promoting film forming process (Step S102), a suppressing film forming process (Step S103), an annealing process (Step S104), and a ridge structure forming process (Step S105).

Each of these processes will now be explained. The values specified in these processes are merely exemplary, and the first embodiment is not limited thereto.

Semiconductor Layer Portion Forming Process

Figure 4:
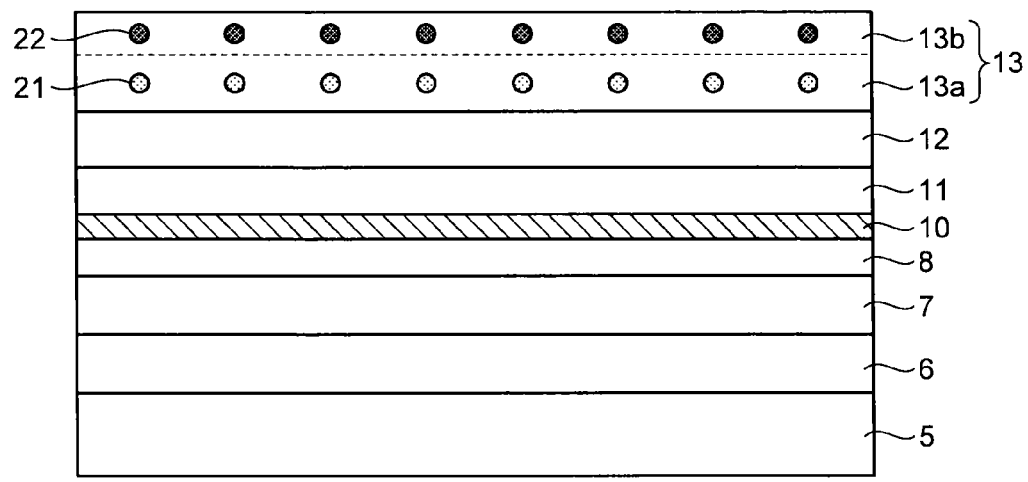
FIG. 4 is a schematic for explaining an exemplary method for manufacturing a semiconductor laser element according to the first embodiment.

To begin with, the semiconductor layer portion forming process at Step S101 will now be explained. In this process, to begin with, as illustrated in FIG. 4, the n-type buffer layer 6, the n-type cladding layer 7, the n-type guide layer 8, the active layer 10, the p-type guide layer 11, the p-type cladding layer 12, and the p-type contact layer 13 are epitaxially grown on the substrate 5 through metal organic chemical vapor deposition (MOCVD). The p-type contact layer 13a is doped with C (C 21) that is a p-type second impurity, and the p-type contact layer 13b is doped with Zn (Zn 22) that is a p-type first impurity.

Figure 5:
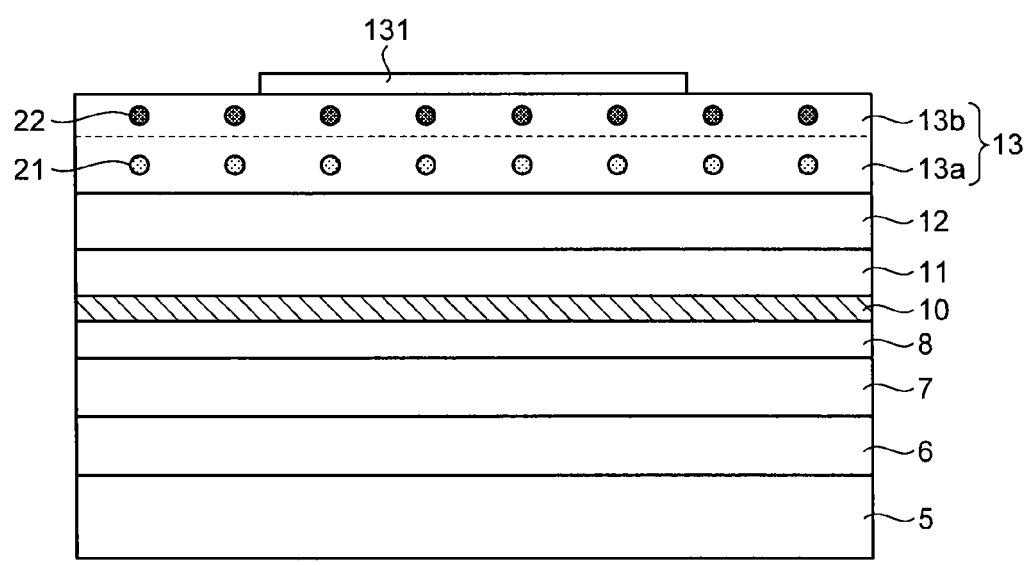
FIG. 5 is a schematic for explaining the exemplary method for manufacturing a semiconductor laser element according to the first embodiment.
Figure 6:
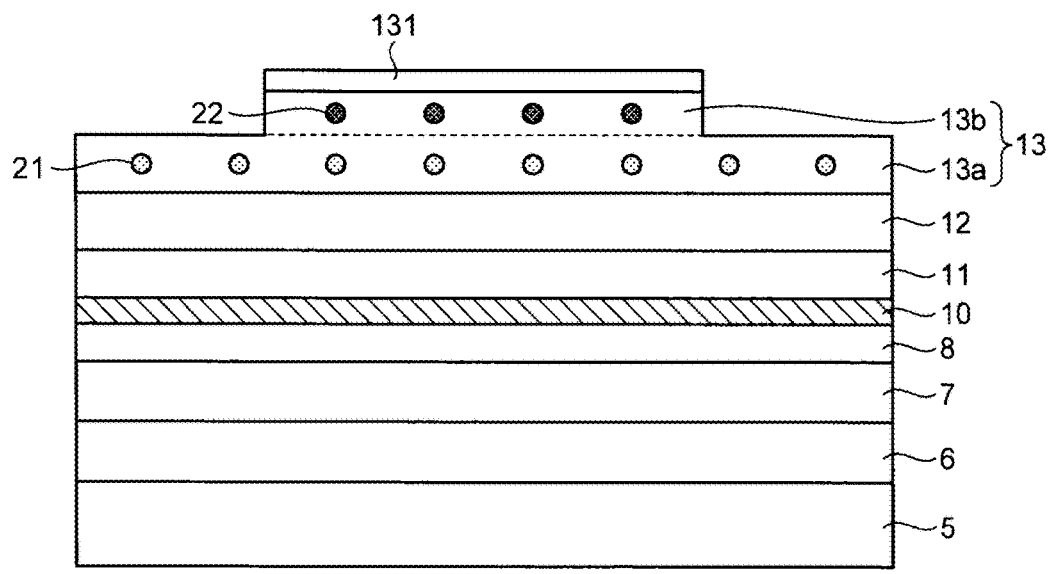
FIG. 6 is a schematic for explaining the exemplary method for manufacturing a semiconductor laser element according to the first embodiment.
Figure 7:
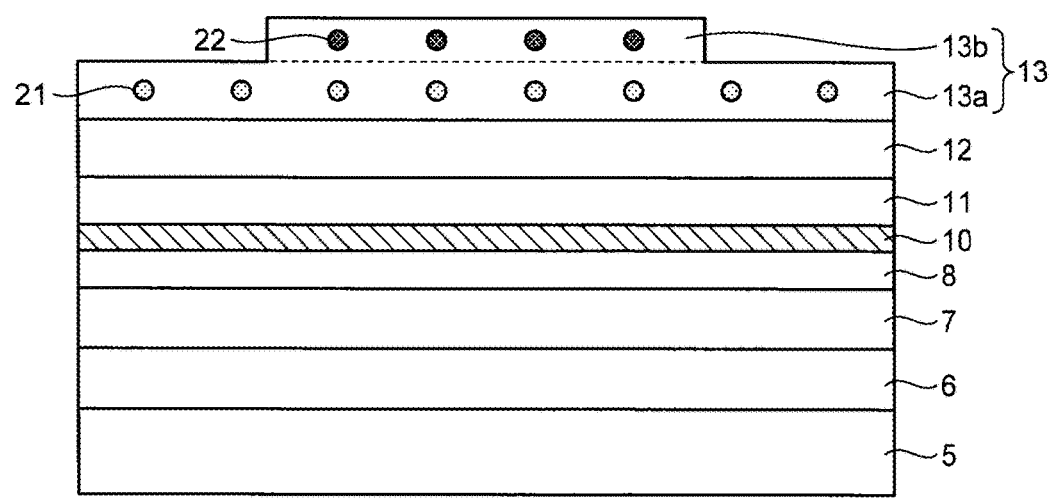
FIG. 7 is a schematic for explaining the exemplary method for manufacturing a semiconductor laser element according to the first embodiment.

A photolithography process and an etching process are then performed to remove the p-type contact layer 13b from an area corresponding to the window region 15b, as illustrated in FIGS. 5 and 6. The photoresist 131 is then removed, as illustrated in FIG. 7. Through this process, the semiconductor layer portion 15 including the layers from the n-type buffer layer 6 to the p-type contact layer 13 is achieved.

Promoting Film Forming Process

Figure 8:
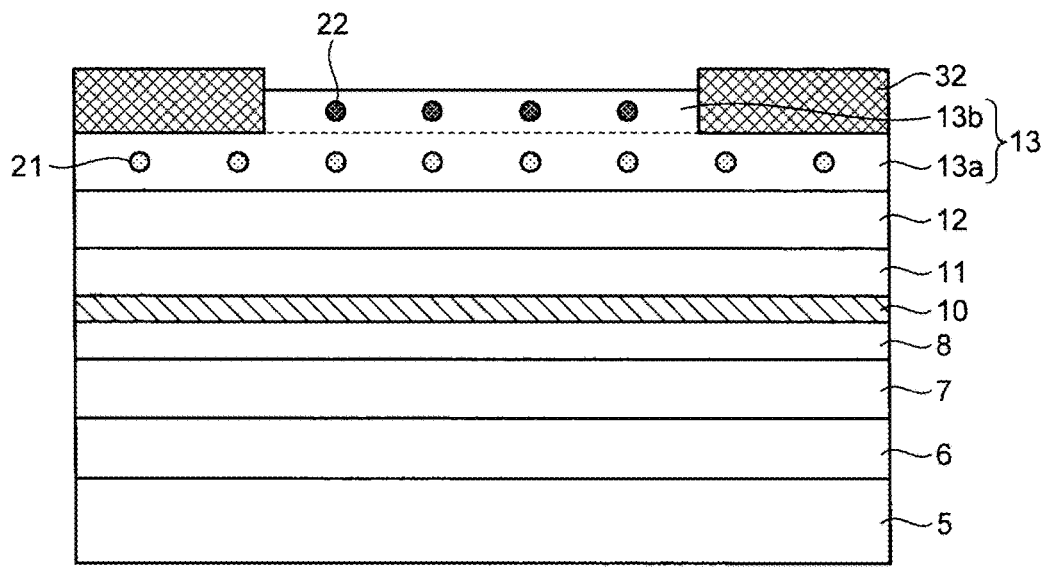
FIG. 8 is a schematic for explaining the exemplary method for manufacturing a semiconductor laser element according to the first embodiment.

The promoting film forming process at Step S102 will now be explained. Formed in this process is a promoting film 32 for promoting disordering through atomic vacancy diffusion and allowing the window region 15b to be formed thereby. Atomic vacancy diffusion is also referred to as IFVD. To begin with, the promoting film 32 that is a SiN insulating layer is deposited on the top surface of the semiconductor layer portion 15. The photolithography process and the etching process are then performed, as illustrated in FIG. 8, to remove the promoting film 32 from the area in which the non-window region 15a is to be provided. Through this process, the promoting film 32 is formed on the top surface of the region to be the window region 15b.

Suppressing Film Forming Process

Figure 9:
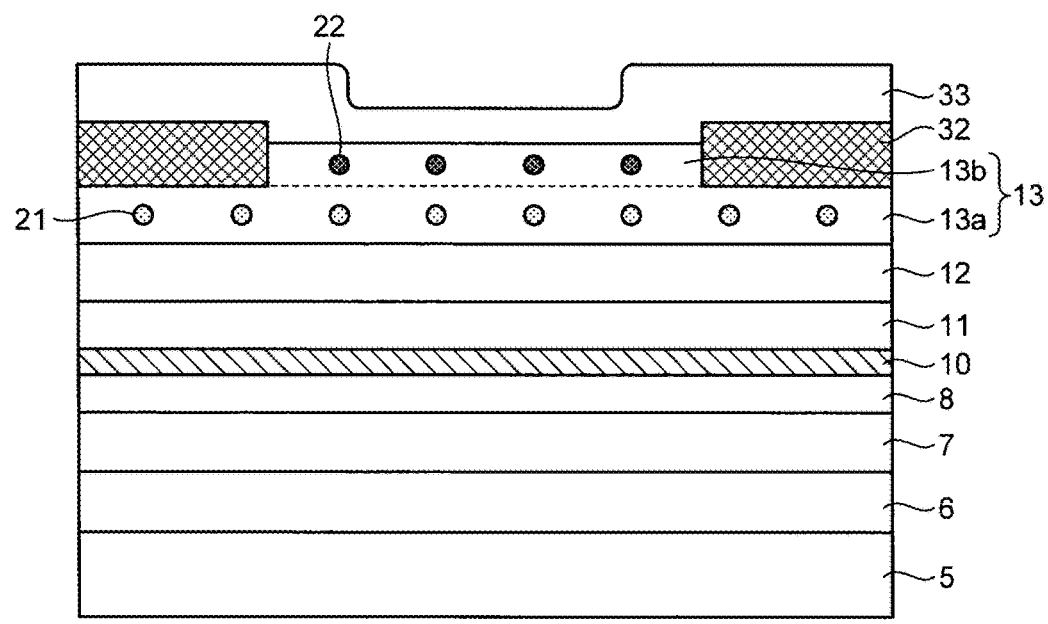
FIG. 9 is a schematic for explaining the exemplary method for manufacturing a semiconductor laser element according to the first embodiment.

The suppressing film forming process at Step S103 will now be explained. In this process, a suppressing film 33 that is a SiN insulating layer is formed, as illustrated in FIG. 9.

The promoting film 32 is a sparse SiN insulating layer with a refractive index of 1.9, for example, and the suppressing film 33 is a dense SiN insulating layer with a refractive index of 2.0, for example. It should be noted that the promoting film 32 may be the dense SiN insulating layer, and the suppressing film 33 may be the sparse SiN insulating layer depending on the conditions of the RTA (see Japanese Patent Application Laid-open No. 2011-103494).

In the first embodiment, the promoting film is deposited and removed from the area in which the non-window region 15a is to be provided, and the suppressing film is deposited subsequently. Alternatively, the suppressing film may be first deposited and removed from the area in which the window region 15b is to be provided, and the promoting film may be subsequently deposited. Furthermore, in the first embodiment, a film of SiNx is used as the promoting film and the suppressing film, but a film of SiOx, ZnOx, AlOx, AlNx, AlOxNy, TiOx, TiNx, TiOxNy, TaOx, HfOx, or the like may be used as the promoting film and the suppressing film.

Annealing Process

The annealing process at Step S104 will now be explained. In this process, the semiconductor layer portion 15 is annealed over a short time period with the RTA. When the semiconductor layer portion 15 is annealed with the RTA, the promoting film 32 and the suppressing film 33 absorb Ga atoms 24, creating atomic vacancies 23 on the surfaces of the p-type contact layers 13a and 13b, as illustrated as an example for the promoting film 32 in FIG. 10. The atomic holes 23 diffuse as diffusing species, thereby inducing disordering in the layers of the semiconductor layer portion, particularly in the active layer 10. In the region on which the promoting film 32 is formed in a manner in contact with the p-type contact layer 13a, the sparse promoting film 32 promotes disordering in the active layer 10, and the window region 15b is formed thereby, as illustrated in FIG. 11.

Figure 11:
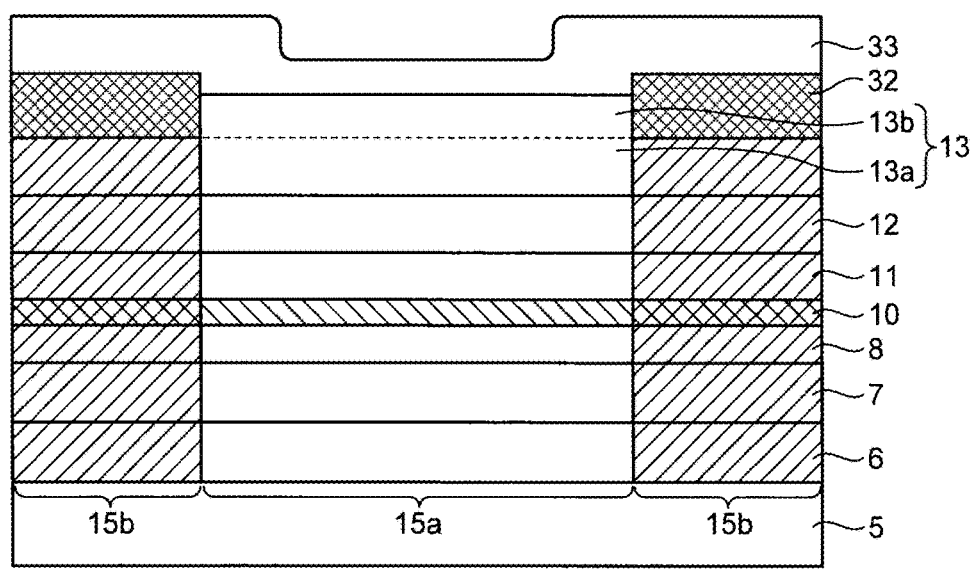
FIG. 11 is a schematic for explaining the exemplary method for manufacturing a semiconductor laser element according to the first embodiment.

By contrast, in the region on which the suppressing film 33 is provided in a manner in contact with the p-type contact layer 13b, the dense suppressing film 33 suppresses disordering in the active layer 10, and the non-window region 15a is formed thereby, as illustrated in FIG. 11.

Figure 10:
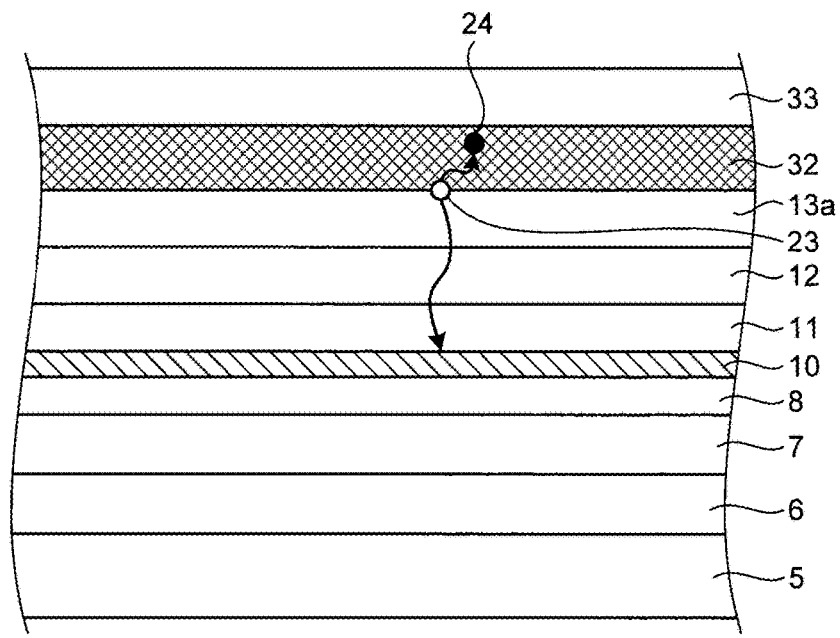
FIG. 10 is a schematic for explaining an atomic vacancy formation process in which a promoting film is allowed to absorb Ga atoms, in the semiconductor laser element according to the first embodiment.

During the RTA, disordering is promoted and suppressed by the doped impurities, in parallel with a process of atomic vacancy formation in which the promoting film 32 and the suppressing film 33 absorb the Ga atoms 24, as illustrated in FIG. 10. The process of promoting disordering is presumed to take place because the thermal diffusion of the doped impurities promotes vacancy diffusion, or because the thermally diffused doped impurities kick out the Ga atoms 24.

The process of suppressing disordering is presumed to take place because the doped impurities become thermally diffused and fill out the atomic vacancies 23. The RTA causes these processes simultaneously. The types, the concentrations, and the combination of impurities, the RTA temperature and time, the conditions of the promoting film and the suppressing film, and the like determine the effect of which one of these processes becomes more dominant.

In the first embodiment, therefore, the types, the concentrations, and the combination of impurities, the temperature and the time of the RTA, the conditions of the promoting film and the suppressing film, and the like are optimized so that the difference in the degree of disordering in the active layer 10 in the window region 15b and that in the non-window region 15a is increased. The RTA conditions such as the temperature and the time are adjusted so that the RTA does not cause the impurities to diffuse into the active layer 10. This is to prevent the impurities having been introduced into the active layer 10 from absorbing light, and deteriorating the output characteristics of the semiconductor laser element.

Hereinafter, the second impurity doped to promote disordering by promoting either diffusion of or formation of the atomic vacancies 23 or both is referred to as a promoting species, and the first impurity doped to suppress disordering by suppressing either the diffusion or generation of the atomic holes 23 or both is referred to as an suppressing species. When the p-type semiconductor layer section 14 contains a larger amount of the promoting species, disordering is promoted, and the degree of disordering becomes higher and the band gap energy is increased. When the amount of the suppressing species contained in the p-type semiconductor layer section 14 is increased, disordering is suppressed, and the degree of disordering remains low, and an increase of the band gap energy are suppressed.

In the first embodiment, C 21 functions as the promoting species, and Zn 22 functions as the suppressing species. In the window region 15b where the p-type contact layer 13b is removed by etching so that the amount of Zn 22 that is the suppressing species is reduced, the effect of C 21 promoting disordering becomes dominant. By contrast, in the non-window region 15a containing more Zn 22 that is the suppressing species, Zn 22 suppresses disordering. By making the impurity contents different in such a manner that the p-type semiconductor layer section 14 contains more Zn 22 that is the suppressing species in the non-window region 15a, the resultant degrees of disordering in these regions become different, and the band gap energy difference is increased. Therefore, compared with the conventional technology in which the Zn 22 contents of the non-window region 15a and the window region 15b are not changed, the effect of suppressing the risk of COD is more prominent.

During disordering in the active layer 10 by the annealing process, the SQW composition is changed by the atomic vacancies diffusion, thereby causing the band gap energy to change, but the annealing process does not introduce impurities such as C and Zn themselves into the active layer 10. In other words, disordered crystals grow in the quantum well layer 10b made of highly-pure InGaAs intentionally kept undoped, by the atomic vacancies diffused from the lower barrier layer 10a, the upper barrier layer 10c, and the like made of AlGaAs. As disordered crystals grow further, the band gap energy of the active layer 10 is increased.

Figure 12:
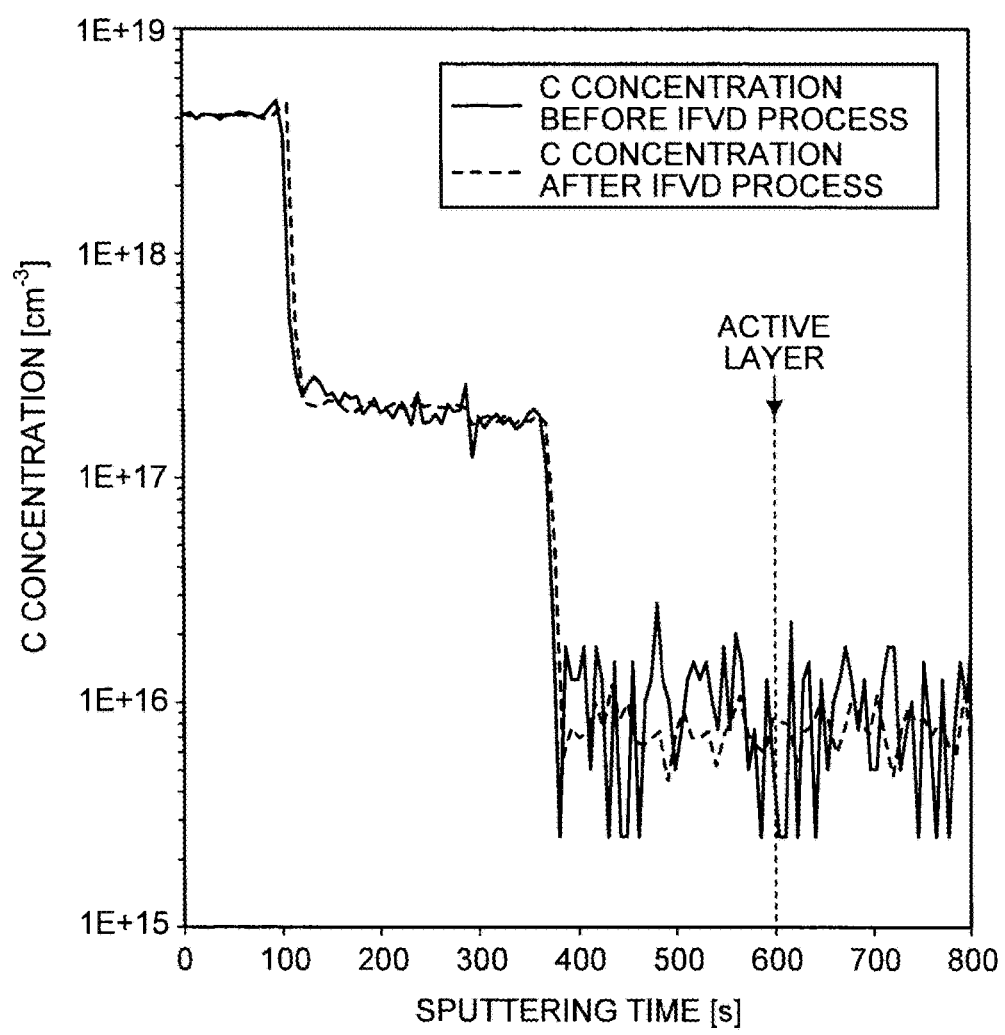
FIG. 12 is a schematic of a result of a secondary ion mass spectrometry (SIMS) analysis indicating the C concentration in the semiconductor layer portion before and after an annealing process.
Figure 13:
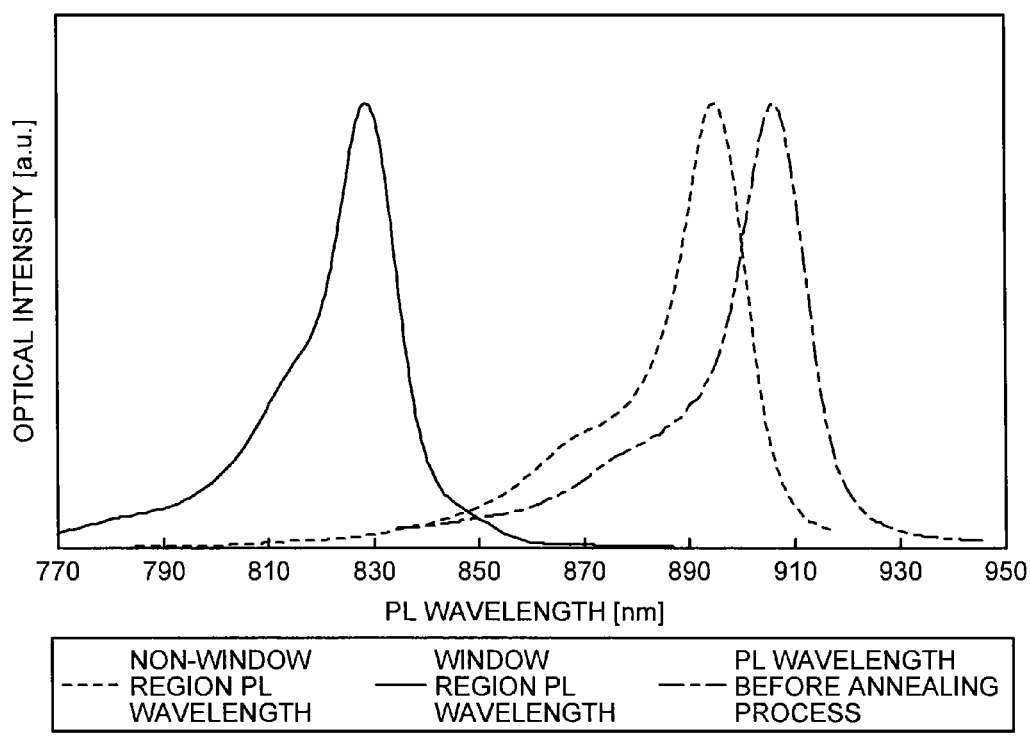
FIG. 13 illustrates spectrums indicating a photoluminescence wavelength in a window region and that in a non-window region in the semiconductor laser element before and after the annealing process.

FIG. 12 is a schematic of a result of a secondary ion mass spectrometry (SIMS) analysis indicating the C concentration in the semiconductor layer portion before and after the annealing process. The horizontal axis represents the time over which the semiconductor unit is sputtered, and the position indicated by the dotted line corresponds to the position of the active layer. In the vertical axis, 1E+17 represents $1 \times 10^{17}$. As illustrated in FIG. 12, the C concentration of the active layer 10 does not change before and after the annealing process (IFVD process), indicating that any impurity is not introduced into the active layer 10. FIG. 13 provides spectrums indicating a photoluminescence wavelength (PL wavelength) in the window region and that in the non-window region in the semiconductor laser element before and after the annealing process. FIG. 13 indicates that the PL wavelength is shorter in the window region than in the non-window region. In other words, FIG. 13 indicates that the band gap energy and the degree of disordering are high in the window region than those in the non-window region. The full width at half maximum of the PL wavelength is 16.4 nanometers before the annealing process, and is 16.5 nanometers in the non-window region and is 16.7 nanometers in the window region after the annealing process, and has not changed so much before and after the annealing process. This SIMS analysis result also indicates that the impurity is not introduced into the active layer 10, because, if the impurity was introduced into the active layer 10, for example, the impurity level would be formed and the full width at half maximum of the PL wavelength would be wider. Based on FIGS. 12 and 13, it can be concluded that atomic hole diffusion, but not impurity diffusion, has induced disordering in the active layer in the window region.

Ridge Structure Forming Process

Figure 14:
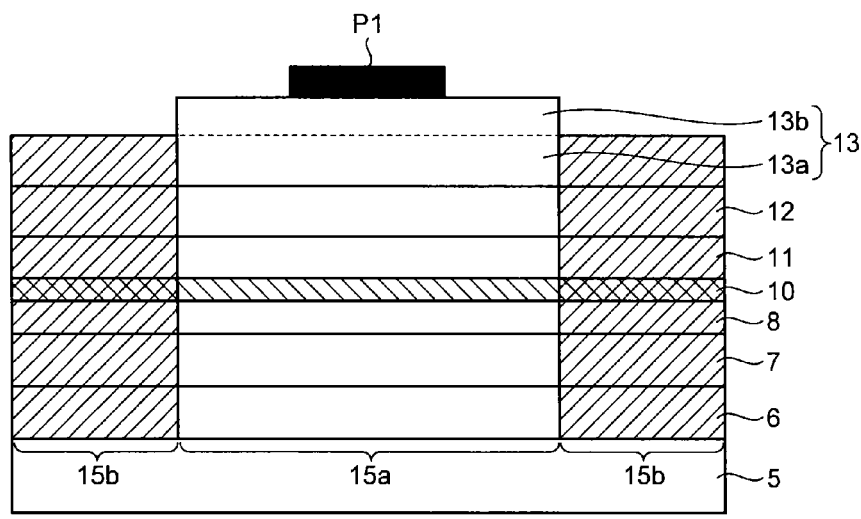
FIG. 14 is a schematic for explaining the exemplary method for manufacturing a semiconductor laser element according to the first embodiment.
Figure 15:
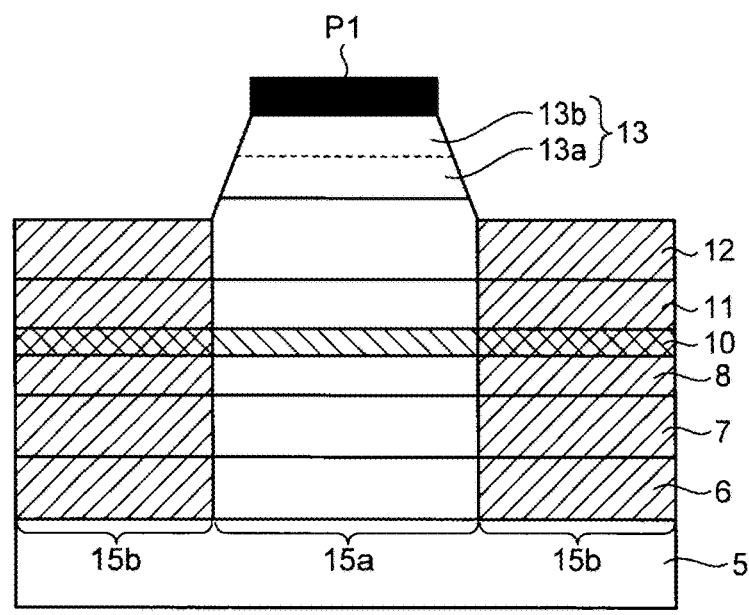
FIG. 15 is a schematic for explaining the exemplary method for manufacturing a semiconductor laser element according to the first embodiment.
Figure 16:
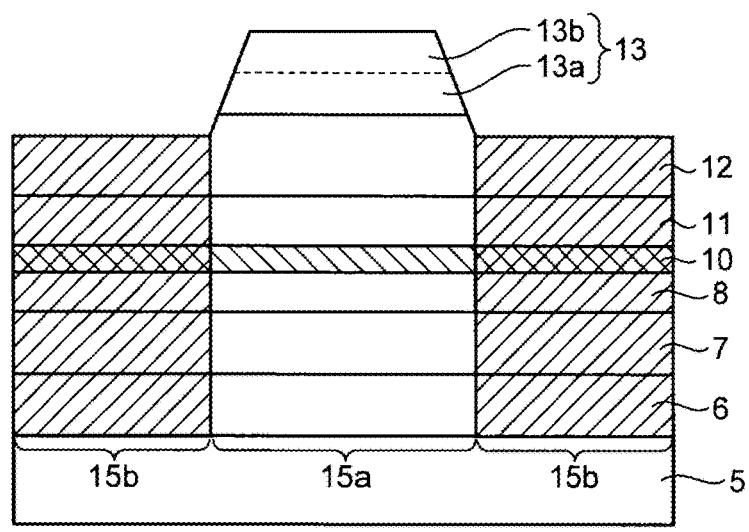
FIG. 16 is a schematic for explaining the exemplary method for manufacturing a semiconductor laser element according to the first embodiment.
Figure 17:
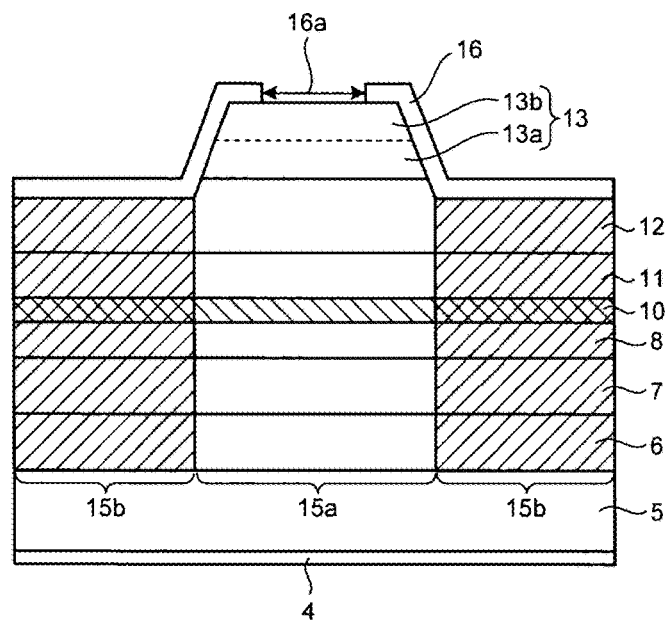
FIG. 17 is a schematic for explaining the exemplary method for manufacturing a semiconductor laser element according to the first embodiment.

The ridge structure forming process at Step S105 will now be explained. In this process, as illustrated in FIG. 14, after the promoting film 32 and the suppressing film 33 are removed, a stripe pattern P1 of resist for achieving the ridge structure is formed on the p-type contact layer 13 through a photolithography process. The p-type contact layer 13 is then etched to a trapezoid shape, as illustrated in FIG. 15, and the stripe pattern P1 is removed, and the ridge structure illustrated in FIG. 16 is achieved. The insulating film 16 is then deposited, and the opening 16a for bringing the upper electrode 17 into contact with the p-type contact layer 13 is formed through a photolithography process and an etching process, as illustrated in FIG. 17.

The upper electrode 17 and the lower electrode 4 that is on the bottom surface of the substrate 5 are then deposited. The substrate 5 is then cleaved, and the low reflection film 2 and the high reflection film 3 are applied to the respective cleavage facets. The semiconductor layer structure is then diced into elements, and the semiconductor laser element 100 is achieved thereby.

As described above, because the p-type contact layer 13 is doped with different types of impurities in different concentrations and in different combination, the impurity content of the p-type semiconductor layer section 14 in the non-window region 15a is different from that in the window region 15b. As a result, the semiconductor laser element 100 according to the first embodiment has a larger band gap energy difference.

Second Embodiment

Figure 18:
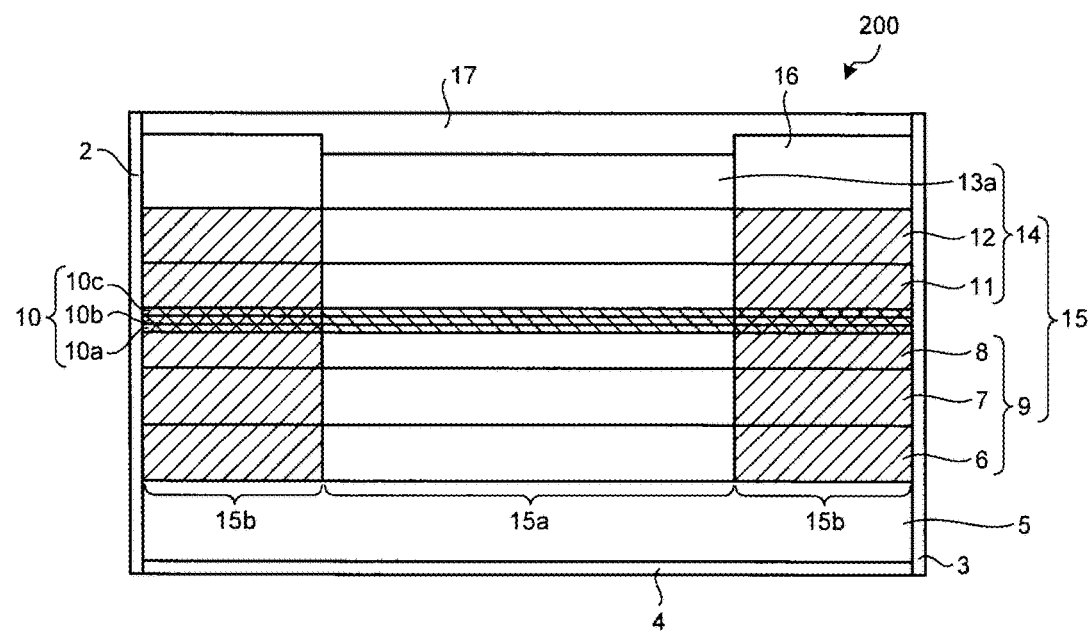
FIG. 18 is a cross-sectional view along the y-z plane in a semiconductor laser element according to a second embodiment of the present invention.

A semiconductor laser element according to a second embodiment of the present invention will now be explained. FIG. 18 is a cross-sectional view along the y-z plane in the semiconductor laser element according to the second embodiment. This semiconductor laser element 200 according to the second embodiment has the same structure as the semiconductor laser element 100 according to the first embodiment except that the p-type contact layer 13a is removed from the window region 15b and the p-type contact layer 13b is removed from the non-window region 15a.

Figure 19:
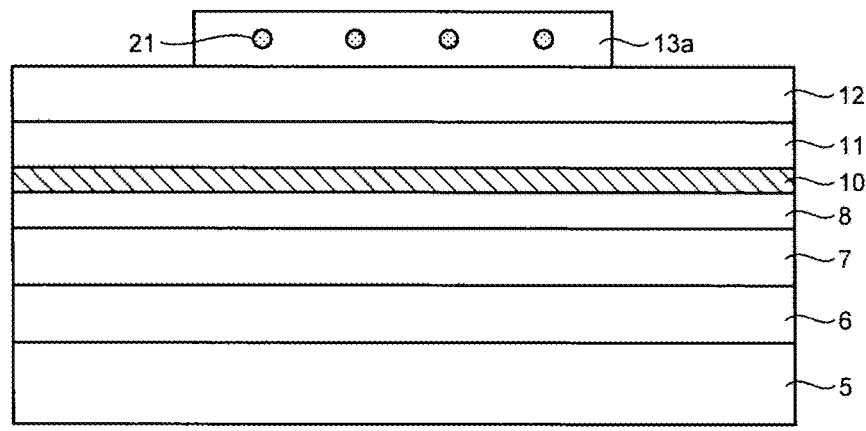
FIG. 19 is a schematic for explaining an exemplary method for manufacturing a semiconductor laser element according to the second embodiment.

FIG. 19 is a schematic for explaining an exemplary method for manufacturing a semiconductor laser element according to the second embodiment. After the annealing process is completed in the exemplary method for manufacturing semiconductor laser element 100 according to the first embodiment illustrated in FIG. 3, the semiconductor layer portion 15 according to the second embodiment is etched to remove the p-type contact layer 13a from the area corresponding to the window region 15b, and to remove the p-type contact layer 13b from the area corresponding to the non-window region 15a, as illustrated in FIG. 19. The ridge structure forming process and the like are then performed in the same manner as in the first embodiment, and the final semiconductor laser element 200 is achieved thereby.

In the semiconductor laser element 200 according to the second embodiment, before the p-type contact layer 13a is removed from the window region 15b and the p-type contact layer 13b is removed from the non-window region 15a, the RTA induces disordering in the active layer 10. Therefore, C 21 with which the p-type contact layer 13a is doped functions as the promoting species, and Zn 22 with which the p-type contact layer 13b is doped functions as an suppressing species. Because Zn 22 diffuses easily, the Zn 22 concentration in the p-type contact layer 13b is reduced. Therefore, if the p-type contact layer 13b is brought into contact with the upper electrode 17, the resistance against the current injected from the upper electrode 17 is increased. An increased resistance results in lower luminous efficacy. By contrast, because C 21 are atoms that diffuse less easily than Zn 22, C 21 with which the p-type contact layer 13a is doped remains at almost the same concentration even after the RTA process. The p-type contact layer 13b is therefore removed by etching or the like so that the p-type contact layer 13a is exposed to the topmost surface, and brought into contact with the upper electrode 17, to prevent a resistance increase thereby. The p-type contact layer 13a may be the surface of the window region 15b, but the p-type cladding layer 12 made of AlGaAs with a high resistance is more preferable as the surface of the window region 15b, so that the effectiveness of current injection into the non-window region 15a can be further improved.

Third Embodiment

Figure 20:
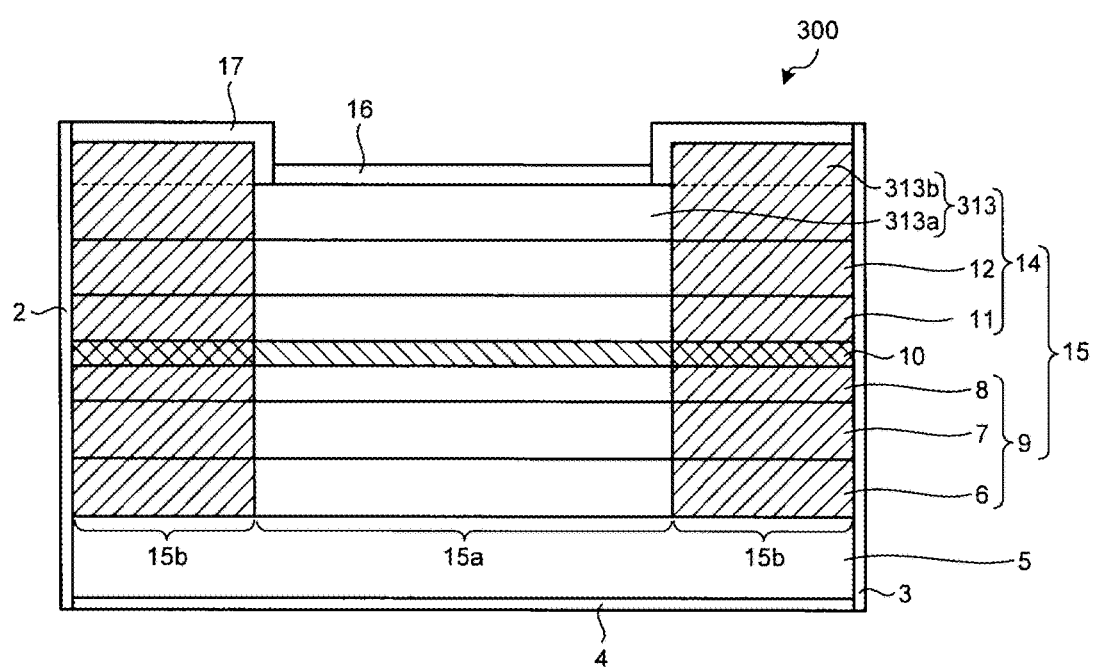
FIG. 20 is a cross-sectional view along the y-z plane in a semiconductor laser element according to a third embodiment of the present invention.

A semiconductor laser element according to a third embodiment of the present invention will now be explained. FIG. 20 is a cross-sectional view along the y-z plane in the semiconductor laser element according to the third embodiment. While the p-type contact layer 13b is removed from the window region 15b in the semiconductor laser element 100 according to the first embodiment, this semiconductor laser element 300 according to the third embodiment has a structure in which a p-type contact layer 313b is removed from the non-window region 15a. The p-type contact layer 313b and a p-type contact layer 313a together form a p-type contact layer 313. The p-type contact layer 313a is doped with Zn 22, and the p-type contact layer 313b is doped with C 21. In the semiconductor laser element 300, the p-type contact layer 313b is removed from the non-window region 15a before the RTA process, so that the C 21 content of the p-type semiconductor layer section 14 becomes higher in the window region 15b than in the non-window region 15a.

In the semiconductor laser element 300 according to the third embodiment, after the p-type contact layer 313b uniformly doped with C 21, including the area corresponding to the non-window region 15a, is formed, the p-type contact layer 313b is removed from the area corresponding to the non-window region 15a by etching, for example, before the RTA process. Through this process, even after C 21 become diffused during the RTA, the C 21 content of the p-type semiconductor layer section 14 in the window region 15b remains higher than the C 21 content of the p-type semiconductor layer section 14 in the non-window region 15a.

When C 21 is used as a dopant together with Zn 22, C 21 functions as the promoting species that promotes disordering in the active layer 10. When the window region 15b has a higher C 21 content, therefore, the degree of disordering becomes higher in the window region 15b. As a result, the differences between the degrees of disordering and between the band gap energies in the non-window region 15a and the window region 15b are increased, so that a smaller amount of laser light is absorbed at the facet, and the risk of COD is reduced.

Figure 21:
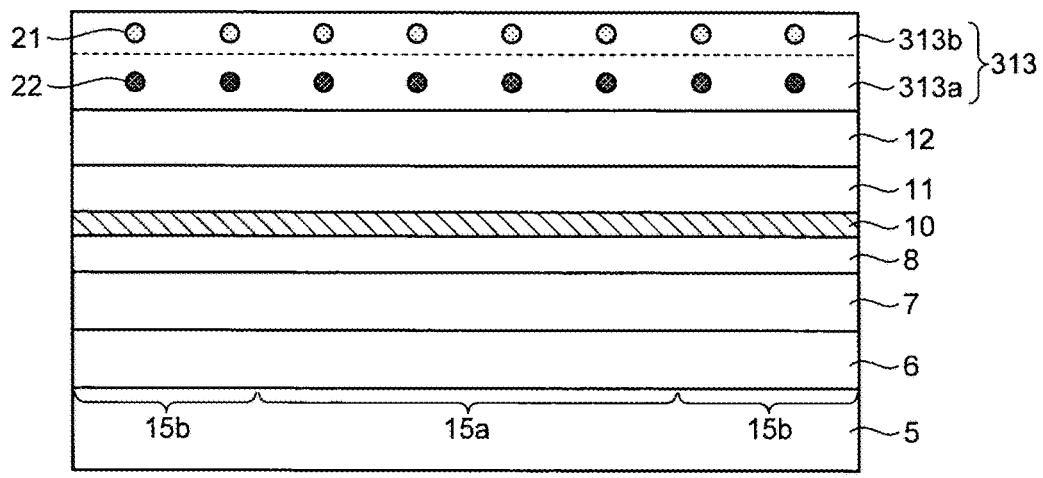
FIG. 21 is a schematic for explaining an exemplary method for manufacturing a semiconductor laser element according to the third embodiment.
Figure 22:
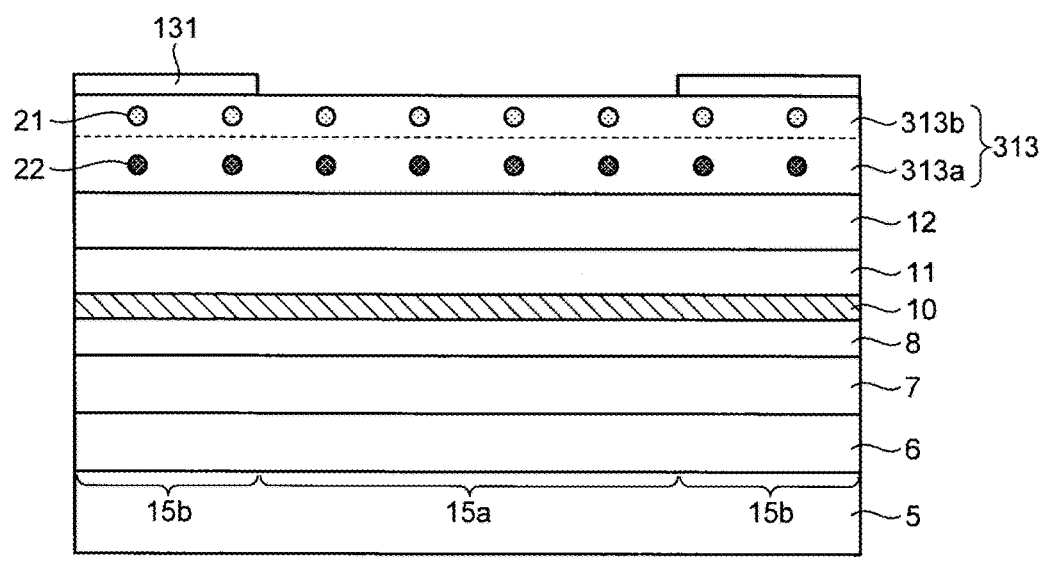
FIG. 22 is a schematic for explaining the exemplary method for manufacturing a semiconductor laser element according to the third embodiment.
Figure 23:
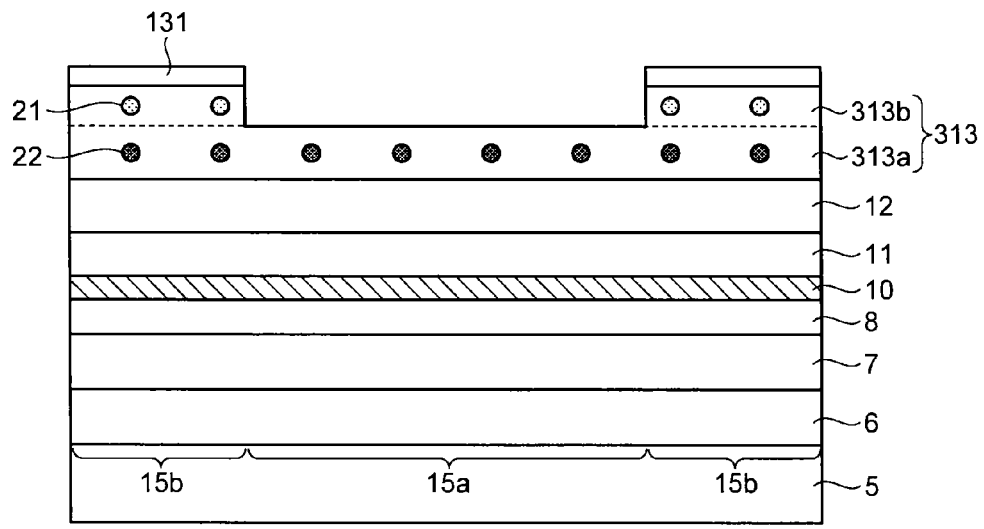
FIG. 23 is a schematic for explaining the exemplary method for manufacturing a semiconductor laser element according to the third embodiment.
Figure 24:
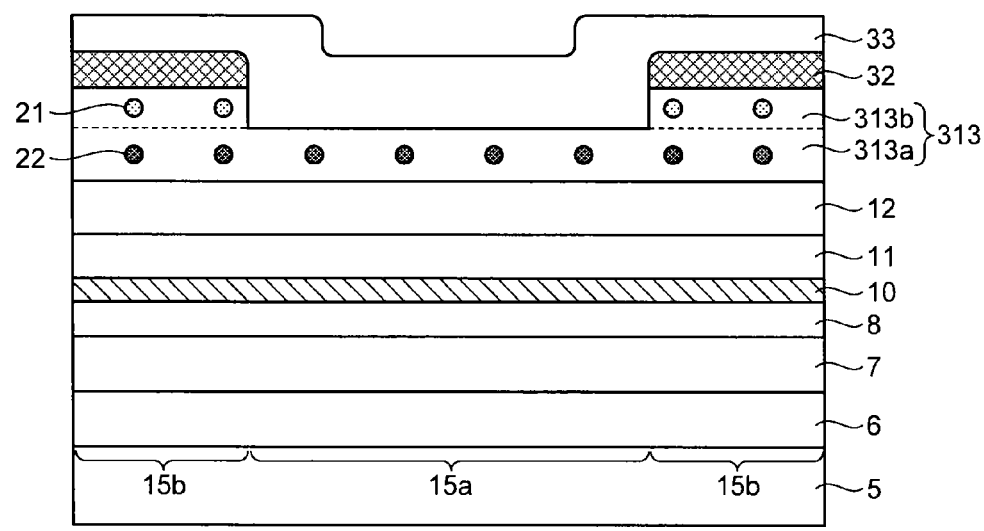
FIG. 24 is a schematic for explaining the exemplary method for manufacturing a semiconductor laser element according to the third embodiment.

FIGS. 21 to 24 are schematics for explaining an exemplary method for manufacturing a semiconductor laser element according to the third embodiment. To begin with, in the semiconductor layer portion forming process according to the first embodiment, the p-type contact layer 313a is doped with Zn 22, and the p-type contact layer 313b is doped with C 21, as illustrated in FIG. 21, oppositely to those in the semiconductor layer portion forming process according to the first embodiment. As illustrated in FIG. 22, the photoresist 131 is then applied to the area corresponding to the window region 15b. As illustrated in FIG. 23, the p-type contact layer 313b is then removed from the area corresponding to the non-window region 15a by etching. As illustrated in FIG. 24, the promoting film 32 and the suppressing film 33 are then formed in the promoting film forming process and the suppressing film forming process, respectively, in the same manner as in the first embodiment. The annealing process and the ridge structure forming process are then carried out, in the same manner as in the first embodiment, and the final semiconductor laser element 300 is achieved thereby.

Fourth Embodiment

Figure 25:
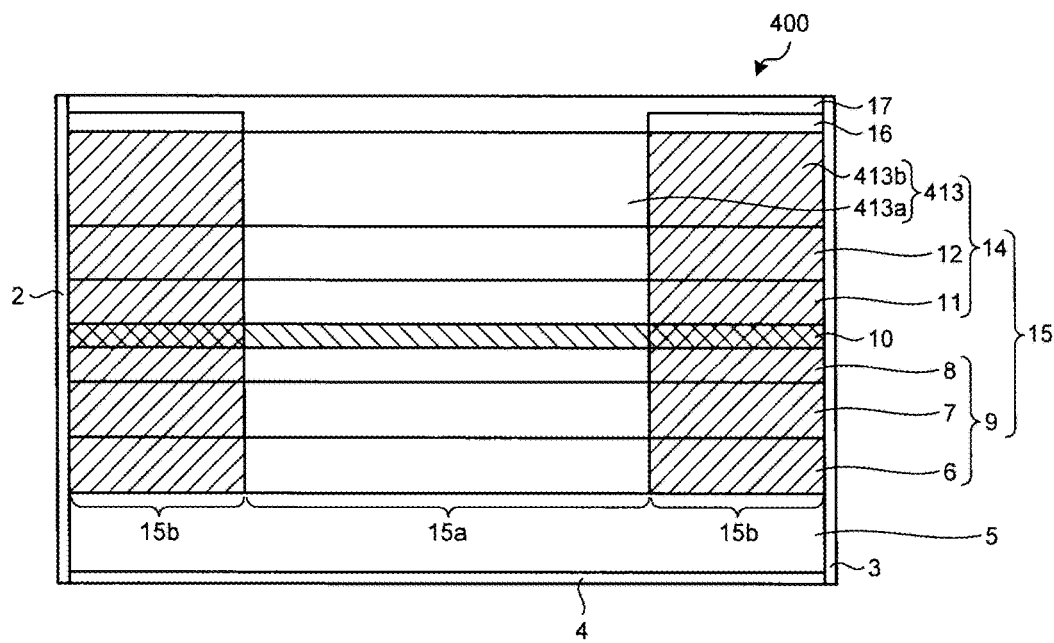
FIG. 25 is a cross-sectional view along the y-z plane in a semiconductor laser element according to a fourth embodiment of the present invention.

A semiconductor laser element according to a fourth embodiment of the present invention will now be explained. FIG. 25 is a cross-sectional view along the y-z plane in the semiconductor laser element according to the fourth embodiment. In the structure of this semiconductor laser element 400 according to the fourth embodiment, a p-type contact layer 413 has only one layer in the deposition direction, and a p-type contact layer 413a in the non-window region 15a contains more Zn 22, and a p-type contact layer 413b in the window region 15b contains more C 21.

In the semiconductor laser element 400 according to the fourth embodiment, Zn 22 the content of which is higher in the non-window region 15a functions as the suppressing species, and C 21 the content of which is higher in the window region 15b functions as the promoting species. Disordering is therefore suppressed in the non-window region 15a, and is promoted in the window region 15b. Hence, the differences between the degrees of disordering and between the band gap energies in the non-window region 15a and the window region 15b are increased, and as a result, a smaller amount of laser light is absorbed at the facet, and the risk of COD is reduced.

Figure 26:
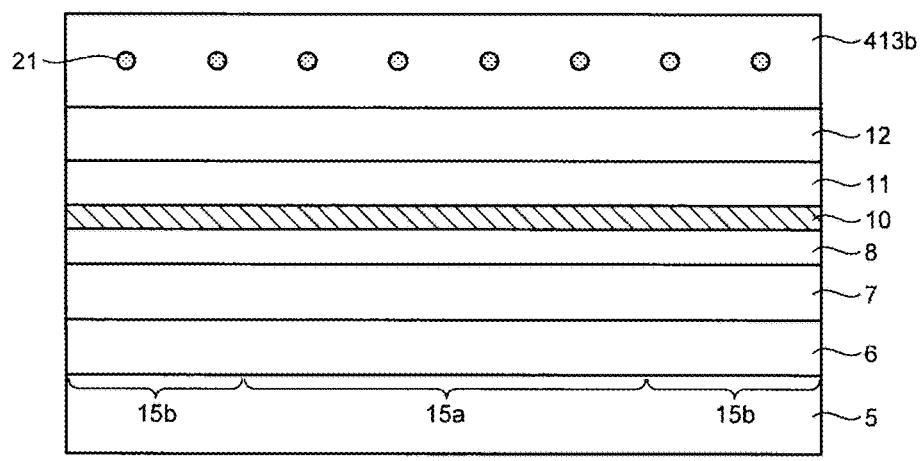
FIG. 26 is a schematic for explaining an exemplary method for manufacturing a semiconductor laser element according to the fourth embodiment.
Figure 27:
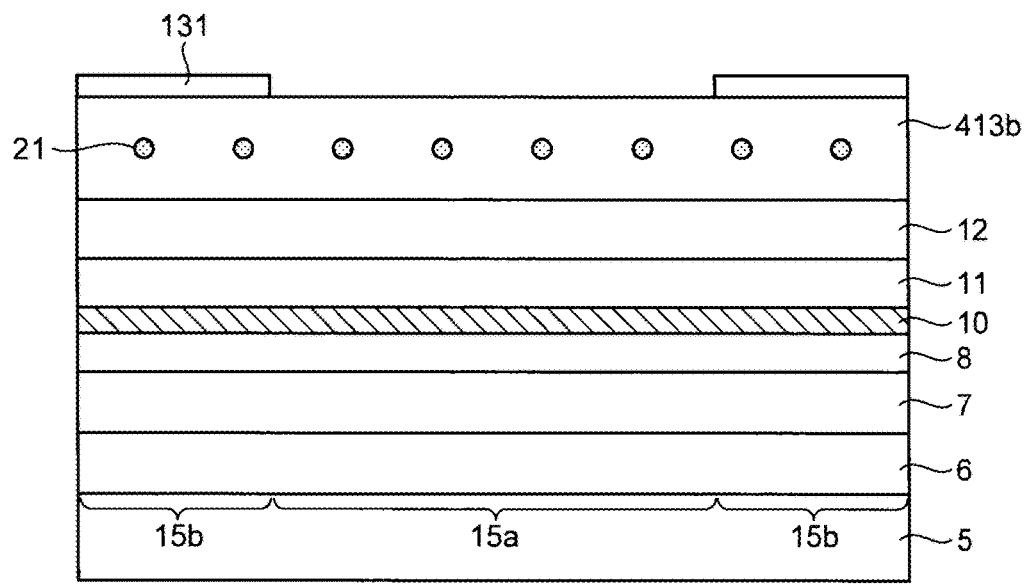
FIG. 27 is a schematic for explaining the exemplary method for manufacturing a semiconductor laser element according to the fourth embodiment.
Figure 28:
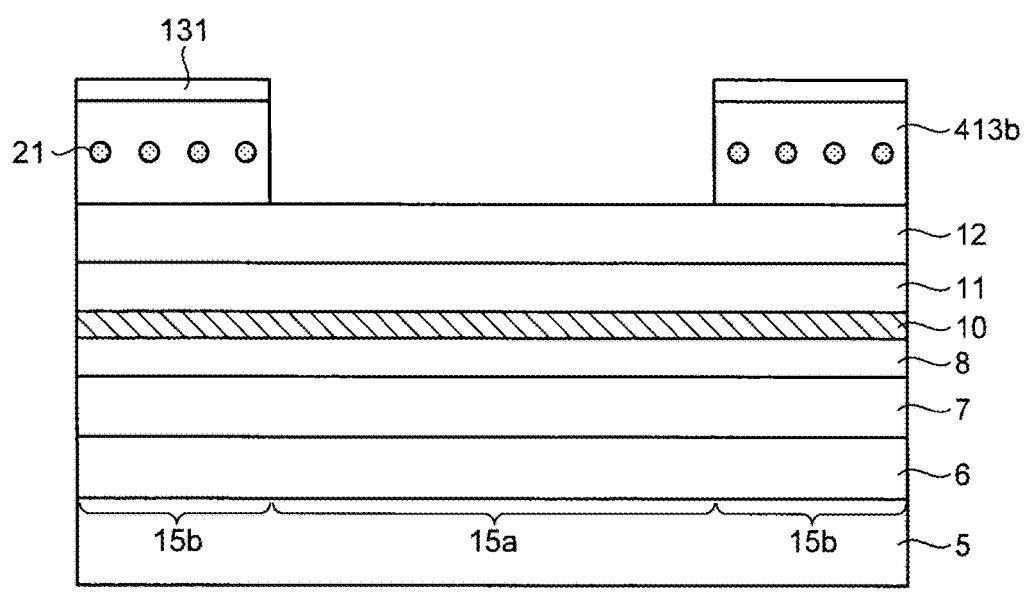
FIG. 28 is a schematic for explaining the exemplary method for manufacturing a semiconductor laser element according to the fourth embodiment.
Figure 29:
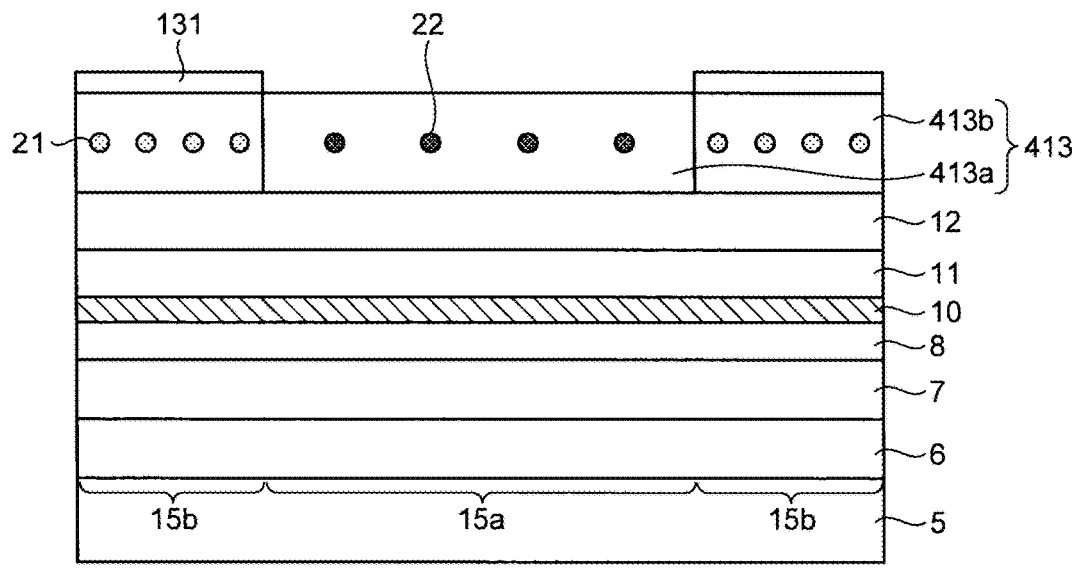
FIG. 29 is a schematic for explaining the exemplary method for manufacturing a semiconductor laser element according to the fourth embodiment.
Figure 30:
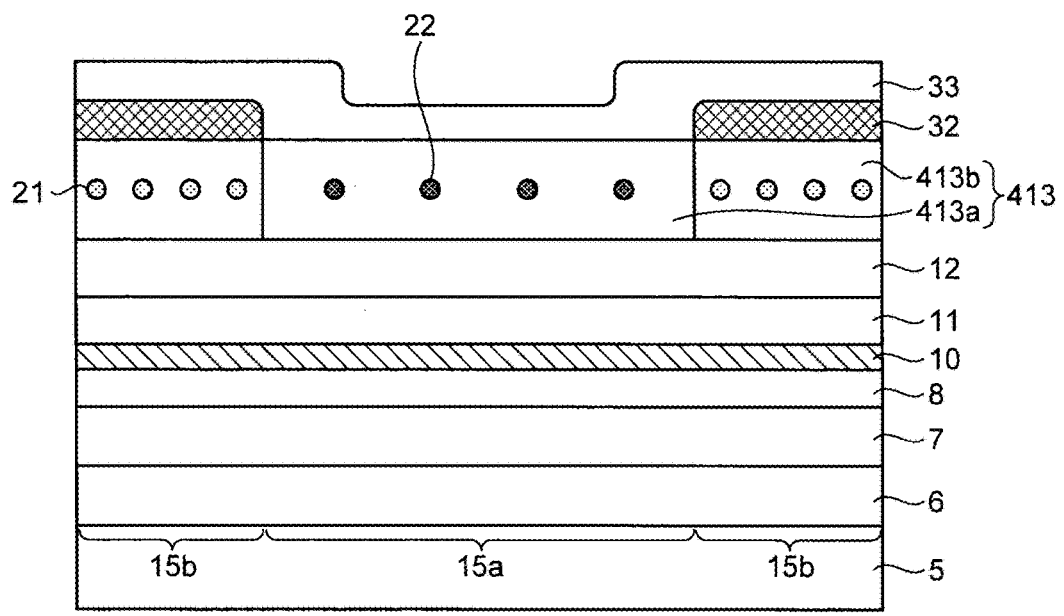
FIG. 30 is a schematic for explaining the exemplary method for manufacturing a semiconductor laser element according to the fourth embodiment.

FIGS. 26 to 30 are schematics for explaining an exemplary method for manufacturing a semiconductor laser element according to the fourth embodiment. To begin with, as illustrated in FIG. 26, in the semiconductor layer portion forming process according to the first embodiment, a p-type contact layer 413b doped with C 21 is uniformly deposited across the area corresponding to the non-window region 15a and the area corresponding to the window region 15b. As illustrated in FIG. 27, the photoresist 131 is left unremoved in the area corresponding to the window region 15b. As illustrated in FIG. 28, the p-type contact layer 413b is then removed from the area corresponding to the non-window region 15a by etching, so that the p-type contact layer 413b is provided only in the area corresponding to the window region 15b. As illustrated in FIG. 29, the p-type contact layer 413a doped with Zn 22 is then formed on the etched area corresponding to the non-window region 15a, using the photoresist 131 as a mask. As illustrated in FIG. 30, in the same manner as in the first embodiment, the promoting film 32 and the suppressing film 33 are then formed through the promoting film forming process and the suppressing film forming process, respectively. The annealing process and the ridge structure forming process are then carried out, in the same manner as in the first embodiment, and the final semiconductor laser element 400 is achieved thereby.

Fifth Embodiment

Figure 31:
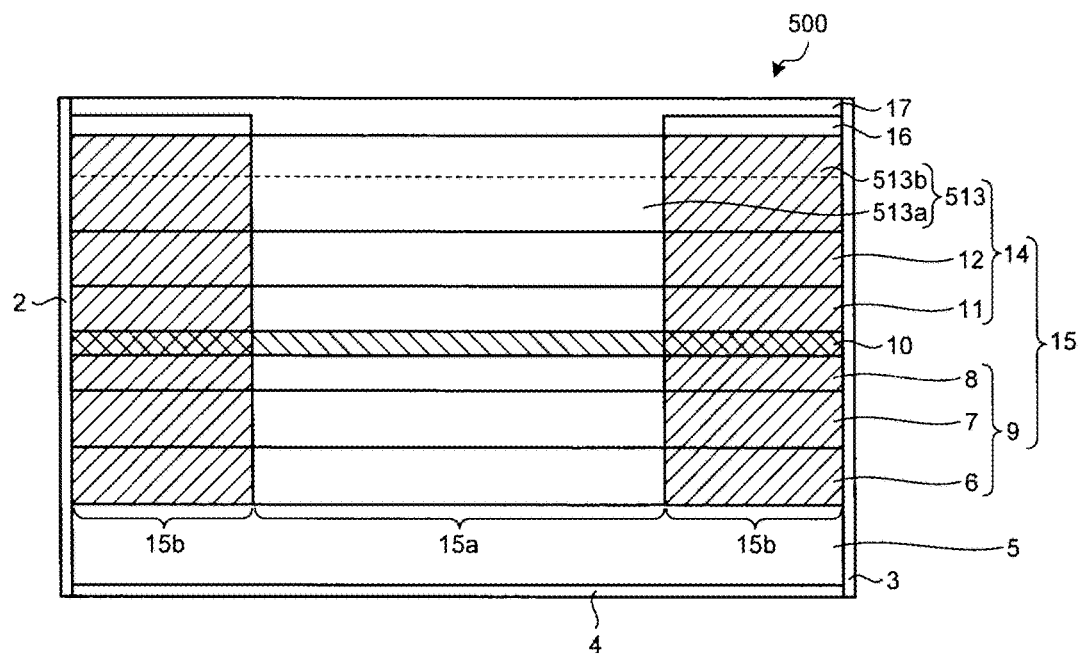
FIG. 31 is a cross-sectional view along the y-z plane in a semiconductor laser element according to a fifth embodiment of the present invention.

A semiconductor laser element according to a fifth embodiment of the present invention will now be explained. FIG. 31 is a cross-sectional view along the y-z plane in the semiconductor laser element according to the fifth embodiment. The semiconductor laser element 500 according to the fifth embodiment has a structure in which a p-type contact layer 513a in the window region 15b contains more C 21, and a p-type contact layer 513b in the non-window region 15a contains more Zn 22. In the fifth embodiment, these different C 21 and Zn 22 contents are achieved by ion implantation, unlike in the fourth embodiment.

In the semiconductor laser element 500 according to the fifth embodiment, Zn 22 the content of which is higher in the non-window region 15a functions as the suppressing species, and C 21 the content of which is higher in the window region 15b functions as the promoting species, in the same manner as in the fourth embodiment. Disordering is therefore suppressed in the non-window region 15a, and is promoted in the window region 15b. Hence, the differences between the degrees of disordering and between the band gap energies in the non-window region 15a and the window region 15b are increased, and as a result, a smaller amount of laser light is absorbed at the facet, and the risk of COD is reduced.

Figure 32:
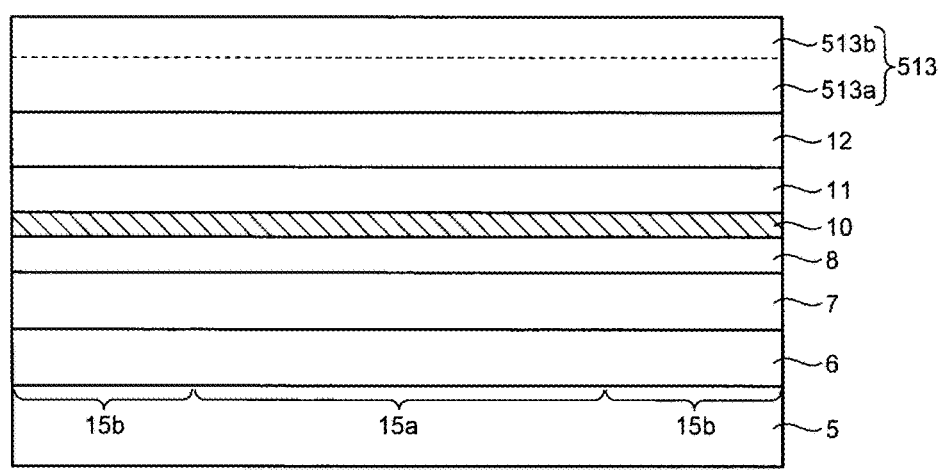
FIG. 32 is a schematic for explaining an exemplary method for manufacturing a semiconductor laser element according to the fifth embodiment.
Figure 33:
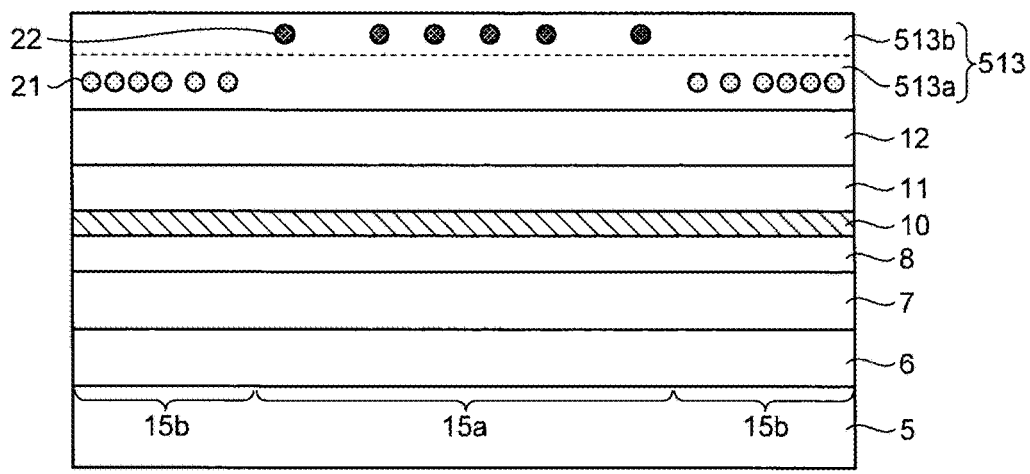
FIG. 33 is a schematic for explaining the exemplary method for manufacturing a semiconductor laser element according to the fifth embodiment.
Figure 34:
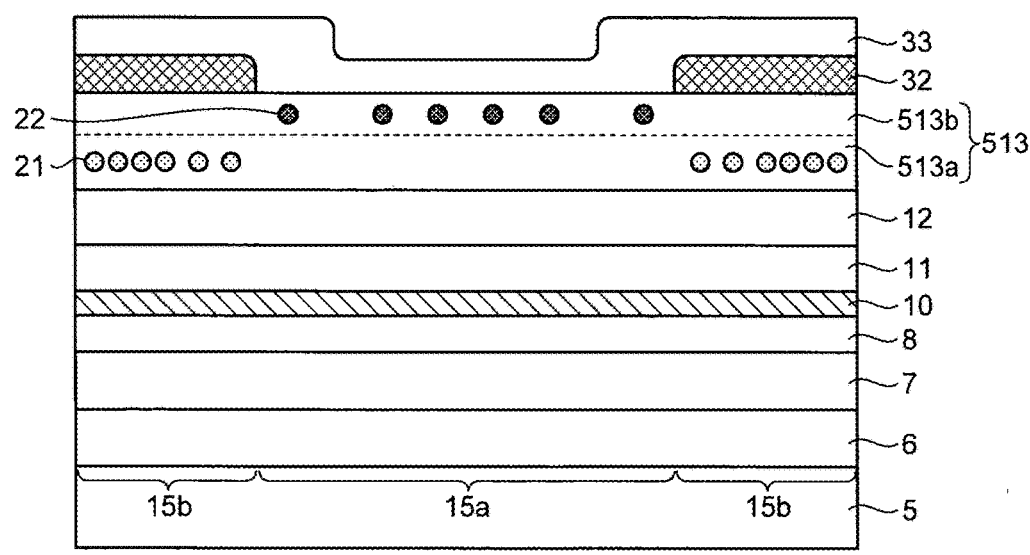
FIG. 34 is a schematic for explaining the exemplary method for manufacturing a semiconductor laser element according to the fifth embodiment.

FIG. 32 is a schematic for explaining an exemplary method for manufacturing a semiconductor laser element according to the fifth embodiment. To begin with, as illustrated in FIG. 32, in the semiconductor layer portion forming process according to the first embodiment, a GaAs layer not doped with any impurity is formed as a layer that is to be a p-type contact layer 513 on the p-type cladding layer 12. As illustrated in FIG. 33, the area corresponding to the non-window region 15a that is to be the p-type contact layer 513b is selectively doped with Zn 22, and the area corresponding to the window region 15b that is to be the p-type contact layer 513a is selectively doped with C 21 through ion implantation. Through this process, the p-type contact layer 513 is formed. As illustrated in FIG. 34, the promoting film 32 and the suppressing film 33 are then formed through the promoting film forming process and the suppressing film forming process, respectively, in the same manner as in the first embodiment. The annealing process and the ridge structure forming process are then carried out, in the same manner as in the first embodiment, and the final semiconductor laser element 500 is achieved thereby.

As described in the embodiments, in the semiconductor laser element according to any one of the embodiments of the present invention, the differences between the degrees of disordering and between the band gap energies in the non-window region 15a and the window region 15b are increased by allowing the p-type semiconductor layer section 14 to contain more of the impurity functioning as the promoting species in the window region 15b, and allowing the p-type semiconductor layer section 14 to contain more of the impurity functioning as the suppressing species in the non-window region 15a. In such a structure, the effects of increasing the band gap energy difference and reducing the risk of COD are more prominent, compared with those in the conventional technologies, so that a reliable semiconductor laser element can be provided.

Explained now with reference to some drawings is how the band gap energies in the non-window region 15a and the window region 15b change when the impurity content of the p-type semiconductor layer section 14 in the non-window region 15a and the window region 15b is changed in accordance with the embodiments.

Figure 35:
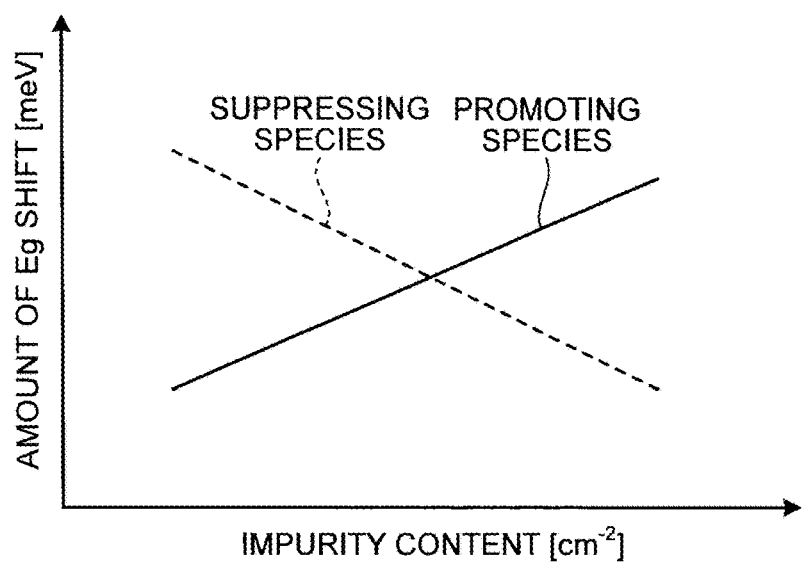
FIG. 35 is a schematic indicating a relation between the promoting species content and the suppressing species content, and the amount of band gap energy shift.

FIG. 35 is a schematic illustrating how the band gap energy (Eg) is changed by the annealing process when the promoting species content and the suppressing species content of the p-type semiconductor layer section 14 are changed. As illustrated in FIG. 35, when the promoting species content of the p-type semiconductor layer section 14 is increased (toward the right in the drawing), the amount of Eg shift is increased, and the band gap energy is increased (upwardly in the drawing). By contrast, when the suppressing species content of the p-type semiconductor layer section 14 is increased (toward the right in the drawing), the amount of Eg shift is decreased, and the band gap energy is reduced (downwardly in the drawing).

Figure 36:
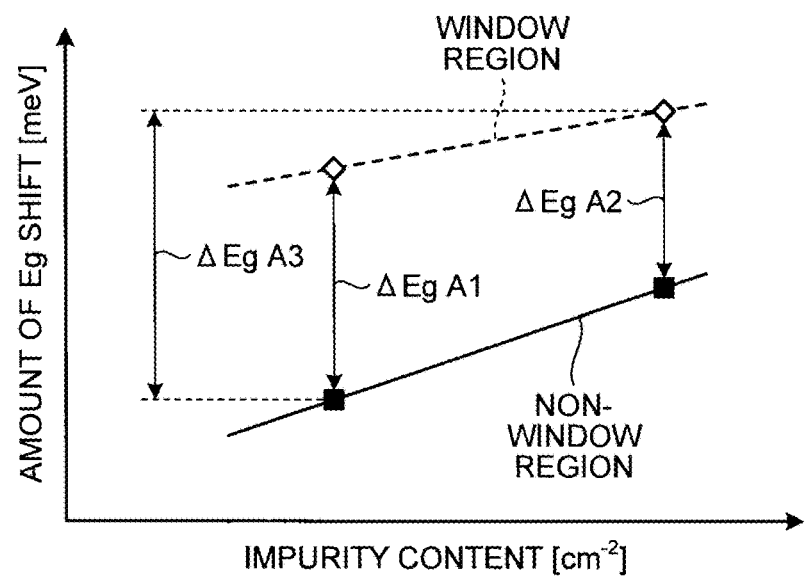
FIG. 36 is a schematic illustrating how the band gap energy changes when the promoting species contents of the p-type semiconductor layer section in the non-window region and the window region are changed.

FIG. 36 is a schematic illustrating how the band gap energy is changed by the annealing process when the promoting species content of the p-type semiconductor layer section 14 is changed in the non-window region 15a and the window region 15b. The graph with a smaller amount of shifted Eg corresponds to the non-window region 15a where disordering is suppressed by the suppressing film, and the graph with a larger amount of shifted Eg corresponds to the window region 15b where disordering is promoted by the promoting film. When the promoting species content of the p-type semiconductor layer section 14 is increased in the non-window region 15a and the window region 15b as illustrated in FIG. 36, the amount of Eg shift is increased accordingly. In the semiconductor laser element manufactured with a conventional technology, because the impurity content is the same across the non-window region 15a and the window region 15b, ΔEgA1 or ΔEgA2 represents the band gap energy difference (ΔEg) in the non-window region 15a and the window region 15b. By contrast, in the semiconductor laser element according to any one of the embodiments of the present invention, because the non-window region 15a has a lower promoting species content and the window region 15b has a higher promoting species content, ΔEg can be increased to ΔEgA3, which is larger than ΔEgA1 or ΔEgA2. With the embodiments, therefore, the band gap energy difference in the non-window region 15a and the window region 15b can be increased, and the risk of COD can be reduced more prominently, compared with when the conventional technologies are used.

Figure 37:
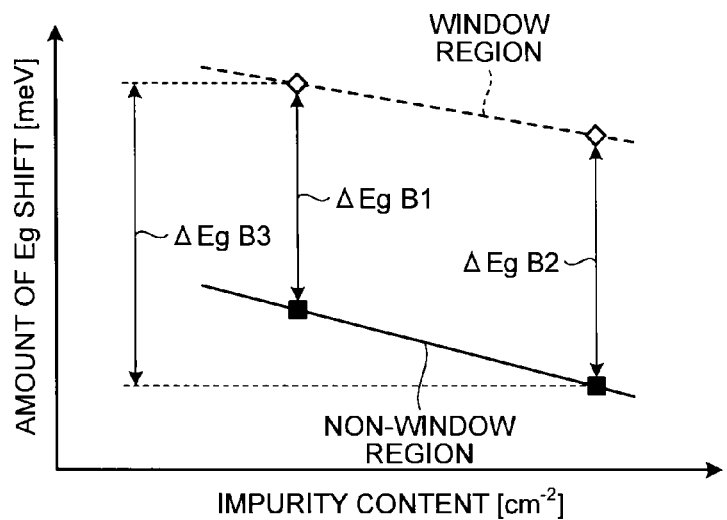
FIG. 37 is a schematic illustrating how band gap energy changes when the suppressing species contents of the p-type semiconductor layer section in the non-window region and in window region are changed.

FIG. 37 is a schematic illustrating how the band gap energy is changed by the annealing process when the suppressing species content of the p-type semiconductor layer section 14 is changed in the non-window region 15a and the window region 15b. As illustrated in FIG. 37, when the suppressing species content of the p-type semiconductor layer section 14 is increased in the non-window region 15a and the window region 15b, the amount of Eg shift is decreased accordingly. In the semiconductor laser element manufactured with a conventional technology, because the impurity content is the same in the non-window region 15a and in the window region 15b, ΔEgB1 or ΔEgB2 represents the band gap energy difference (ΔEg) between the non-window region 15a and the window region 15b. By contrast, in the semiconductor laser element according to any one of the embodiments of the present invention, because the non-window region 15a has a higher suppressing species content, and the window region 15b has a lower suppressing species content, ΔEg can be increased to ΔEgB3, which is larger than ΔEgB1 or ΔEgB2.

Figure 38:
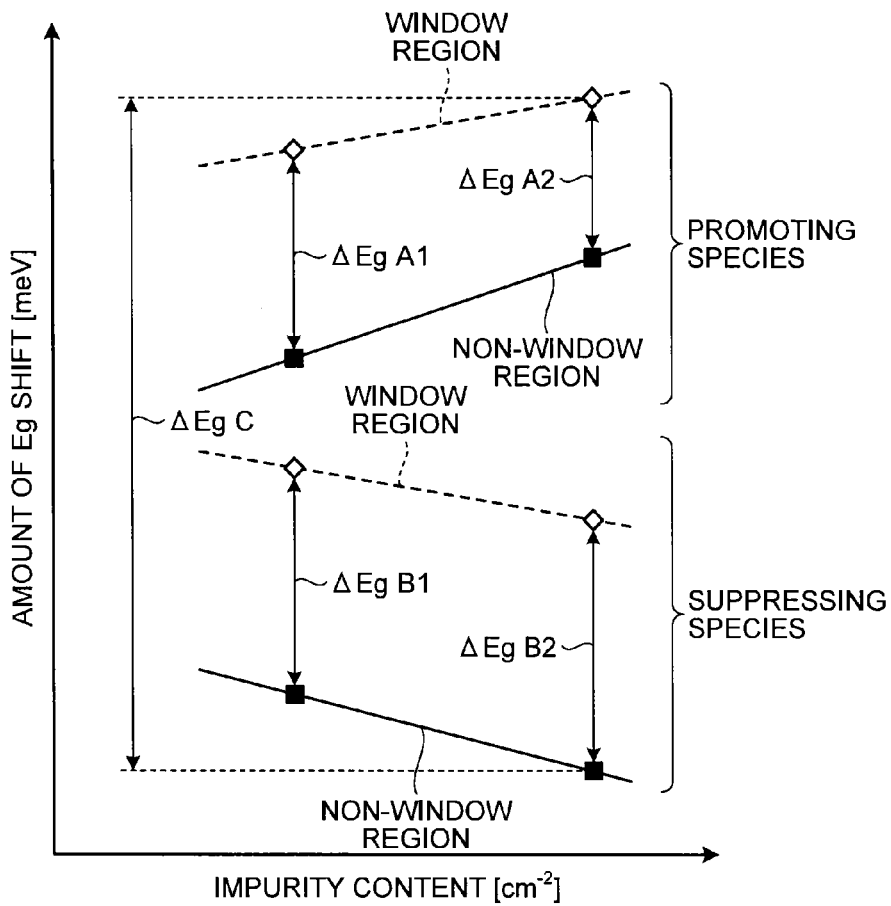
FIG. 38 is a schematic indicating a relation between the impurity content and the amount of band gap energy shift when the p-type semiconductor layer section in the window region contains the promoting species, and the p-type semiconductor layer section in the non-window region contains the suppressing species.

Furthermore, in the semiconductor laser element according to any one of the embodiments of the present invention, the impurity content of the p-type semiconductor layer section 14 in the non-window region 15a and that the window region 15b are adjusted as appropriate. When Eg shifts more with doping of the promoting species than of the suppressing species, for example, the relation illustrated in FIG. 38 is established, based on FIGS. 36 and 37. Assuming that the p-type semiconductor layer section 14 in the window region 15b has a higher promoting species content, and the p-type semiconductor layer section 14 in the non-window region 15a has a higher suppressing species content, the band gap energy difference between the window region 15b and the non-window region 15a can be increased to ΔEgC. In this manner, by changing the promoting species content as well as the suppressing species content of the p-type semiconductor layer section 14 in the window region 15b and in the non-window region 15a, the band gap energy difference between the window region 15b and the non-window region 15a can be further increased.

In the manner described above, by changing the promoting species content and the suppressing species content across the p-type semiconductor layer section 14, the band gap energy difference between the non-window region 15a and the window region 15b can be increased. With such a structure, the semiconductor laser element according to the embodiments can provide a semiconductor laser element that has a larger band gap energy difference, that absorbs a smaller amount of laser light at its facet, in which the risk of COD is reduced, and that is more reliable.

In the embodiments described above, the semiconductor layer portion includes two regions that are the window region and the non-window region extending along the deposition direction of the semiconductor layer portion. Alternatively, the non-window region may have two or more active layers with different degrees of disordering achieved through atomic hole diffusion and different band gap energies. Such a semiconductor laser element can oscillate two or more beams of laser light at different wavelengths from the two respective active layers. In other words, while disordering is intended to make the window region transparent to the oscillation wavelength of the semiconductor laser element in the embodiments described above, disordering in the non-window region can also change the oscillation wavelength of the semiconductor laser element.

In this manner, with different degrees of disordering in a plurality of regions through atomic vacancy diffusion and different band gap energies of such regions, a semiconductor laser element with a plurality of emission wavelengths (and laser emission wavelengths) can be achieved.

When there are n non-window regions (plane-direction regions) extending in the deposition direction, for example, by etching each of the first to the nth plane-direction regions by different degrees, a wavelength-tunable semiconductor laser element capable of oscillating laser light at n different wavelengths can be manufactured. It is also possible to manufacture a wavelength-tunable semiconductor laser element capable of oscillating laser light at n×m wavelengths at the maximum, by forming m different dielectric films the compositions or materials of which are different on each of the n regions before the semiconductor layer portion is annealed, where n and m are integers equal to or more than one.

For example, a wavelength-tunable semiconductor laser element with eight different laser emission wavelengths can be manufactured by: forming four dielectric films having different materials and refractive indices, for example, on each of two regions having different promoting species contents or suppressing species contents or both; forming two different dielectric films having different materials and refractive indices, for example, on each of four regions having different promoting species contents or suppressing species contents or both; or forming one dielectric film on each of eight regions having different promoting species contents or suppressing species contents or both.

Furthermore, in the embodiments described above, a ridge structure is used to ensure the optical confinement in the semiconductor laser module in the light guiding direction, but the present embodiment is not limited thereto. A buried laser structure or a self-aligned structure (SAS), for example, may be used. In the description herein, in a structure such as SAS, the width of the internal current confining region is considered as the current injection width.

Explained now as a semiconductor laser element according to some examples of the present invention are exemplary measurements of the band gap energy shifts, measured while changing the C content or the Zn content of the p-type semiconductor layer section 14 in the non-window region 15a and the window region 15b.

Example 1

Figures 39, 40:
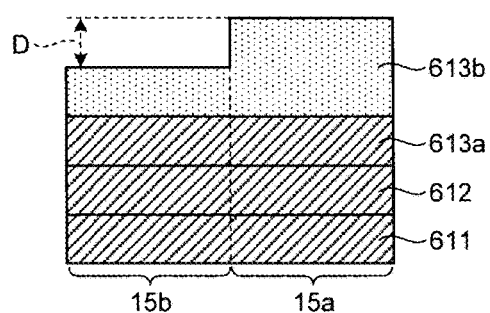
FIG. 39 is a schematic for explaining a structure of a semiconductor laser element according to Example 1.
FIG. 40 is a schematic of a relation between the etched amount of a Zn-containing layer in the p-type semiconductor layer section, and the amount of band gap energy shift in the window region, when the p-type semiconductor layer section contain both C and Zn.

FIG. 39 is a schematic for explaining a structure of a semiconductor laser element according to Example 1. In the semiconductor laser element according to Example 1, a p-type guide layer 611, a p-type cladding layer 612, and a p-type contact layer 613a are doped with C. A p-type contact layer 613b is a layer uniformly doped with Zn. In FIG. 39 and thereafter, the structures of the layers such as the active layer 10 and the n-type semiconductor layer section 9 of the semiconductor laser element, other than the p-type semiconductor layer section are the same as those in the semiconductor laser element 100, so that these parts are omitted in the drawings.

In Example 1, in the semiconductor layer portion forming process according to the first embodiment, only a part of the p-type contact layer 613b was removed by etching, as illustrated in FIG. 39, instead of removing the entire p-type contact layer 13b as disclosed in the first embodiment. The Zn content of the p-type semiconductor layer section 14 in the window region 15b was thus changed by changing the etched amount D in FIG. 39. The semiconductor was then annealed with the RTA at a temperature of 835 degrees Celsius for 30 seconds.

FIG. 40 is a schematic of a relation between the etched amount of a Zn-containing layer in the p-type semiconductor layer section, and the amount of band gap energy shift in the window region, when the p-type semiconductor layer section contain both C and Zn. In Example 1, the amount of band gap energy shift was measured as Examples 1-1 to 1-3 with different etched amounts D, and Comparative Example 1 in which the p-type contact layer is not etched at all.

As illustrated in FIG. 40, when the p-type contact layer 613b in the window region 15b was etched more, the Zn content of the p-type semiconductor layer section 14 decreased, while the amount of band gap energy shift was increased. This result indicates that Zn was functioning as the suppressing species. While the Zn concentration of the topmost layer of the p-type contact layer 613b remained constant, the amount of band gap energy shift varied depending on the etched amount. In other words, the amount of band gap energy shift is dependent on the Zn content, not on the Zn concentration. In this manner, a greater band gap energy difference can be achieved even when the Zn concentrations of the topmost layer in the window region and the non-window region are constant.

Example 2

Figures 41, 42:
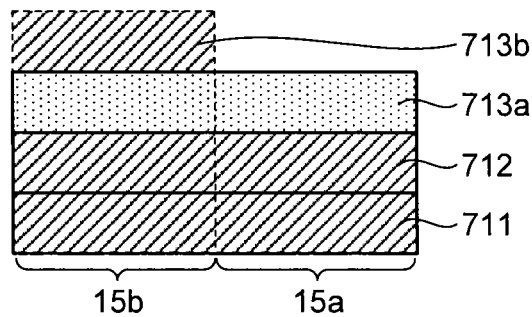
FIG. 41 is a schematic for explaining a structure of a semiconductor laser element according to Example 2.
FIG. 42 is a schematic of a relation between the C content and the amount of band gap energy shift in the p-type semiconductor layer section in the window region when the p-type semiconductor layer section contain both C and Zn.

FIG. 41 is a schematic for explaining a structure of a semiconductor laser element according to Example 2. In the semiconductor laser element according to Example 2, after a p-type guide layer 711 and a p-type cladding layer 712 doped with C are deposited, a p-type contact layer 713a doped with Zn is deposited. A p-type contact layer 713b doped with C is selectively deposited in the window region 15b, as illustrated in FIG. 41. Through this process, the C content of the p-type semiconductor layer section is made different in the non-window region 15a and in the window region 15b. The RTA is then carried out at a temperature of 850 degrees Celsius for 30 seconds.

FIG. 42 is a schematic of a relation between the C content and the amount of band gap energy shift in the p-type semiconductor layer section in the window region when the p-type semiconductor layer section contain both C and Zn. In FIG. 42, the amount of band gap energy shift was also measured as Comparative Example 2 in which the p-type contact layer 713b was provided in none of the non-window region 15a and the window region 15b, as well as in Example 2.

As illustrated in FIG. 42, when the C content of the p-type semiconductor layer section in the window region 15b was increased, the amount of band gap energy shift increased. This result indicates that C was functioning as the promoting species.

Example 3

Figures 43, 44:
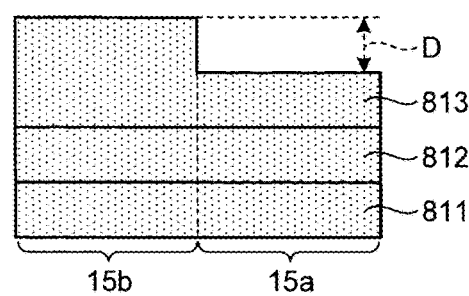
FIG. 43 is a schematic for explaining a structure of a semiconductor laser element according to Examples 3 and 4.
FIG. 44 is a schematic of a relation between the Zn content of and the amount of band gap energy shift in the p-type semiconductor layer section in the non-window region when p-type semiconductor layer section only contains Zn, and Zn functions as the promoting species.

FIG. 43 is a schematic for explaining a structure of a semiconductor laser element according to Example 3. In the semiconductor laser element according to Example 3, all of the layers from a p-type guide layer 811 to a p-type contact layer 813 included in the p-type semiconductor layer section were doped only with Zn, and were not doped with C. The Zn content of the p-type semiconductor layer section was changed by changing the etched amount D of the p-type contact layer 813, in the same manner as in Example 1. Example 3 is different from Example 1 in that the etched amount in the non-window region 15a was changed, while the window region 15b was etched in Example 1. Through this process, the Zn content of the p-type semiconductor layer section 14 in the non-window region 15a was changed. The RTA was then carried out at a temperature of 825 degrees Celsius for 30 seconds. In Example 3, the amount of band gap energy shift was measured as Examples 3-1 and 3-2 with different etched amounts D, and as Comparative Example 3 in which the p-type semiconductor layer was not etched at all.

FIG. 44 is a schematic of a relation between the Zn content of and the amount of band gap energy shift in the p-type semiconductor layer section in the non-window region when p-type semiconductor layer section only contains Zn, and Zn functions as the promoting species. As illustrated in FIG. 44, when the Zn content of the p-type semiconductor layer section 14 in the non-window region 15a was increased, the amount of band gap energy shift increased as well. This result indicates that Zn was functioning as the promoting species.

Example 4

In Example 4, the Zn content of the p-type semiconductor layer section in the non-window region 15a was changed with the structure illustrated in FIG. 43, in the same manner as in Example 3. The RTA was then carried out at a temperature of 830 degrees Celsius for 30 seconds. While the refractive index of SiN that is an suppressing film was 1.9 in Example 3, the refractive index of SiN that is an suppressing film was 2.0, that is, more dense, in Example 4. In Example 4, the amount of band gap energy shift was measured as Examples 4-1 and 4-2 with different etched amounts D, and as Comparative Example 4 in which the p-type semiconductor layer was not etched at all.

Figures 45, 46:
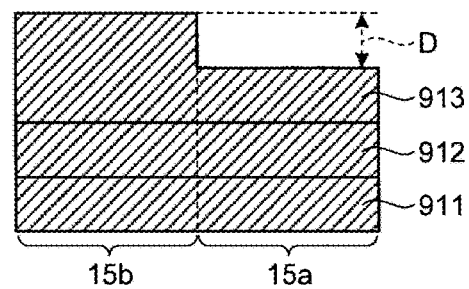
FIG. 45 is a schematic of a relation between the Zn content of and the amount of band gap energy shift in the p-type semiconductor layer section in the non-window region when the p-type semiconductor layer section only contains Zn, and Zn functions as the suppressing species.
FIG. 46 is a schematic for explaining a structure of a semiconductor laser element according to Example 5.

FIG. 45 is a schematic of a relation between the Zn content of and the amount of band gap energy shift in the p-type semiconductor layer section in the non-window region when the p-type semiconductor layer section only contains Zn, and Zn functions as the suppressing species. As illustrated in FIG. 45, when the Zn content of the p-type semiconductor layer section 14 in the non-window region 15a was increased, the amount of band gap energy shift decreased. This result indicates that Zn was functioning as the suppressing species. Even when the p-type contact layer is only doped with Zn as one type of impurity, Zn might change its function between the function as the promoting species and the suppressing species depending on the conditions of the suppressing film. The RTA temperature and time, as well as the type and the concentration of the impurity, the densities and refractive indices of the promoting film and the suppressing film, may also affect how the impurity functions.

Example 5

FIG. 46 is a schematic for explaining a structure of a semiconductor laser element according to Example 5. In the semiconductor laser element according to Example 5, all of a p-type guide layer 911, a p-type cladding layer 912, and a p-type contact layer 913 included in the p-type semiconductor layer section 14 were doped only with C, oppositely to Examples 3 and 4, and the etched amount D in the p-type contact layer 913 was changed in the non-window region 15a. Through this process, the C content of the p-type semiconductor layer section 14 in the non-window region 15a was changed. The RTA was then carried out at a temperature of 825 degrees Celsius for 30 seconds. In Example 5, the amount of band gap energy shift was measured as Examples 5-1 and 5-2 with different etched amounts D, and as Comparative Example 5 in which p-type semiconductor layer was not etched at all.

Figures 47, 48:
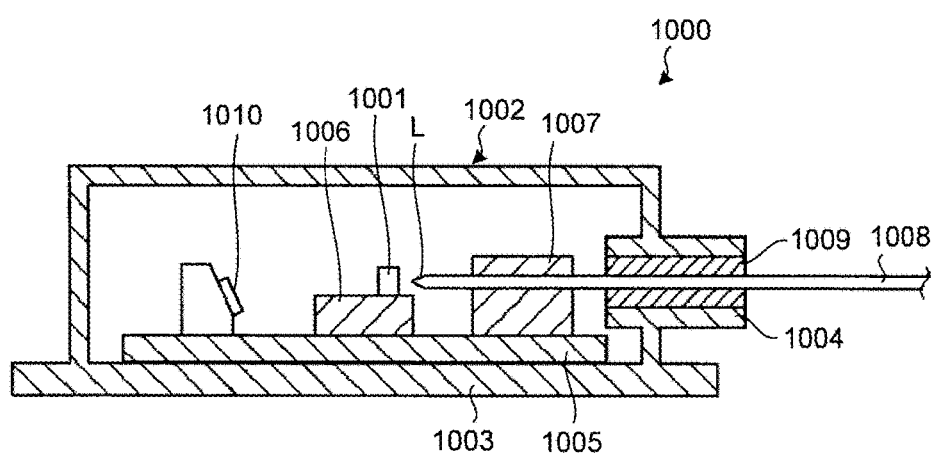
FIG. 47 is a schematic of a relation between the C content and the amount of band gap energy shift in the p-type semiconductor layer section in the non-window region when the p-type semiconductor layer section contains only C.
FIG. 48 is an exemplary side view of a semiconductor laser module according to a sixth embodiment of the present invention with a part of the housing removed.

FIG. 47 is a schematic of a relation between the C content and the amount of band gap energy shift in the p-type semiconductor layer section in the non-window region when the p-type semiconductor layer section contains only C. As illustrated in FIG. 47, when the C content of the p-type semiconductor layer section 14 in the non-window region 15a was increased, the amount of band gap energy shift increased as well. This result indicates that C was functioning as the promoting species.

In Examples 1 to 5, the impurity content of the p-type semiconductor layer section 14 is made different between the non-window region 15a and the window region 15b by changing the etched amount of the p-type contact layer or by selective deposition of the impurity-containing layer. Alternatively, the impurity content of the p-type semiconductor layer section 14 may be made different between the non-window region 15a and the window region 15b by selective deposition of the impurity-containing layers in different concentrations, by selective diffusion of the impurity from a diffusion source, or by selective implantation of the impurity through ion implantation.

As indicated by the examples described above, the types of impurities, the amount doped, a combination of the impurities, the density of the dielectric film, and the refractive index of the impurity contained in the p-type semiconductor layer section determine if the impurity functions as the promoting species or as the suppressing species. Therefore, using a promoting species and an suppressing species in an appropriate combination, by increasing the promoting species content of the p-type semiconductor layer section in the window region 15b, and by increasing the suppressing species content of the p-type semiconductor layer section in the non-window region 15a, the difference between the degrees of disordering and the band gap energy difference in the non-window region 15a and the window region 15b can be increased, so that a smaller amount of laser light is absorbed at the facet, and the risk of COD is reduced.

When there are two or more regions with different degrees of disordering and different band gap energies, as the window region and the non-window region described above, it is preferable that at least one of the two or more regions contains both the first impurity and the second impurity, and that the content of at least one of the impurities is made different between the two or more regions. With such a configuration, compared with when these two or more regions merely has different degrees of disordering, or compared with when only one impurity is used and only the impurity content is made different between the two or more regions, so much larger energy band gap difference can be achieved. The reason is, because the suppressing species such as Zn presumably suppresses disordering by becoming thermally diffused and filling out the atomic vacancies, as mentioned earlier, the suppressing species can achieve the suppressing effect when the vacancies exist at a certain level. Therefore, the suppressing effect achieved with the suppressing species can be enhanced by using the promoting species such as C.

To allow at least one of two or more regions to contain both the first impurity and the second impurity, and the content of at least one of the impurities to be different between the two or more regions, the regions that are to be the window region and the non-window region are both doped with Zn and C, and the Zn content, C content, or both may be made different between these two regions. It is preferable that the Zn content, C content, or both are made different so that the band gap energy difference between these two regions are maximized.

While the contact layer 13b is completely removed only in the region that is to be the window region in the first embodiment, as illustrated in FIG. 6, a slight amount of the contact layer 13b may be left unremoved in the region that is to be the window region, or the contact layer 13a may be slightly removed by etching from the region that is to be the window region. When the contact layer 13a is slightly removed by etching, it is more likely that a larger band gap energy difference at a level near that achieved when only the contact layer 13b is completely removed is achieved, because Zn has a larger impact on the change in the amount of band gap energy shift with respect to a unit content than C, as can be seen in FIGS. 40 and 47.

While the contact layer 313b is completely removed only from the region that is to be the window region in the third embodiment, as illustrated in FIG. 23, and a slight amount of the contact layer 313b may be left unremoved in the region that is to be the window region, or the contact layer 313a may be slightly removed by etching from the region that is to be the window region. When the contact layer 313b is slightly left unremoved, it is more likely that a larger band gap energy difference at a level near that achieved when only the contact layer 313b is completely removed is achieved, because Zn has a larger impact on a change in the amount of band gap energy shift with respect to a unit content than C, as can be seen in FIGS. 40 and 47.

The semiconductor laser element explained in the embodiment may be mounted onto a package together with a controller, an optical element, or the like to achieve a semiconductor laser module. Semiconductor laser modules generally have a temperature adjusting mechanism that provides cooling or heating for controlling the temperature of the semiconductor laser element at an appropriate level. The semiconductor laser element according to the embodiment is more reliable and capable of operating stably without the temperature adjustment, because the semiconductor laser element has a larger band gap energy difference and a lower risk of COD. The semiconductor laser module, therefore, does not necessarily need to have a temperature adjusting mechanism for adjusting the temperature of the semiconductor laser element. As a result, a low-cost uncooled semiconductor laser module with a simple structure can be provided.

Sixth Embodiment

A semiconductor laser module according to a sixth embodiment of the present invention will now be explained. The semiconductor laser module according to the sixth embodiment is a semiconductor laser module having a semiconductor laser element that is more reliable and in which the risk of COD is reduced, as described in one of the first to the fifth embodiments and the embodiments described below, for example. FIG. 48 is an exemplary side view of the semiconductor laser module according to the sixth embodiment with a part of the housing removed. This semiconductor laser module 1000 includes a semiconductor laser element 1001 that is the same as the semiconductor laser element 100 according to the first embodiment, for example, and outputs laser light received from the semiconductor laser element 1001 via an optical fiber 1008. The semiconductor laser module 1000 includes a housing 1002, a bottom plate 1003, a tubular hole 1004, a base 1005, a mount 1006, a fiber fixer 1007, an optical fiber 1008, a sleeve 1009, and an optical receiver 1010.

The housing 1002, the bottom plate 1003, and the tubular hole 1004 are made of a metal. The housing 1002, the bottom plate 1003, and the tubular hole 1004 is made of aluminum (Al), as an example, and internal of the housing 1002 is sealed. The housing 1002, the bottom plate 1003, and the tubular hole 1004 may be configured as a butterfly package.

The base 1005 may be made of a material such as aluminum nitride (AlN), copper-tungsten (CuW), Si, or diamond. The mount 1006 may be made of the same material as the base 1005.

The fiber fixer 1007 is placed on the top surface of the base 1005, and the optical fiber 1008 is fixed to the fiber fixer 1007. The optical fiber 1008 may be fixed to the fiber fixer 1007 with resin, sealing glass, adhesive, or the like.

The optical fiber 1008 is inserted from external of the housing 1002 into the housing 1002 through the tubular hole 1004. The optical fiber 1008 may be a lensed fiber one end of which indicated by L in FIG. 48 is processed to have an aspheric surface providing a collecting lens. The optical fiber 1008 is fixed near the facet from which the light is output from the semiconductor laser element 1001, and the collecting lens collects the light output from the semiconductor laser element 1001. With this structure, the optical fiber 1008 can transmit the optical output of the semiconductor laser element 1001 to the external of the housing 1002.

The sleeve 1009 is positioned between the housing 1002 and the optical fiber 1008, and the optical fiber 1008 is fixed to the housing 1002 via the sleeve 1009. The optical fiber 1008 may be fixed to the sleeve 1009 with resin, sealing glass, adhesive, or the like.

The optical receiver 1010 receives an optical output from one side of the semiconductor laser element 1001, the side being on the opposite of the side facing the optical fiber 1008, and monitors the optical power of the semiconductor laser element 1001. The optical receiver 1010 may be positioned on the side of the high-reflectivity coating provided on the semiconductor laser element 1001. The optical receiver 1010 may be a photodiode. In this semiconductor laser module 1000 according to the sixth embodiment, because the semiconductor laser element 1001 has a structure less easily heated and with a lower risk of COD, a semiconductor laser module not provided with a temperature adjusting mechanism and capable of operating stably without temperature adjustment can be provided.

Seventh Embodiment

Figure 49:
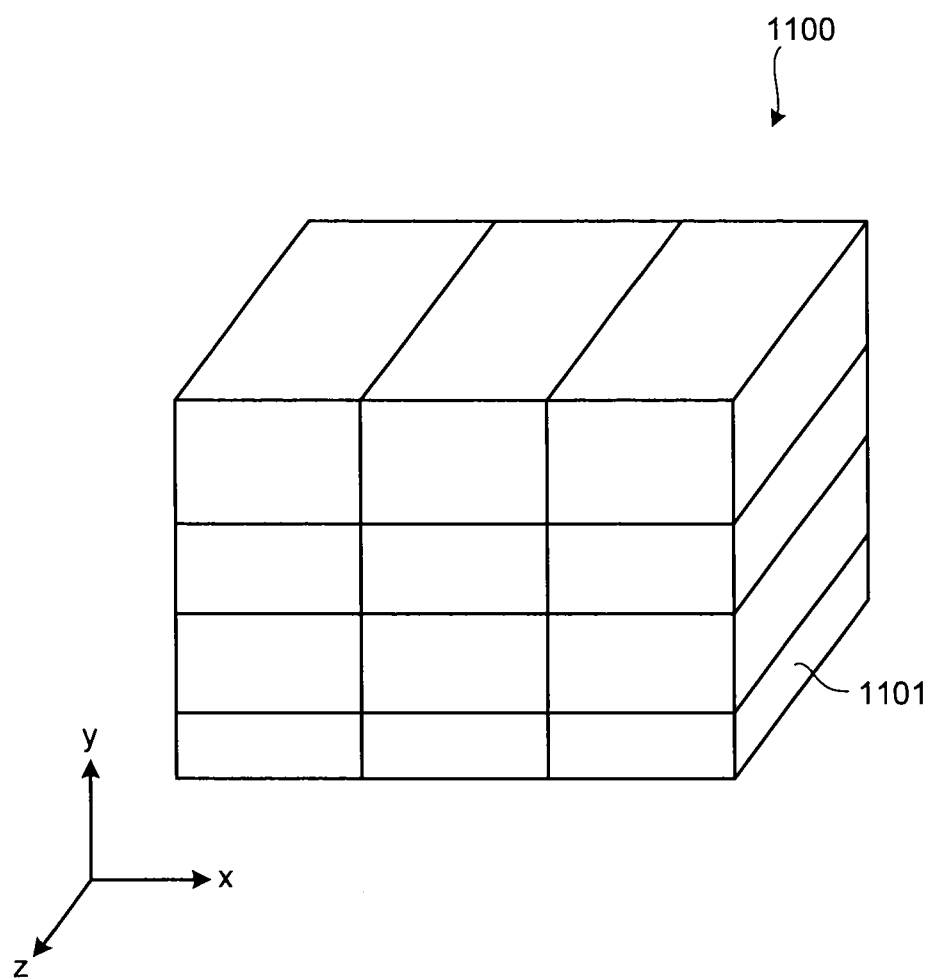
FIG. 49 is a schematic perspective view of a semiconductor optical element according to a seventh embodiment of the present invention.

A semiconductor optical element according to a seventh embodiment of the present invention will now be explained. FIG. 49 is a schematic perspective view of the semiconductor optical element according to the seventh embodiment. As illustrated in FIG. 49, this semiconductor optical element 1100 according to the seventh embodiment has an element body 1101, and functions as a semiconductor light waveguide that guides the incident light along the z-axial direction while keeping the light confined, with no resonating structure achieved with the low reflection film and the high reflection film.

Figure 50:
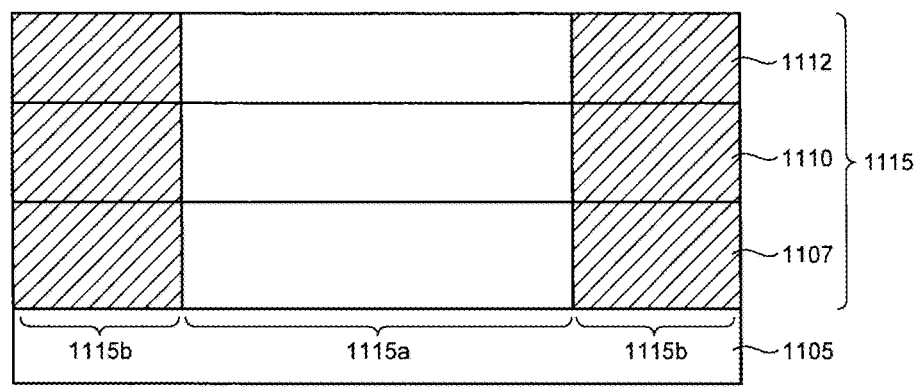
FIG. 50 is a cross-sectional view along the x-y plane in a semiconductor optical element according to the seventh embodiment.

FIG. 50 is a cross-sectional view along the x-y plane in the semiconductor optical element illustrated in FIG. 49. This semiconductor optical element 1100 is provided with a substrate 1105, and a semiconductor layer portion 1115 having a lower cladding layer 1107, a core layer 1110, and an upper cladding layer 1112 that are made of InP and sequentially layered on the substrate 1105. The semiconductor layer portion 1115 has a disordering suppressed region 1115a and a disordering promoted region 1115b.

The semiconductor optical element 1100 has a structure that confines light in the y-axial direction with the core layer 1110, and the lower cladding layer 1107 and the upper cladding layer 1112 between which the core layer 1110 is sandwiched and that are made of a semiconductor with a smaller refractive index than that of the core layer. The semiconductor optical element 1100 also has a structure that confines the light in the x-axial direction with the disordering suppressed region 1115a, and with the disordering promoted region 1115b by which the disordering suppressed region 1115a is surrounded and the refractive index of which is smaller than that of the disordering suppressed region 1115a because disordering has took place in the disordering promoted region 1115b. The semiconductor optical element 1100 thus functions as a semiconductor light waveguide that guides the light in the z-axial direction.

An exemplary method for manufacturing semiconductor optical element 1100 will now be explained. The method for manufacturing the semiconductor optical element 1100 according to the seventh embodiment includes the semiconductor layer portion forming process, the promoting film forming process, the suppressing film forming process, and the annealing process as illustrated in FIG. 3, in the same manner as in the first embodiment.

Semiconductor Layer Portion Forming Process

Figure 51:
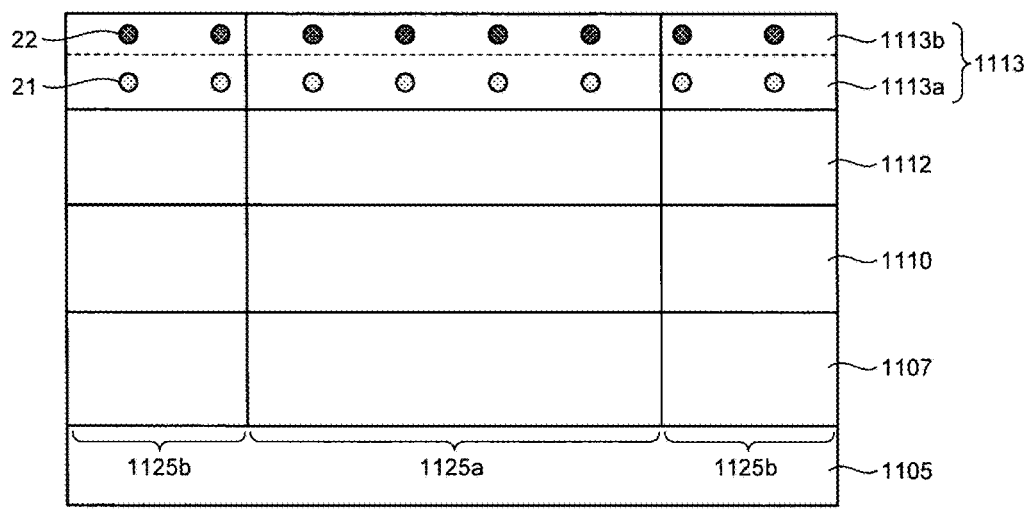
FIG. 51 is a schematic for explaining an exemplary method for manufacturing a semiconductor optical element according to the seventh embodiment.

To begin with, the semiconductor layer portion forming process will now be explained. In this process, to begin with, as illustrated in FIG. 51, the lower cladding layer 1107, the core layer 1110, and the upper cladding layer 1112 are grown on the substrate 1105 through MOCVD. An impurity-containing layer 1113 including a promoting species containing layer 1113a that is doped with C 21 as the promoting species, for example, and a suppressing species containing layer 1113b that is doped with Zn 22 as the suppressing species, for example, is then formed.

Figure 52:
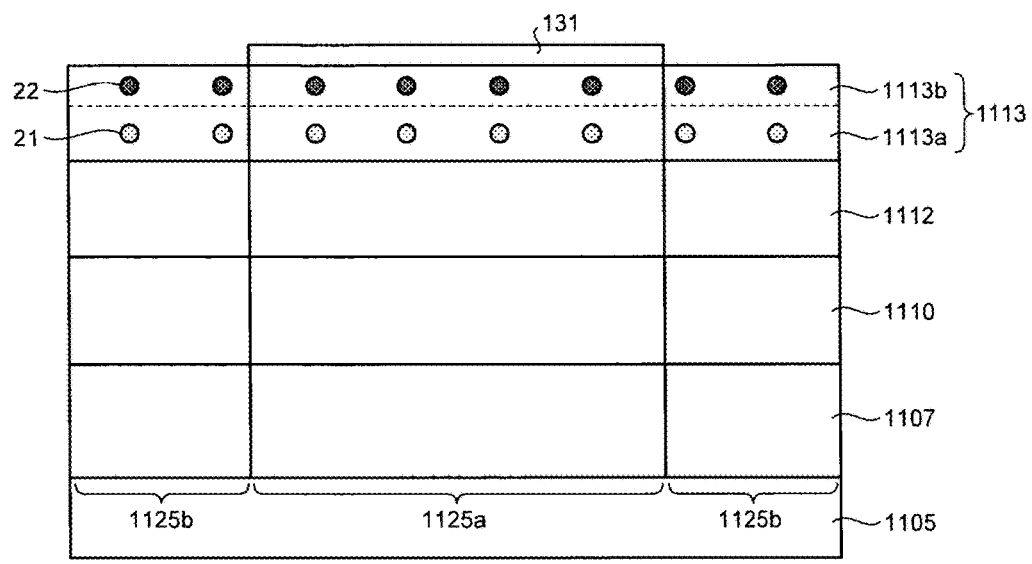
FIG. 52 is a schematic for explaining the exemplary method for manufacturing a semiconductor optical element according to the seventh embodiment.
Figure 53:
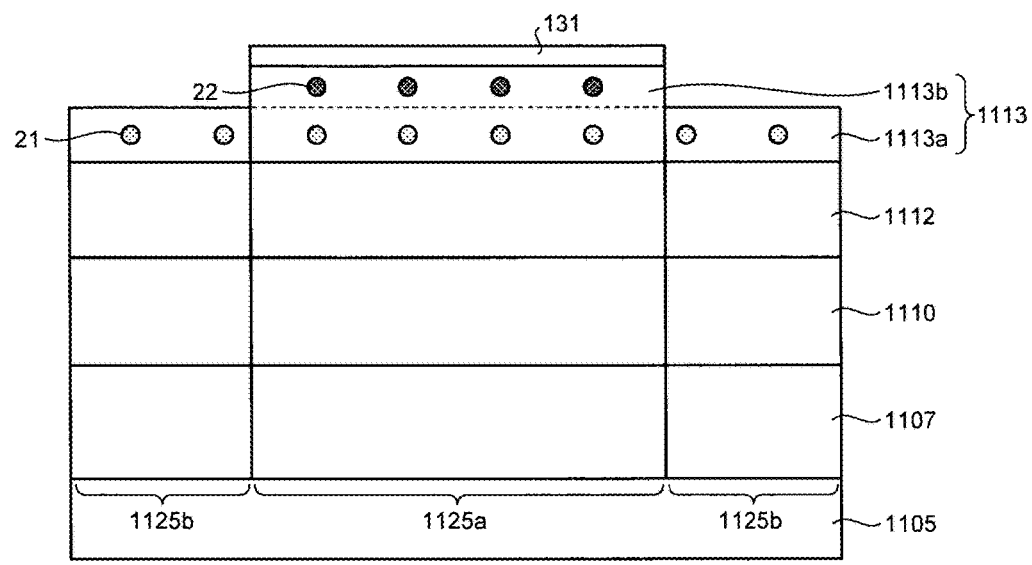
FIG. 53 is a schematic for explaining the exemplary method for manufacturing a semiconductor optical element according to the seventh embodiment.
Figure 54:
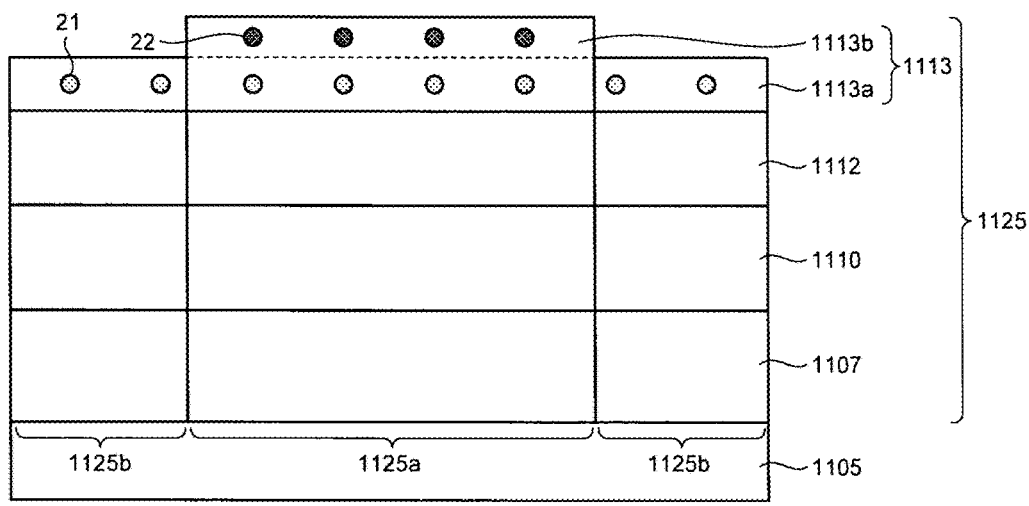
FIG. 54 is a schematic for explaining the exemplary method for manufacturing a semiconductor optical element according to the seventh embodiment.

The photolithography process and the etching process are then performed to remove the suppressing species containing layer 1113b from a second region 1125b that corresponds to the disordering promoted region 1115b, using the photoresist 131, while leaving the suppressing species containing layer unremoved from a first region 1125a that corresponds to the disordering suppressed region 1115a, as illustrated in FIGS. 52 and 53. The photoresist 131 is then removed, as illustrated in FIG. 54. Through this process, a semiconductor layer structure 1125 including layers from the lower cladding layer 1107 through the impurity-containing layer 1113 is produced.

Promoting Film Forming Process

Figure 55:
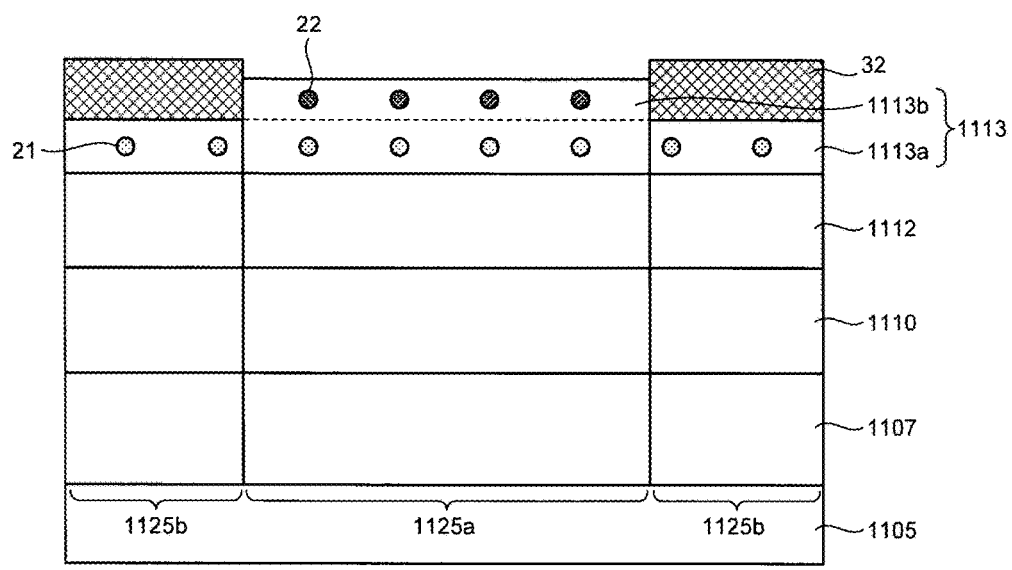
FIG. 55 is a schematic for explaining the exemplary method for manufacturing a semiconductor optical element according to the seventh embodiment.

The promoting film forming process will now be explained. In this process, the promoting film 32 is formed on the top surface of the second region 1125b in order to produce the disordering promoted region 1115b by disordering through atomic vacancy diffusion. To begin with, the promoting film 32 that is a SiN insulating layer is deposited on the top surface of the semiconductor layer structure 1125. The photolithography process and the etching process are then performed to remove the promoting film 32 from the region in which the disordering suppressed region 1115a is to be provided, as illustrated in FIG. 55. Through this process, the promoting film 32 is formed on the top surface of the second region 1125b.

Suppressing Film Forming Process

Figure 56:
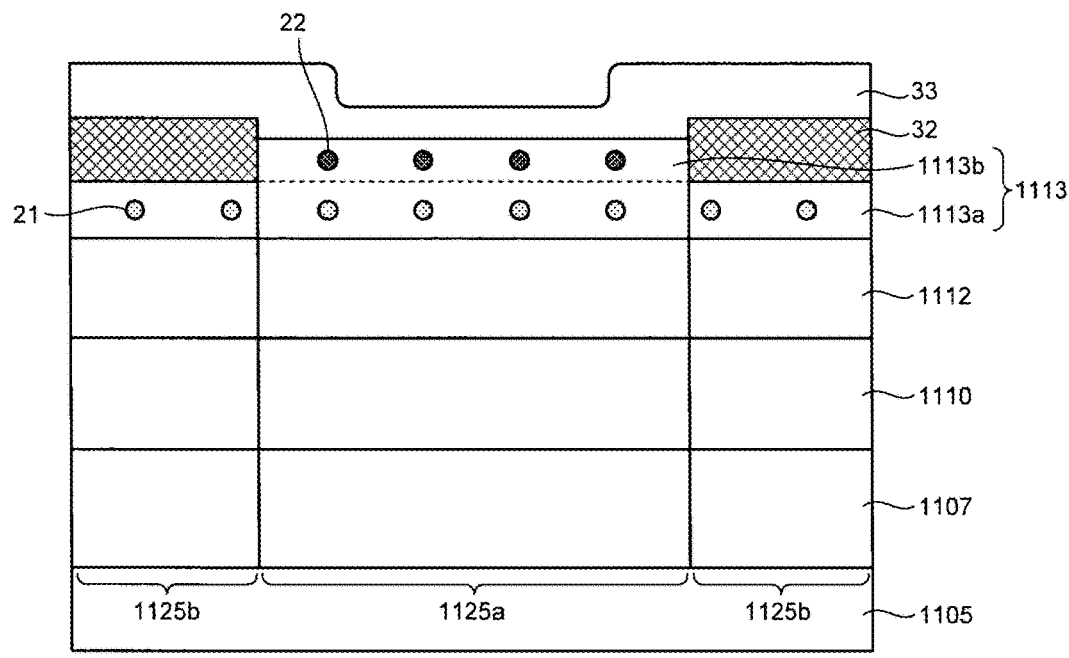
FIG. 56 is a schematic for explaining the exemplary method for manufacturing a semiconductor optical element according to the seventh embodiment.

The suppressing film forming process will now be explained. In this process, the suppressing film 33 that is a SiN insulating layer is formed, as illustrated in FIG. 56.

Annealing Process

Figure 57:
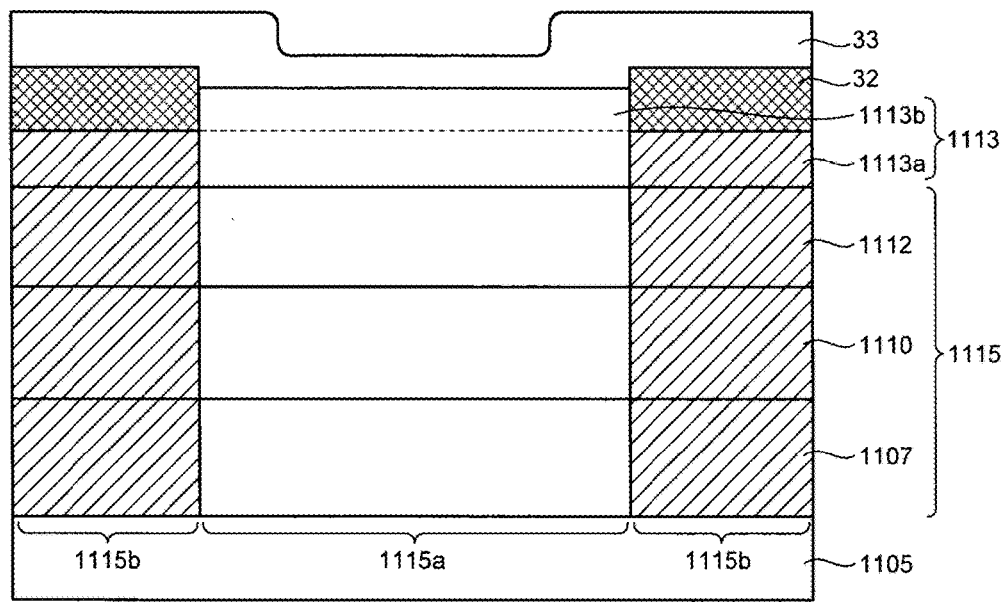
FIG. 57 is a schematic for explaining the exemplary method for manufacturing a semiconductor optical element according to the seventh embodiment.

The annealing process will now be explained. In this process, the RTA is carried out at a temperature of 850 degrees Celsius for 30 seconds, for example. When the RTA is carried out, the promoting film 32 and the suppressing film 33 allow the atomic holes to diffuse across the semiconductor layer portion, inducing disordering in the semiconductor layer portion thereby. Through this process, the disordering suppressed region 1115a and the disordering promoted region 1115b with different degrees of disordering are produced, as illustrated in FIG. 57. The disordering suppressed region 1115a and the disordering promoted region 1115b have different effective refractive indices. The impurity-containing layer 1113 is then removed by etching, for example, the final semiconductor optical element 1100 is achieved.

As described above, with the semiconductor optical element 1100 according to the seventh embodiment, a semiconductor optical element with a larger band gap energy difference can be achieved. In the manner described above, the present invention can be used in a semiconductor light waveguide, such as that according to the seventh embodiment, without limitation to the semiconductor laser element as disclosed in the first embodiment.

The band gap energy and the refractive index of a semiconductor material are generally correlated to each other. In the seventh embodiment, because a larger band gap energy difference can be ensured, the selectable or settable range of refractive index difference can be increased. When the selectable or settable range of refractive index difference is increased, an increased number of selections of materials, waveguide structures, and the like are made available to achieve a desired refractive index difference, and therefore, the waveguide can be designed more freely.

In the seventh embodiment, while the light confining structure in the x-axial direction is provided by making the degree of disordering different between the first region 1125a and the second region 1125b extending in the deposition direction, the optical confinement in the x-axial direction may be improved by providing another third region with different degree of disordered crystals outside of the second region 1125b. Furthermore, the degrees of disordering crystals may be continuously changed by continuously changing the thickness of the first region in the x-axial direction, for example. Such a structure can also achieve the same effect as that achieved in the seventh embodiment, so that a semiconductor optical element with a larger band gap energy difference can be achieved.

Furthermore, in the seventh embodiment, the border between the first region 1125a and the second region 1125b extends in the light guiding direction, but the border between the regions may extend in a direction traversing the light guiding direction. For example, a grating structure may be manufactured by forming layers each with a different refractive index alternatingly in the light guiding direction.

The semiconductor optical element according to the seventh embodiment may be used in combination with the semiconductor laser element according to any one of the first to the fifth embodiments. In such a configuration, each of the regions may have different degrees of disordering, or has different band gap energies.

Furthermore, the seventh embodiment may be used to manufacture a passive waveguide by inducing disordering in the active layer, or may be used in monolithic integration of an active element and a passive waveguide.

As the results described above indicate, the semiconductor optical element according to the embodiment having the regions with different degrees of disordering has been proven to provide a semiconductor optical element having a larger band gap energy difference.

Eighth Embodiment

A semiconductor laser element according to an eighth embodiment of the present invention will now be explained.

Figure 58A:
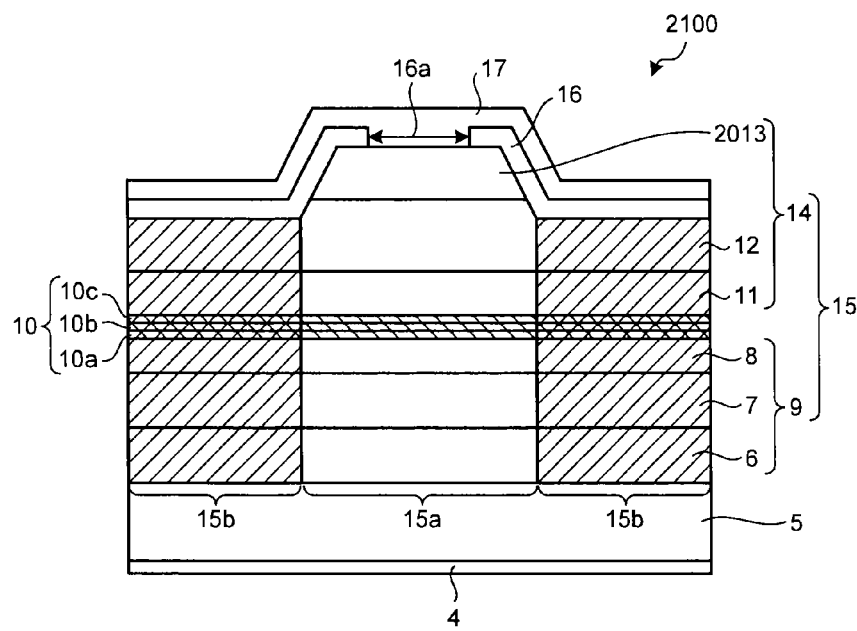
FIG. 58A is a cross-sectional view along the x-y plane in a semiconductor laser element according to an eighth embodiment of the present invention.
Figure 58B:
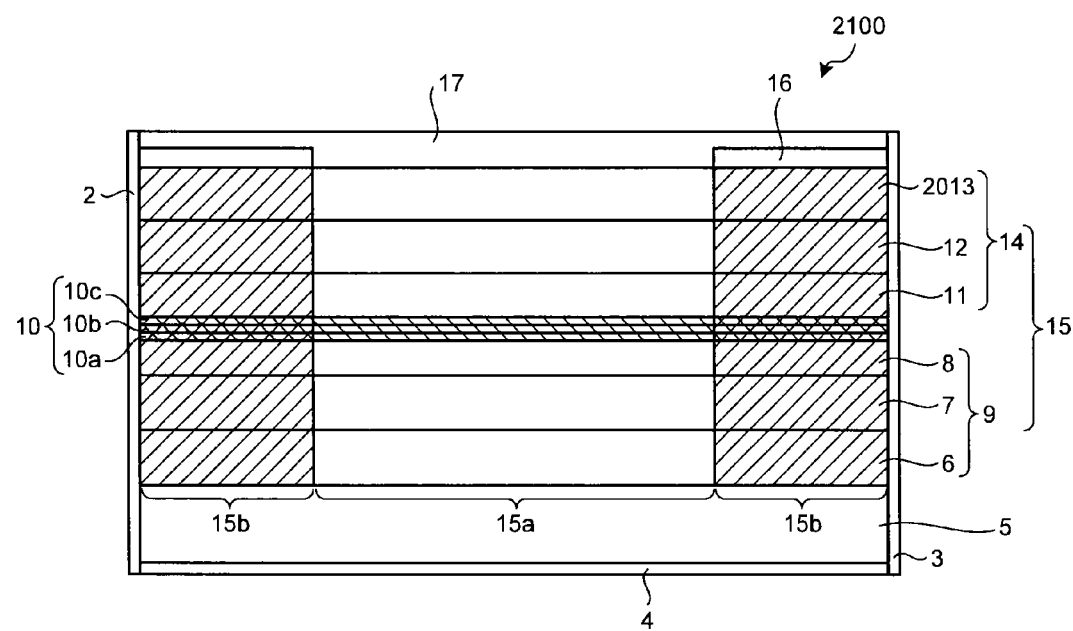
FIG. 58B is a cross-sectional view along the y-z plane in the semiconductor laser element according to the eighth embodiment.

FIG. 58A is a cross-sectional view along the x-y plane in the semiconductor laser element according to the eighth embodiment. FIG. 58B is a cross-sectional view along the y-z plane in the semiconductor laser element according to the eighth embodiment. As illustrated in FIG. 58A, this semiconductor laser element 2100 is provided with the substrate 5 the bottom surface of which is provided with the lower electrode 4 that is the n-side electrode made of n-type gallium arsenide (GaAs), and the semiconductor layer portion 15 including the n-type semiconductor layer section 9, the active layer 10, and the p-type semiconductor layer section 14. The n-type semiconductor layer section 9 includes the n-type buffer layer 6, the n-type cladding layer 7, and the n-type guide layer 8. The p-type semiconductor layer section 14 includes the p-type guide layer 11, the p-type cladding layer 12, and a p-type contact layer 2013. The n-type semiconductor layer section 9, the active layer 10, and the p-type semiconductor layer section 14 are sequentially formed on the substrate 5. The p-type contact layer 2013 has a trapezoidal cross section, and has stripes extending in the z-axial direction. This p-type contact layer 2013 provides the semiconductor laser element 2100 with a ridge structure. The semiconductor laser element 2100 also includes the insulating film 16 formed on the p-type semiconductor layer section 14, and the upper electrode 17 that is a p-side electrode that is brought into contact with the p-type contact layer 201 via a part of the upper base of the trapezoidal ridge structure, the part being not provided with the insulating film 16.

The p-type contact layer 2013 including a topmost layer region that is brought into contact with the upper electrode 17 in the semiconductor layer portion 15 contains C as a p-type second impurity having a function of promoting atomic vacancy diffusion. The p-type contact layer 2013 also contains zinc (Zn) as a p-type first impurity having a function of suppressing atomic vacancy diffusion.

The semiconductor layer portion 15 has the non-window region 15a, and the window region 15b in which the active layer 10 has larger band gap energy than that in the non-window region 15a.

It is preferable for disordered crystals to increase the band gap energy in the window region, and not to increase the band gap energy in the non-window region. Therefore, the window region and the non-window region are doped with impurities promoting and suppressing disordering respectively, at concentrations selected appropriately.

In the eighth embodiment, C functions as the promoting species, and Zn functions as the suppressing species, but which one of the impurities functions as the promoting species or the suppressing species is dependent on the types, the concentrations, and the combination of the impurities, and the conditions of the RTA such as the temperature and time.

The topmost layer region is a region that belongs to the topmost layer of the semiconductor layer portion 15, and that is brought into contact with the upper electrode 17 and via which a current is injected. The topmost layer region is also a region from the topmost surface of the semiconductor layer portion 15 to the depth affecting the contact resistance against the injection current. The topmost layer region is also a region epitaxially grown under approximately the same conditions and covering a depth of 0 nanometers to 200 nanometers from the topmost surface, for example. The impurities with which the semiconductor layer portion is doped may be changed while the topmost layer region is being deposited. In the eighth embodiment, the topmost layer region means the p-type contact layer 2013. The impurity contents are calculated as an integral of the impurity concentration at a depth from the surface with respect to the depth.

In the semiconductor laser element 2100 according to the eighth embodiment, the topmost layer region of the semiconductor layer portion 15, the topmost layer being brought into contact with the upper electrode 17, is provided as the p-type contact layer 2013 doped with C. When the topmost layer region of the semiconductor layer portion brought into contact with the upper electrode is provided as a p-type contact layer doped with Zn, Zn having a higher diffusion coefficient than C diffuses to the p-type semiconductor layer section from the p-type contact layer during the RTA for inducing disordering in the active layer, and the Zn concentration in the p-type contact layer is reduced thereby. When the p-type contact layer with less Zn is brought into contact with the upper electrode, the contact resistance is increased, because there is less Zn working as acceptors in the ohmic contact. When the contact resistance is increased, the power conversion efficiency with respect to the input power becomes reduced. Therefore, a reduced Zn content of the p-type contact layer directly contributes to the deterioration of the performance of the semiconductor laser element.

The semiconductor laser element 2100 according to the eighth embodiment has a structure in which the p-type contact layer 2013 containing C is brought into contact with the upper electrode 17. This is because C has a lower diffusion coefficient than Zn, and becomes diffused less by the heat. The upper electrode 17 is then brought into ohmic-contact with the p-type contact layer 2013 with its concentration of C functioning as acceptors almost not reduced. In the semiconductor laser element 2100 according to the eighth embodiment, this structure suppresses an increase of the contact resistance by the RTA. The topmost layer region of the semiconductor laser element 2100 according to the eighth embodiment also contains Zn diffused in the RTA in the manufacture process. With this structure, the contact resistance is further reduced.

As described above, in the semiconductor laser element 2100 according to the eighth embodiment, an increase of the contact resistance resulting from the RTA is suppressed by bringing the upper electrode 17 into contact with the p-type contact layer 2013 containing C with a lower diffusion coefficient. Furthermore, the contact resistance is reduced by Zn diffused during the RTA process. Because the risk of COD is reduced, the reliability is improved, and the contact resistance is kept low by disordered crystals in the active layer in the window region obtained by the RTA, a semiconductor laser element high power conversion efficiency can be provided.

Figure 59:
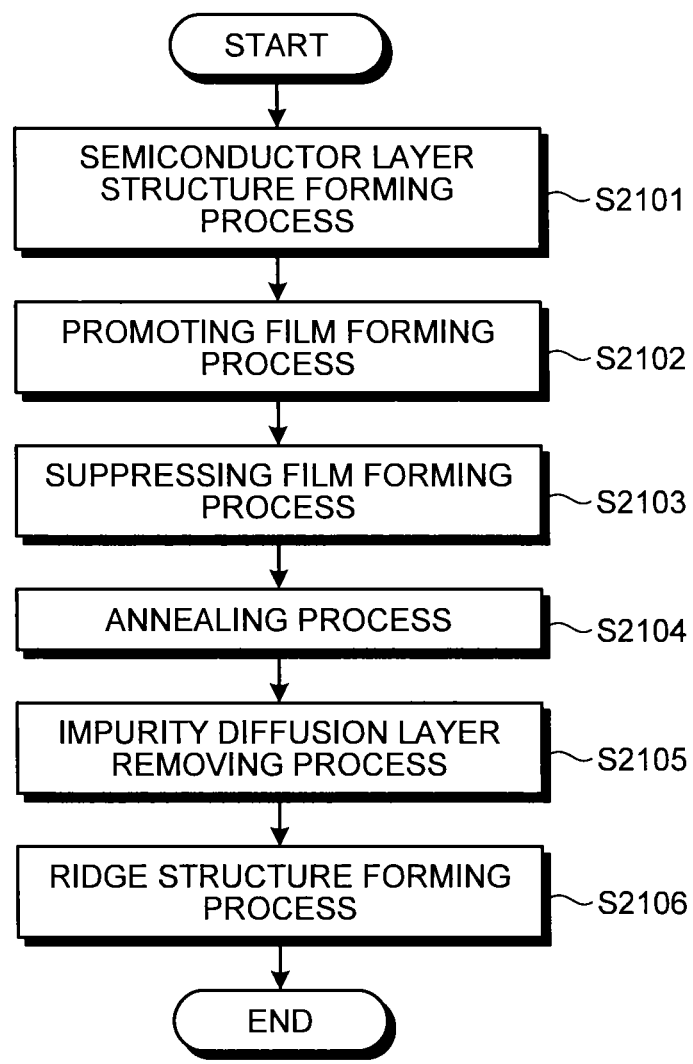
FIG. 59 is a flowchart of a method for manufacturing a semiconductor laser element.

An exemplary method for manufacturing the semiconductor laser element 2100 will now be explained. FIG. 59 is a flowchart of the method for manufacturing the semiconductor laser element. As illustrated in FIG. 59, the method for manufacturing the semiconductor laser element 2100 according to the eighth embodiment includes a semiconductor layer structure forming process (Step S2101), a promoting film forming process (Step S2102), an suppressing film forming process (Step S2103), an annealing process (Step S2104), an impurity diffusion layer removing process (Step S2105), and a ridge structure forming process (Step S2106).

Each of these processes will now be explained. The values specified in these processes are merely exemplary, and the embodiment is not limited thereto.

Semiconductor Layer Structure Forming Process

Figure 60:
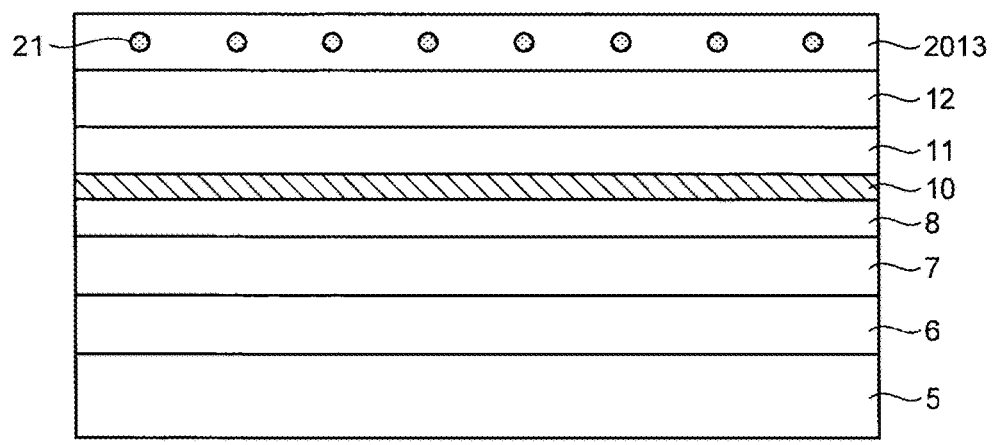
FIG. 60 is a schematic for explaining an exemplary method for manufacturing a semiconductor laser element according to the eighth embodiment.
Figure 61:
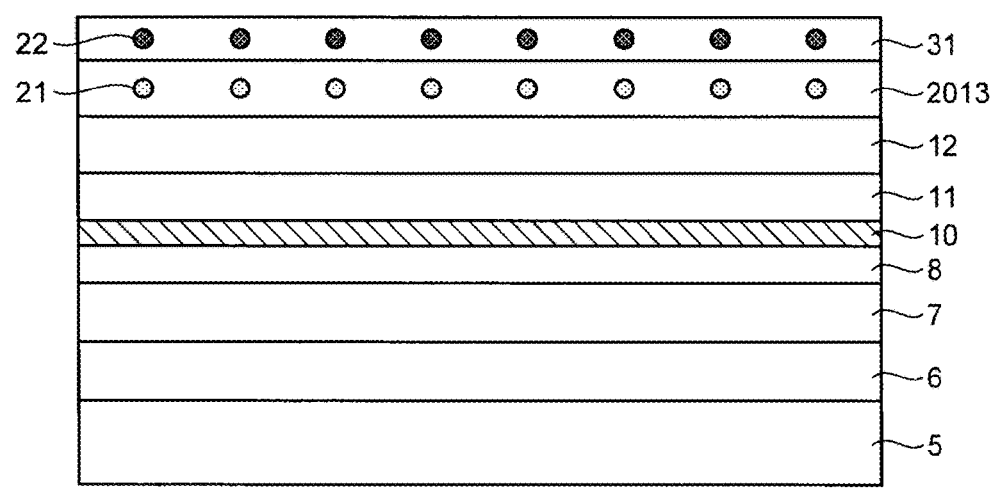
FIG. 61 is a schematic for explaining the exemplary method for manufacturing a semiconductor laser element according to the eighth embodiment.

To begin with, at Step S2101, in the semiconductor layer structure forming process, the n-type buffer layer 6, the n-type cladding layer 7, the n-type guide layer 8, the active layer 10, the p-type guide layer 11, the p-type cladding layer 12, and the p-type contact layer 2013 are epitaxially grown on the substrate 5 through MOCVD, as illustrated in FIG. 60. The p-type contact layer 2013 is doped with C (C 21) that is a promoting species having a function of promoting disordering and is a second impurity of a first conductivity type, in a concentration of $1.0 \times 10^{17}$ cm$^{-3}$ to $5.0 \times 10^{19}$ cm$^{-3}$ to $5 \times 10^{20}$ cm$^{-3}$, or so, for example. The p-type contact layer 2013 is preferably doped with C in a concentration of $1.0 \times 10^{19}$ cm$^{-3}$ or higher. An impurity diffusion layer 31 is then formed on the semiconductor layer portion 15, as illustrated in FIG. 61, and the semiconductor layer structure is achieved. The impurity diffusion layer 31 is made of GaAs, and is doped with Zn (Zn 22) that is the suppressing species having a function of suppressing disordering in the active layer 10 and is a first impurity of the first conductivity type, in a concentration of $1.0 \times 10^{17}$ cm$^{-3}$ to $5.0 \times 10^{19}$ cm$^{-3}$ to $5 \times 10^{20}$ cm$^{-3}$ or so, for example.

Promoting Film Forming Process

Figure 62:
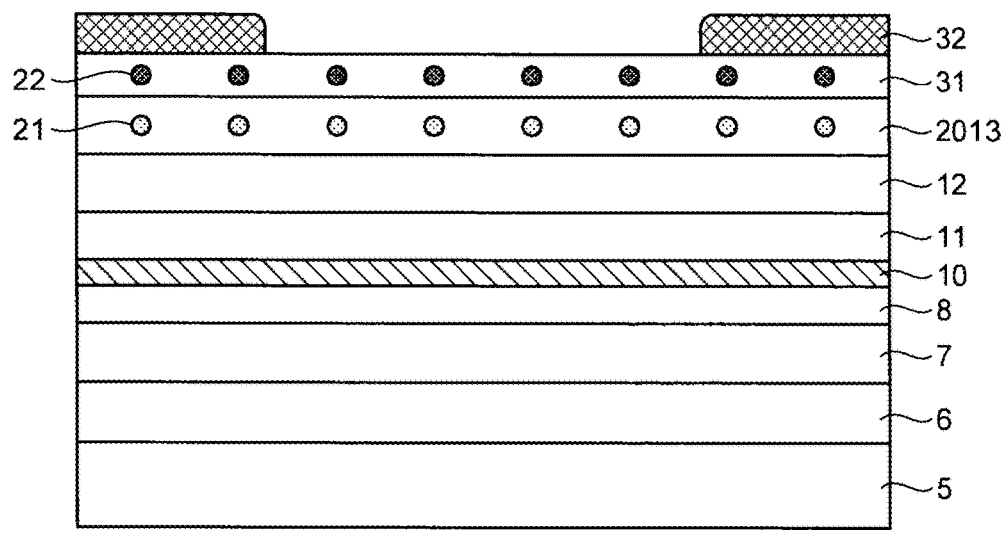
FIG. 62 is a schematic for explaining the exemplary method for manufacturing a semiconductor laser element according to the eighth embodiment.

The promoting film forming process at Step S2102 will now be explained. In this process, the promoting film 32 is deposited in order to produce the window region 15b by disordering through atomic vacancy diffusion. This method is also referred to as IFVD. To begin with, the promoting film 32 that is a SiN insulating layer is deposited on the top surface of the semiconductor layer portion 15. The photolithography process and the etching process are then performed to remove the promoting film 32 from the region in which the non-window region 15a is to be formed, as illustrated in FIG. 62. Through this process, the promoting film 32 is formed on the top surface of the region to be the window region 15b.

Suppressing Film Forming Process

Figure 63:
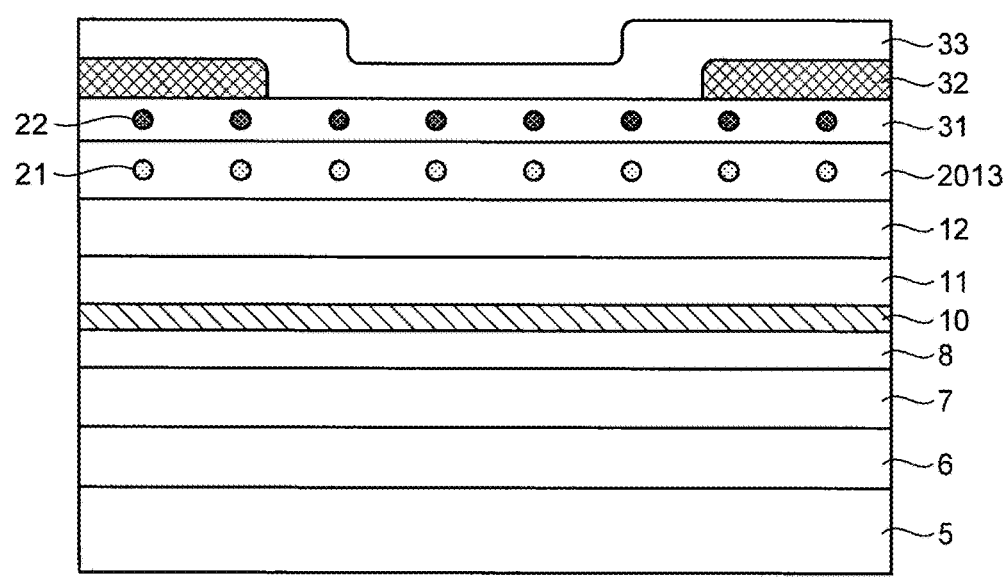
FIG. 63 is a schematic for explaining the exemplary method for manufacturing a semiconductor laser element according to the eighth embodiment.

The suppressing film forming process at Step S2103 will now be explained. In this process, the suppressing film 33 that is a SiN insulating layer is deposited, as illustrated in FIG. 63.

Annealing Process

Figure 64:
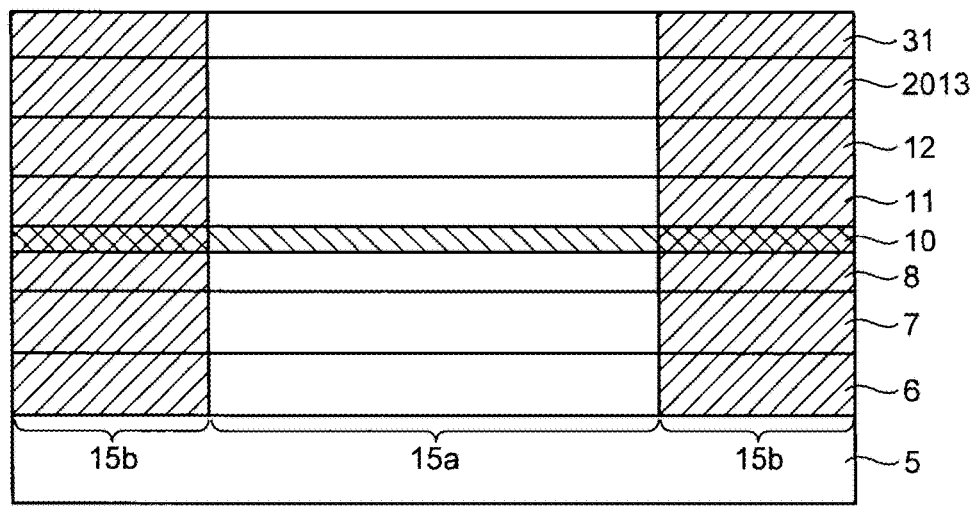
FIG. 64 is a schematic for explaining the exemplary method for manufacturing a semiconductor laser element according to the eighth embodiment.

The annealing process at Step S2104 will now be explained. In this process, the semiconductor layer structure is annealed over a short time period with the RTA. As the semiconductor layer structure is annealed, in the region provided with the promoting film 32 in contact with the p-type contact layer 2013, the promoting film 32 promotes disordering in the active layer 10, and the window region 15b is formed thereby, as illustrated in FIG. 64. In the region provided with the suppressing film 33 in contact with the p-type contact layer 13, the suppressing film 33 suppresses disordering in the active layer 10, and the non-window region 15a is formed thereby, as illustrated in FIG. 64.

In the eighth embodiment in which C 21 and Zn 22 are both used as dopants, C 21 serves as the second impurity having a function of promoting disordering in the active layer 10, and Zn 22 serves as the first impurity having a function of suppressing disordering in the active layer 10. By allowing C 21 and Zn 22 to function as the promoting species and the suppressing species, respectively, the band gap energy difference between the non-window region 15a and the window region 15b can be increased, so that the risk of COD can be reduced.

The RTA causes Zn 22 with a higher diffusion coefficient to become diffused across the p-type semiconductor layer section 14, greatly reducing the Zn 22 concentration in the impurity diffusion layer 31 thereby. By contrast, because C 21 has a lower diffusion coefficient, the C 21 concentration in the p-type contact layer 2013 remains almost not reduced.

Impurity Diffusion Layer Removing Process

Figure 65:
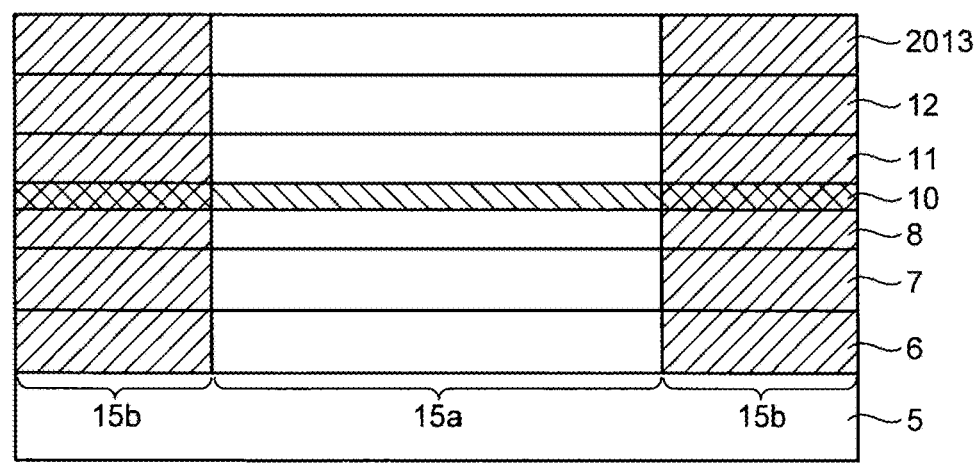
FIG. 65 is a schematic for explaining the exemplary method for manufacturing a semiconductor laser element according to the eighth embodiment.

The impurity diffusion layer removing process at Step S2105 will now be explained. In this process, as illustrated in FIG. 65, the impurity diffusion layer 31 is removed by etching.

Figure 66A:
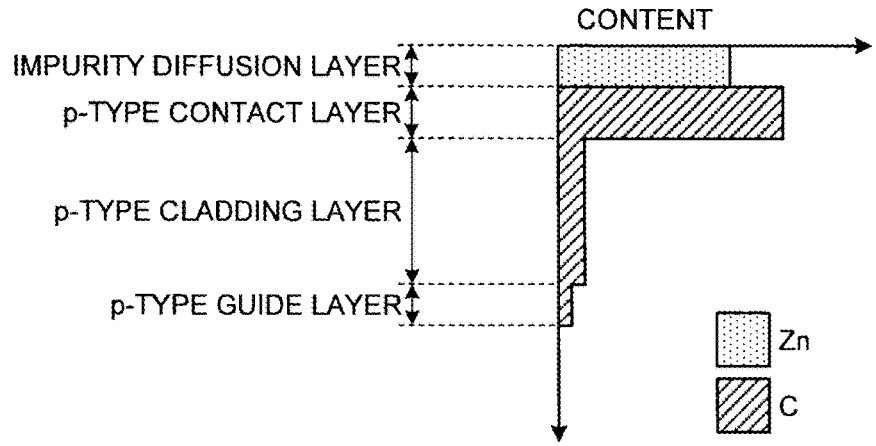
FIG. 66A is a schematic for explaining how the C content and the Zn content change before and after an RTA.
Figure 66B:
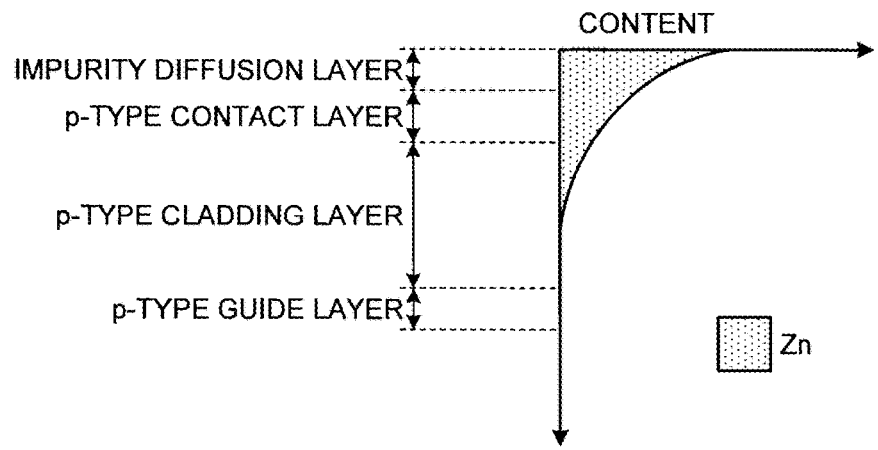
FIG. 66B is a schematic for explaining how the C content and the Zn content change before and after the RTA.
Figure 66C:
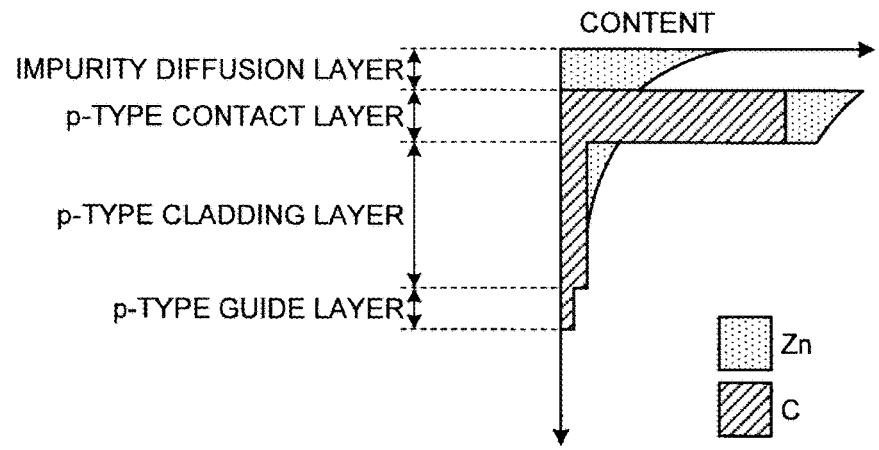
FIG. 66C is a schematic for explaining how the C content and the Zn content change before and after the RTA.

Explained now is how the RTA changes the C 21 content and the Zn 22 content of the layers in the p-type semiconductor layer section 14. FIGS. 66A, 66B, and 66C are schematics for explaining how the RTA changes the C content and the Zn content. The horizontal axes in FIGS. 66A, 66B, and 66C represent the C 21 content and the Zn 22 content of the layers. Before the layers are annealed with the RTA, the layers have C 21 and Zn 22 concentration distribution illustrated in FIG. 66A. Once the layers are annealed with the RTA, a large amount of Zn 22 that is an impurity with a higher diffusion coefficient becomes diffused, and results in a concentration distribution in which Zn 22 is distributed at a lower concentration toward the internal from the topmost surface, as illustrated in FIG. 66B. While Zn 22 has a diffusion coefficient of $10^{-8}$ cm$^2$/s or so at a temperature of 900 degrees Celsius, for example, C 21 has a diffusion coefficient of $10^{-15}$ cm$^2$/s or so, being much smaller than that of Zn 22, making the diffusion coefficient of C 21 ignorable. The gross C 21 and Zn 22 content after the diffusion of the impurities during the RTA can therefore be represented as illustrated in FIG. 66C.

After the RTA, the Zn 22 concentration in the topmost layer region of the impurity diffusion layer 31 becomes reduced, as illustrated in FIG. 66C, so that high contact resistance would be incurred if the upper electrode 17 is directly brought into contact with the topmost layer region. Therefore, in the semiconductor laser element according to the eighth embodiment, the impurity diffusion layer 31 is removed, and the upper electrode 17 is brought into contact with the p-type contact layer 2013. At this time, the gross Zn 22 and C 21 content, Zn being the impurity with a higher diffusion coefficient and C 21 being the impurity with a lower diffusion coefficient, is set higher than the amount of doped C 21 that is the impurity with a lower diffusion coefficient. This configuration allows the atoms functioning as the acceptors in an ohmic contact to be larger in number than those in the topmost layer region of the impurity diffusion layer 31 after the RTA, and to be larger in amount than the amount of C 21 with which the p-type contact layer 2013 is doped. In this manner, a lower contact resistance can be achieved than when provided is only the p-type contact layer 2013 containing C 21, without the impurity diffusion layer 31 for allowing Zn 22 to be diffused.

For example, let us assume that the Zn concentration of the impurity diffusion layer 31 is designed as $1.0 \times 10^{19}$ cm$^{-3}$, and the C concentration of the p-type contact layer 2013 positioned below the impurity diffusion layer 31 is designed as $2.0 \times 10^{19}$ cm$^{-3}$. It is experimentally known that Zn diffused during the RTA is found in a region at a depth of 100 nanometers to 200 nanometers from the top surface of the p-type contact layer 2013 after the impurity diffusion layer 31 is removed by etching, in a concentration of ten percent or so of that the designed Zn concentration of the impurity diffusion layer 31. The gross C and Zn concentration of the p-type contact layer 2013 therefore becomes $2.1 \times 10^{19}$ cm$^{-3}$ or so.

Ridge Structure Forming Process

The ridge structure forming process at Step S2106 can be performed following the same sequence as that in the first embodiment. The insulating film 16 is then deposited, and the opening 16a is formed. The upper electrode 17 and the lower electrode 4 are then deposited, the substrate 5 is cleaved, and the low reflection film 2 and the high reflection film 3 are applied to the respective cleavage facets. The semiconductor layer structure is then diced into elements, achieving the semiconductor laser element 2100 thereby.

As described above, in the semiconductor laser element 2100 according to the eighth embodiment, by bringing the upper electrode 17 into contact with the p-type contact layer 13 doped with C 21 the diffusion coefficient of which is lower and the concentration of which is almost not reduced by the RTA, the contact resistance is less increased by the RTA. Furthermore, in the semiconductor laser element 2100 according to the eighth embodiment, Zn 22 having diffused in the RTA becomes contained in the topmost layer region, and contributes to reduce the contact resistance. With this structure, the semiconductor laser element 2100 that is more reliable and with high power conversion efficiency can be provided.

Example 6

A current-voltage characteristic and a current-optical power characteristic of the semiconductor laser element 2100 were measured as an example of the eighth embodiment.

In this Example 6, the semiconductor laser element 2100 according to the eighth embodiment was soldered onto a heat sink, and the heat sink on which the semiconductor laser element 2100 was placed was soldered onto a submount made of CuW. The solder may be tin-lead (Sn—Pb) solder, or gold-tin (Au—Sn) solder. A current was then injected into the semiconductor laser element 2100 via the lower electrode 4 and the upper electrode 17. The injected current was measured with an amperemeter, and an applied voltage was measured with a voltmeter. The optical power was detected using a photodiode. The optical power may be detected with a charge-coupled element (CCD), for example.

As Comparative Example 6, the same measurements were collected from a semiconductor laser element having an upper electrode brought into contact with the impurity diffusion layer 31, by performing the ridge structure forming process immediately after the annealing process, without performing the impurity diffusion layer removing process in which the impurity diffusion layer 31 doped with Zn is removed, in the method for manufacturing the semiconductor laser element 2100 according to the eighth embodiment. The semiconductor laser element according Comparative Example 6 is the same as the semiconductor laser element 2100 according to Example 1 including the thicknesses of the layers, the concentration of the dopant impurities, and the RTA conditions, except that the impurity diffusion layer 31 was not removed.

Figure 67:
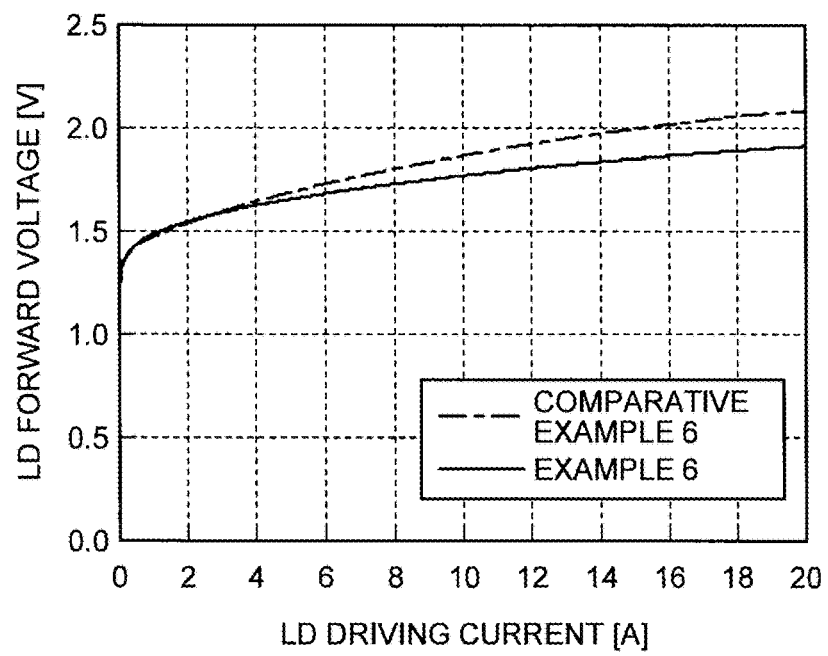
FIG. 67 is a schematic illustrating current-voltage characteristics of a semiconductor laser element according to Example 6 and a semiconductor laser element according to Comparative Example 6.

FIG. 67 is a schematic illustrating current-voltage characteristics of the semiconductor laser element according to Example 6 and the semiconductor laser element according to Comparative Example 6. The relation between a voltage E [volts], a resistance R [ohms], and a current I [amperes] is expressed as follows, based on Ohm's law:

$$E = R \times I \quad (1)$$

As indicated by FIG. 67 representing the resistance R as a gradient, the semiconductor laser element 2100 according to Example 6 has a smaller resistance R than the semiconductor laser element according to Comparative Example 6.

Figure 68:
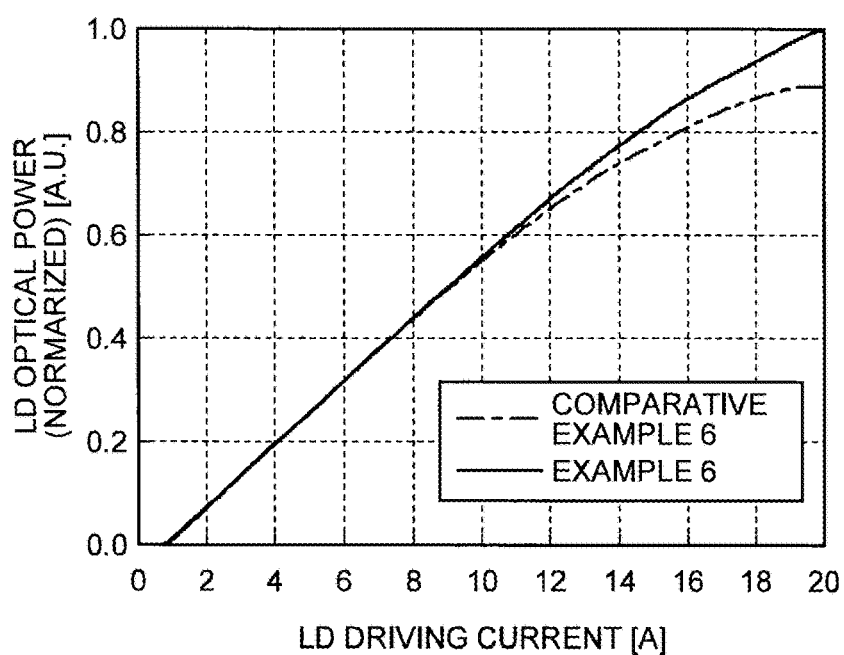
FIG. 68 is a schematic illustrating current-optical power characteristics of the semiconductor laser element according to Example 6 and the semiconductor laser element according to Comparative Example 6.

FIG. 68 is a schematic illustrating current-optical power characteristics of the semiconductor laser element according to Example 6 and the semiconductor laser element according to Comparative Example 6. As indicated by FIG. 68, when a current is higher, the optical power output from the semiconductor laser element 2100 according to Example 1 is higher than that from the semiconductor laser element according to Comparative Example 6.

The input power $P_E$ [watts] input for the semiconductor laser element can be calculated by the following equation:

$$P_E = E \times I \quad (2)$$

A power conversion efficiency $E_f$ [percent] representing an optical power with respect to a power input to the semiconductor laser element can be calculated by the following equation, denoting the normalized optical power by $P_O$. The optical power is normalized by representing the optical power detected by the photodiode as 1 when a current of 20 [amperes] is injected as an LD driving current.

$$E_f = (P_O/P_E) \times 100 \text{ percent} \quad (3)$$

In this manner, the power conversion efficiency $E_f$ can be calculated. For example, when the LD driving current is 16 [amperes], the power conversion efficiency $E_f$ in Example 6 can be calculated as 2.90 [%/W]. Similarly, when the LD driving current is 16 [amperes], the power conversion efficiency $E_f$ of Comparative Example 6 can be calculated as 2.54 [%/W]. Example 6 has a power conversion efficiency $E_f$ improved by 14 [percent], compared with Comparative Example 6. Similarly, when the LD driving current is 20 [amperes], the power conversion efficiency $E_f$ of Example 6 can be calculated as 2.61 [%/W], and the power conversion efficiency $E_f$ of Comparative Example 6 can be calculated as 2.13 [%/W], representing an improvement of 23 [percent] or so.

Based on the above, the semiconductor laser element 2100 according to Example 6, in which an increase of the contact resistance is suppressed by bringing the upper electrode 17 into contact with the p-type contact layer 2013 doped with C, has been proven to be a semiconductor laser element with higher power conversion efficiency.

Ninth Embodiment

Figure 69:
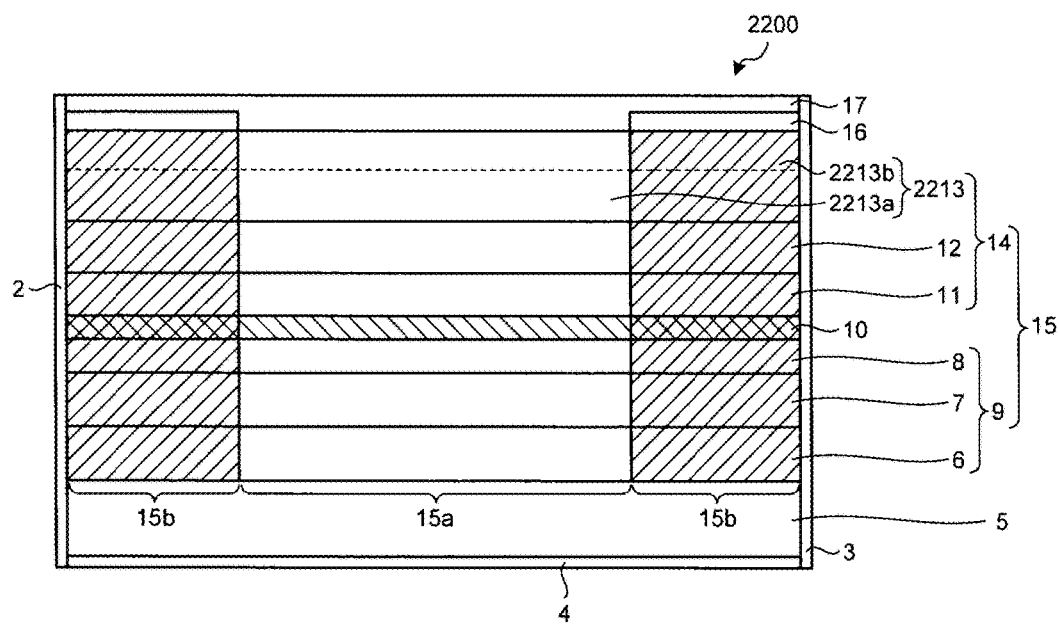
FIG. 69 is a cross-sectional view along the y-z plane in a semiconductor laser element according to an ninth embodiment of the present invention.

A semiconductor laser element according to a ninth embodiment of the present invention will now be explained. FIG. 69 is a cross-sectional view along the y-z plane in the semiconductor laser element according to the ninth embodiment. In the semiconductor laser element 2200 according to the ninth embodiment, a p-type contact layer 2213 has two layers including a p-type contact layer 2213a and a p-type contact layer 2213b, unlike the p-type contact layer in the semiconductor laser element 2100 according to the eighth embodiment. The p-type contact layer 2213 also has a structure in which the p-type contact layer 2213a is doped with Zn, and the p-type contact layer 2213b is doped with C.

In the semiconductor laser element 2200 according to the ninth embodiment, the p-type contact layer 2213b doped with C with a lower diffusion coefficient is provided as the topmost layer region of the semiconductor layer portion 15. The upper electrode 17 can therefore be brought into contact with the p-type contact layer 2213b doped with C with a lower diffusion coefficient, without performing the impurity diffusion layer removing process in which the impurity diffusion layer 31 doped with Zn is removed after the annealing process, as in the eighth embodiment. With this structure, the contact resistance is increased less by the RTA.

Figure 70:
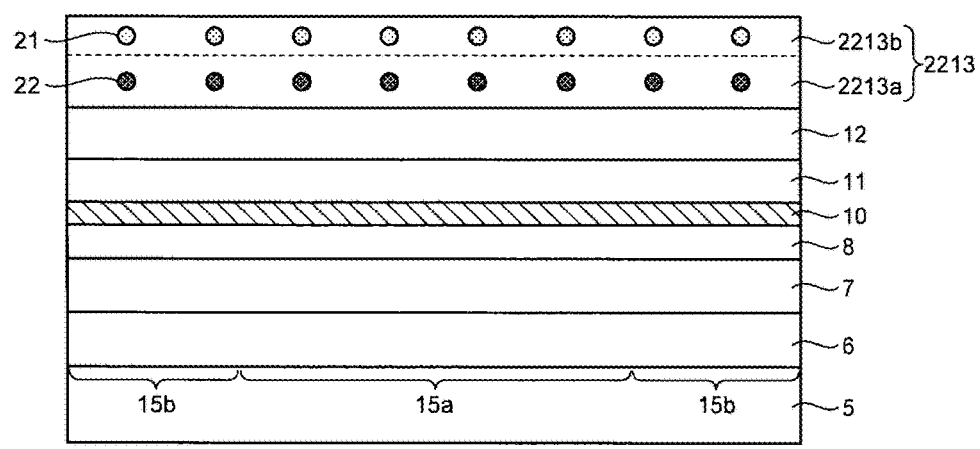
FIG. 70 is a schematic for explaining an exemplary method for manufacturing a semiconductor laser element according to the ninth embodiment.

FIG. 70 is a schematic for explaining an exemplary method for manufacturing a semiconductor laser element according to the ninth embodiment. As illustrated in FIG. 70, for the semiconductor layer structure according to the ninth embodiment, during the semiconductor layer structure forming process in the exemplary method for manufacturing the semiconductor laser element 2100 according to the eighth embodiment, the p-type contact layer is formed as two layers, and the p-type contact layer 2213a that is the lower layer is doped with Zn 22, and the p-type contact layer 2213b that is the upper layer is doped with C 21, without depositing the impurity diffusion layer 31. The promoting film is then deposited following the same promoting film forming process as that in the eighth embodiment, and the suppressing film is deposited in the suppressing film forming process. The semiconductor layer structure is then annealed to induce disordering and form the non-window region 15a and the window region 15b. The ridge structure forming process is then performed, without performing the impurity diffusion layer removing process, and the final semiconductor laser element 2200 is achieved thereby.

Example 7

As Example 7, a semiconductor laser element having the structure of the semiconductor laser element 2200 according to the ninth embodiment was manufactured, and currents, voltages, and optical powers were measured in the same manner as in Example 6. The power conversion efficiency was then compared with that of the semiconductor laser element according to Comparative Example 6. This semiconductor laser element according to Example 7 exhibited higher power conversion efficiency than the semiconductor laser element according to Comparative Example 6.

Tenth Embodiment

Figure 71:
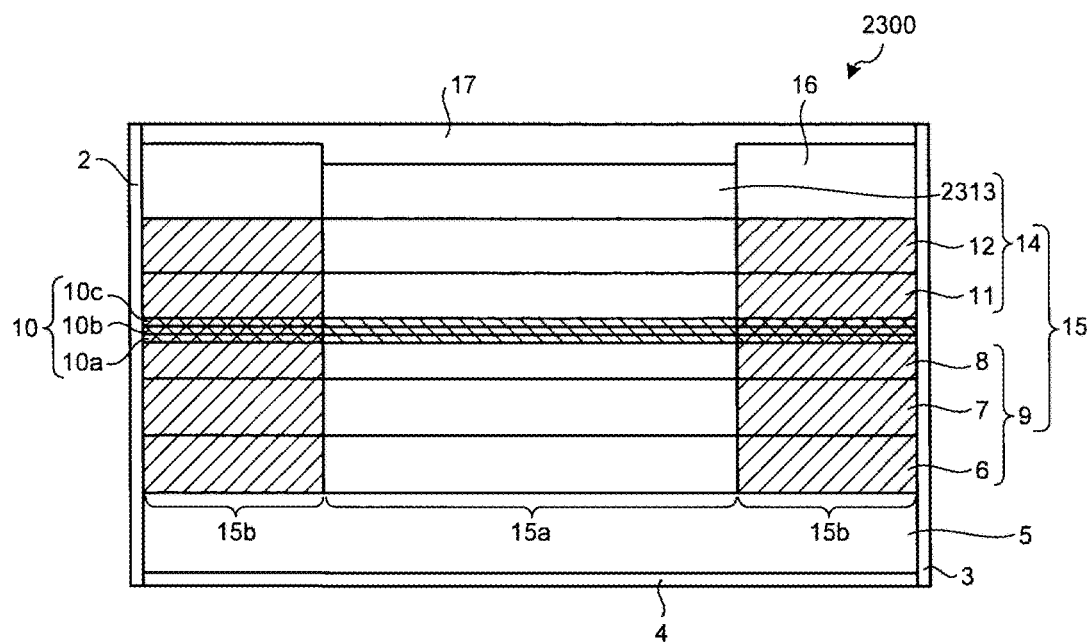
FIG. 71 is a cross-sectional view along the y-z plane in a semiconductor laser element according to a tenth embodiment of the present invention.

A semiconductor laser element according to a tenth embodiment of the present invention will now be explained. FIG. 71 is a cross-sectional view along the y-z plane in the semiconductor laser element according to the tenth embodiment. The semiconductor laser element 2300 according to the tenth embodiment has a structure of the semiconductor laser element 2100 according to the eighth embodiment except that the p-type contact layer (p-type contact layer 313) is removed from the window region 15b.

Figure 72:
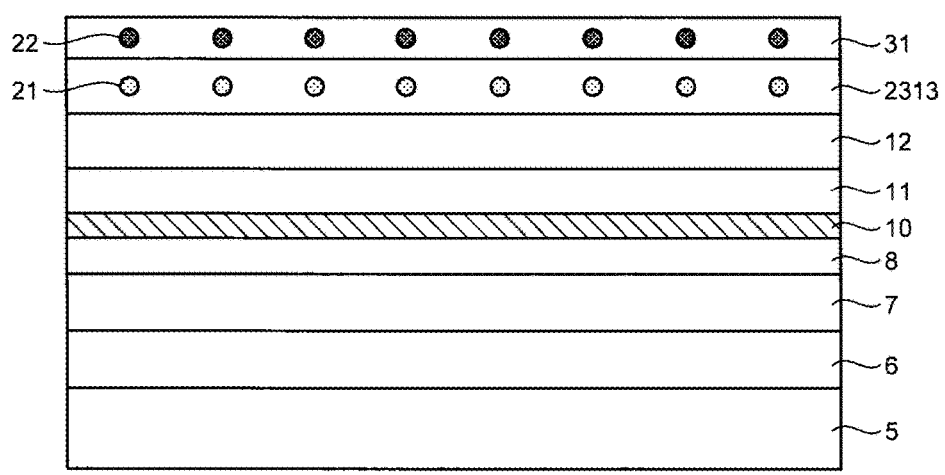
FIG. 72 is a schematic for explaining an exemplary method for manufacturing a semiconductor laser element according to the tenth embodiment.
Figure 73:
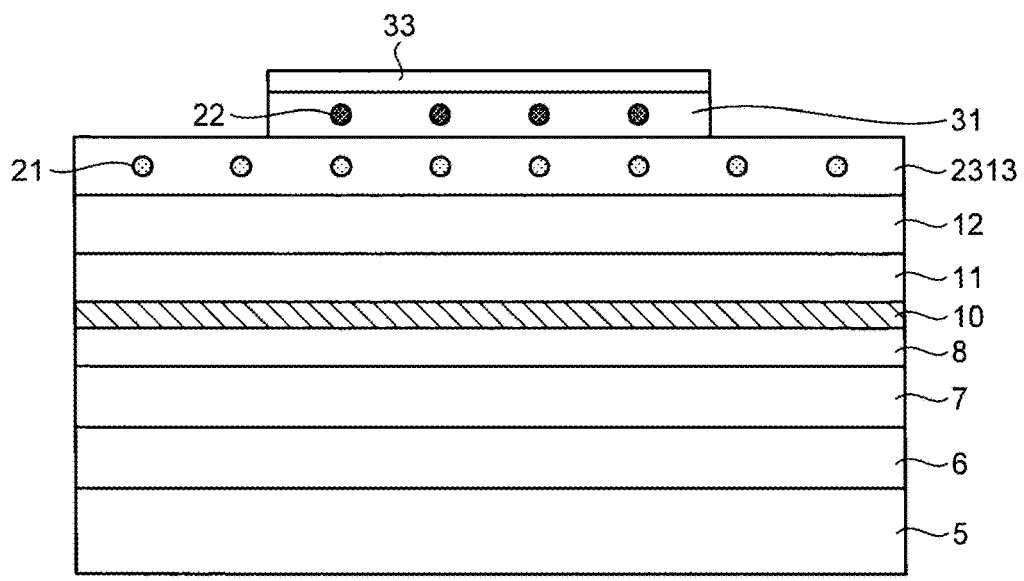
FIG. 73 is a schematic for explaining the exemplary method for manufacturing a semiconductor laser element according to the tenth embodiment.
Figure 74:
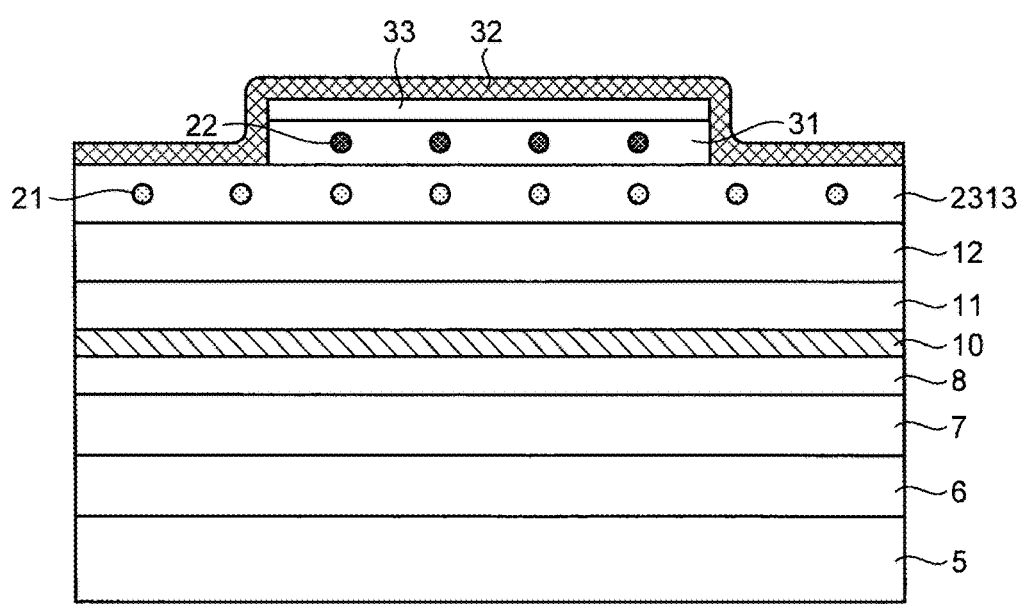
FIG. 74 is a schematic for explaining the exemplary method for manufacturing a semiconductor laser element according to the tenth embodiment.
Figure 75:
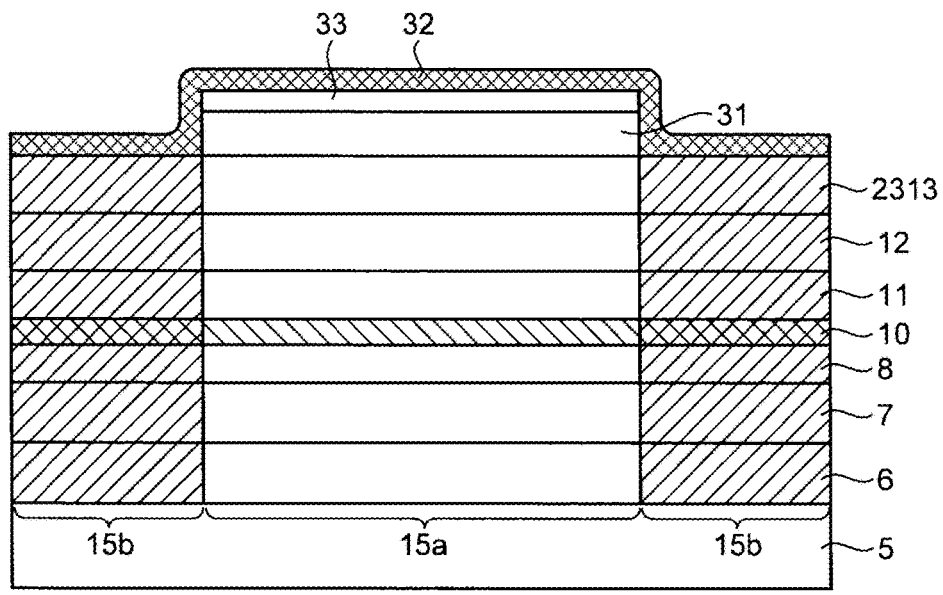
FIG. 75 is a schematic for explaining the exemplary method for manufacturing a semiconductor laser element according to the tenth embodiment.
Figure 76:
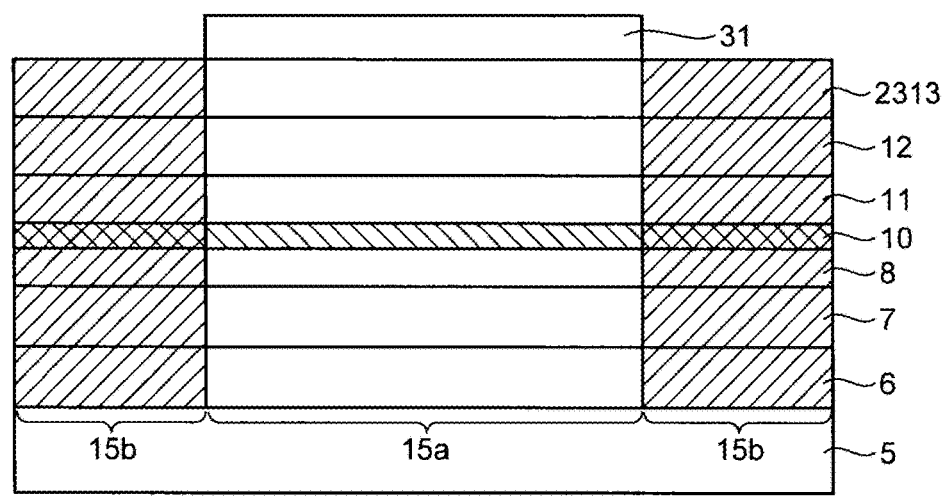
FIG. 76 is a schematic for explaining the exemplary method for manufacturing a semiconductor laser element according to the tenth embodiment.
Figure 77:
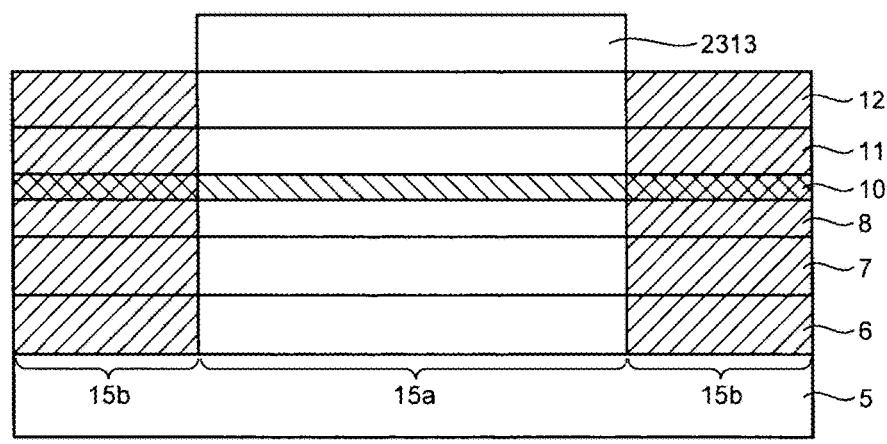
FIG. 77 is a schematic for explaining the exemplary method for manufacturing a semiconductor laser element according to the tenth embodiment.

FIGS. 72 to 77 are schematics for explaining the exemplary method for manufacturing a semiconductor laser element according to the tenth embodiment. To begin with, in the same manner as in the semiconductor layer structure forming process according to the eighth embodiment, the layers up to the p-type cladding layer 12 are deposited on the substrate 5, and a p-type contact layer 2313 doped with C 21 is then provided. The impurity diffusion layer 31 doped with Zn 22 is then formed, as illustrated in FIG. 72. The suppressing film 33 is then deposited on the region corresponding to the non-window region 15a, unlike the method for manufacturing the semiconductor laser element 100 according to the first embodiment. The impurity diffusion layer 31 is then removed by etching, from the region corresponding to the window region 15b, using the suppressing film 33 as a mask, as illustrated in FIG. 73. As a result of this process, a larger amount of Zn 22 that is the first impurity is contained in the non-window region 15a than that in the window region 15b. The promoting film 32 is then deposited as illustrated in FIG. 74. Produced then with the RTA are the window region 15b in which disordering in the active layer 10 took place, and the non-window region 15a in which disordering in the active layer 10 was suppressed, as illustrated in FIG. 75. The promoting film 32 and the suppressing film 33 are then removed, as illustrated in FIG. 76. The p-type contact layer 313 in the window region 15b and the impurity diffusion layer 31 in the non-window region 15a are removed by etching, as illustrated in FIG. 77. The ridge structure forming process and the like are then performed, in the same manner as in the eighth embodiment, and the final semiconductor laser element 2300 is achieved thereby.

In the semiconductor laser element 2300 according to the tenth embodiment, by removing the impurity diffusion layer 31 from the region corresponding to the window region 15b before the RTA, the p-type semiconductor layer section 14 in the non-window region 15a is allowed to contain more Zn 22 that is the first impurity than that in the p-type semiconductor layer section 14 in the window region 15b. Furthermore, when Zn is used as a dopant together with C, Zn functions as the suppressing species that suppress disordering. With this structure, disordering is suppressed in the non-window region 15a in which the Zn content of the p-type semiconductor layer section 14 is high, and disordering is not suppressed in the window region 15b in which the Zn content of the p-type semiconductor layer section 14 is low. Therefore, the band gap energy difference between the non-window region 15a and the window region 15b is increased, a smaller amount of laser light is absorbed at the facet of the semiconductor element, and the risk of COD is reduced.

In the semiconductor laser element 2300 according to the tenth embodiment, the p-type contact layer 2313 in the window region 15b and the impurity diffusion layer 31 in the non-window region 15a are removed after the RTA. With this structure, the impurity diffusion layer 31 doped with Zn with a higher diffusion coefficient is removed, and the p-type contact layer 2313 doped with C with a lower diffusion coefficient is brought into contact with the upper electrode 17. As a result, the contact resistance is increased less by the RTA. This structure is more preferable in that disordering can be suppressed in the non-window region 15a and the contact resistance can be reduced at the same time, because the first impurity that is the suppressing species has a larger diffusion coefficient than the second impurity. The surface of the window region 15b may be the p-type contact layer 2313a, but is preferably the p-type cladding layer 12 made of AlGaAs with a high resistance so that the effect of current injection into the non-window region 15a can be further improved. Furthermore, it is preferable to set the gross impurity content of the topmost layer region in the non-window region higher than the amount of impurity with which the topmost layer region in the window region is doped so that the effect of current injection can be further improved.

To summarize the relation between the impurity concentrations of the topmost layer regions in the non-window region 15a and in the window region 15b, while the topmost layer region in the non-window region 15a has a lower impurity concentration than that in the topmost layer region in the window region 15b before the RTA, the topmost layer region in the non-window region 15a has a higher impurity concentration than the topmost layer region in the window region 15b after the RTA, because the p-type contact layer 2313 and the impurity diffusion layer 31 are removed from the window region 15b and the non-window region 15a, respectively.

Example 8

As Example 8, a semiconductor laser element having the structure of the semiconductor laser element 2300 according to the tenth embodiment was manufactured, and currents, voltages, and optical powers were measured in the same manner as in Example 6. The power conversion efficiency was then compared with that of the semiconductor laser element according to the comparative example, and this semiconductor laser element according to Example 8 exhibited higher power conversion efficiency than the semiconductor laser element according to the comparative example.

Eleventh Embodiment

Figure 78:
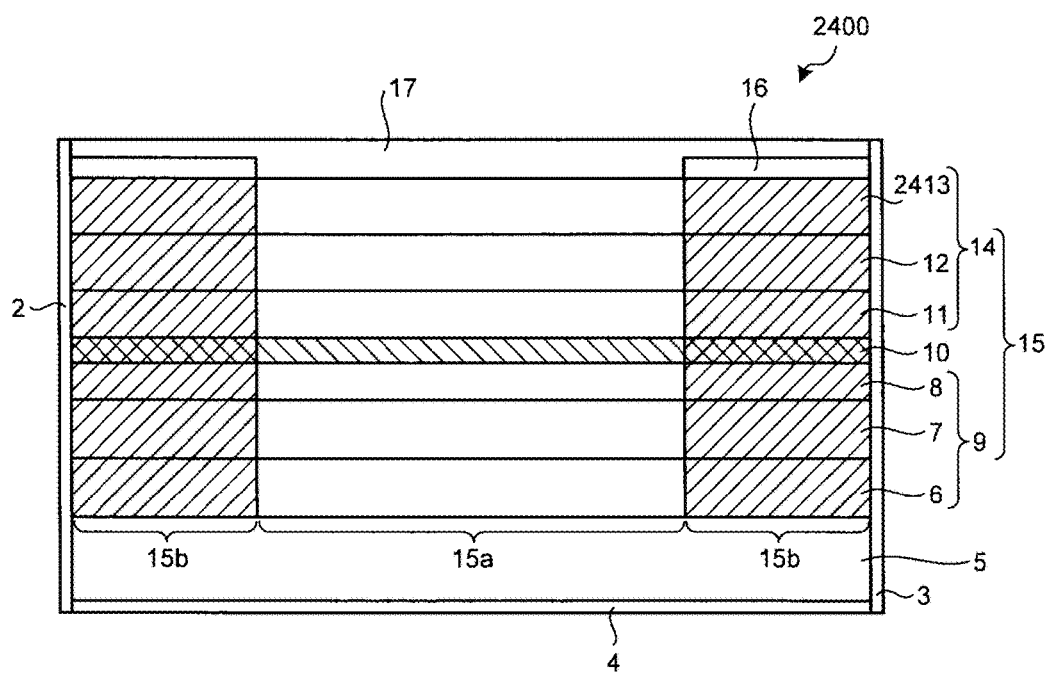
FIG. 78 is a cross-sectional view along the y-z plane in a semiconductor laser element according to a eleventh embodiment of the present invention.

A semiconductor laser element according to an eleventh embodiment of the present invention will now be explained. FIG. 78 is a cross-sectional view along the y-z plane in the semiconductor laser element according to the eleventh embodiment. In the semiconductor laser element 2400 according to the eleventh embodiment, a p-type contact layer 2413 has only one layer in the deposition direction, and the p-type contact layer 2413 is doped with both C and Zn.

Figure 79:
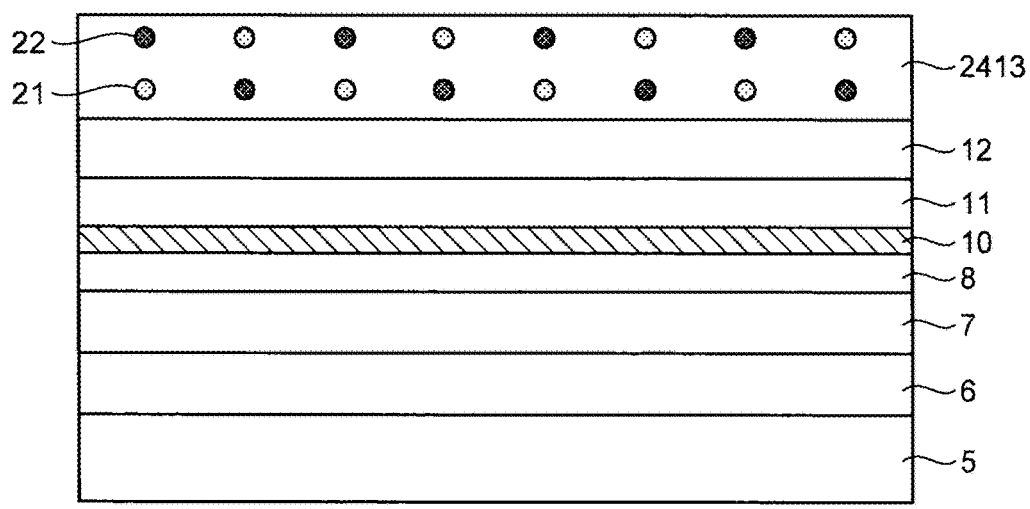
FIG. 79 is a schematic for explaining an exemplary method for manufacturing a semiconductor laser element according to the eleventh embodiment.

FIG. 79 is a schematic for explaining an exemplary method for manufacturing a semiconductor laser element according to the eleventh embodiment. As illustrated in FIG. 79, in the semiconductor laser element 2400 according to the eleventh embodiment, in the semiconductor layer structure forming process, the p-type contact layer 2413 is doped with both C 21 and Zn 22. The impurity diffusion layer 31 is not provided. The processes from the promoting film forming process to the ridge structure forming process (except for the impurity diffusion layer removing process) are then performed in the same manner as in the eighth embodiment, and the final semiconductor laser element 2400 is achieved thereby.

In the semiconductor laser element 2400 according to the eleventh embodiment, the Zn concentration, Zn having a higher diffusion coefficient, is significantly reduced in the p-type contact layer 2413 by the RTA, but the C concentration, C having a lower diffusion coefficient, does not change so much. Therefore, the semiconductor laser element 2400 has a structure in which contact resistance increases less easily than a structure in which the upper electrode is brought into contact with a p-type contact layer doped only with Zn.

Example 9

As Example 9, a semiconductor laser element having the structure of the semiconductor laser element 2400 according to the eleventh embodiment was manufactured, and currents, voltages, and optical powers were measured in the same manner as in Example 6. The power conversion efficiency was then compared with that of the semiconductor laser element according to the comparative example, and this semiconductor laser element according to Example 6 exhibited higher power conversion efficiency than the semiconductor laser element according to the comparative example.

As this result indicates, the semiconductor laser element according to this example is capable of suppressing an increase in the contact resistance resulting from the RTA, so that a semiconductor laser element with high luminous efficacy can be provided.

While the p-type contact layer is explained to be included in the topmost layer region of the semiconductor layer portion in the embodiments described above, the topmost layer region of the semiconductor layer portion is a region with which the upper electrode is brought into contact and that affects the contact resistance, and therefore, the topmost layer region may include the p-type cladding layer and some layers below the p-type cladding layer.

In the embodiment described above, when the first conductivity type is the p-type, C and Zn are used as an example of the p-type first impurity or the second impurity, but the p-type first or second impurity may be Mg or Be, for example, and two or more impurities may be used as dopants. Because these impurities have higher diffusion coefficients in the order of Zn>Be>Mg>C, the impurity(ies) to be contained in the topmost layer region may be selected as appropriate. As mentioned earlier, Zn has a diffusion coefficient of $10^{-8}$ cm$^2$/s or so, and C has a diffusion coefficient of $10^{-15}$ cm$^2$/s or so at 900 degrees Celsius, for example. The diffusion coefficient changes depending on the type of the semiconductor crystal or constituent atoms, but the diffusion coefficient of an impurity with a higher diffusion coefficient is preferably within a range of $10^{-6}$ to $10^{-10}$ cm$^2$/s. The diffusion coefficient of an impurity with a lower diffusion coefficient is preferably within a range of $10^{-11}$ to $10^{-16}$ cm$^2$/s. The difference in the diffusion coefficient between the impurity with a lower diffusion coefficient and that with a higher diffusion coefficient is preferably $10^1$ cm$^2$/s or more.

When the first conductivity type is the n-type, the n-type first or second impurity may be Si, C, Ge, Sn, S, or Se, for example, and two or more impurities may be used as dopants. By allowing the topmost layer region of the semiconductor layer portion 15 to have a higher impurity content with a lower diffusion coefficient, a contact resistance increase resulting from the RTA can be suppressed. Because these impurities have higher diffusion coefficients in the order of Sn>Si, Ge, and S>Se>C, the impurity(ies) to be contained in the topmost layer region may be selected as appropriate.

Twelfth Embodiment

Figure 80A:
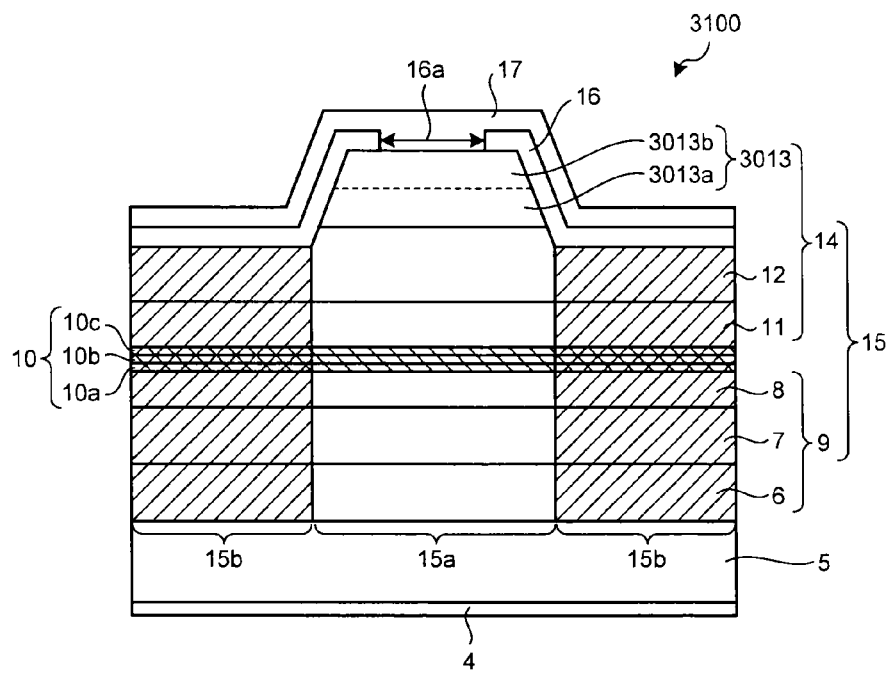
FIG. 80A is a cross-sectional view along the x-y plane in a semiconductor element that can be manufactured with the manufacturing method according to a twelfth embodiment of the present invention.
Figure 80B:
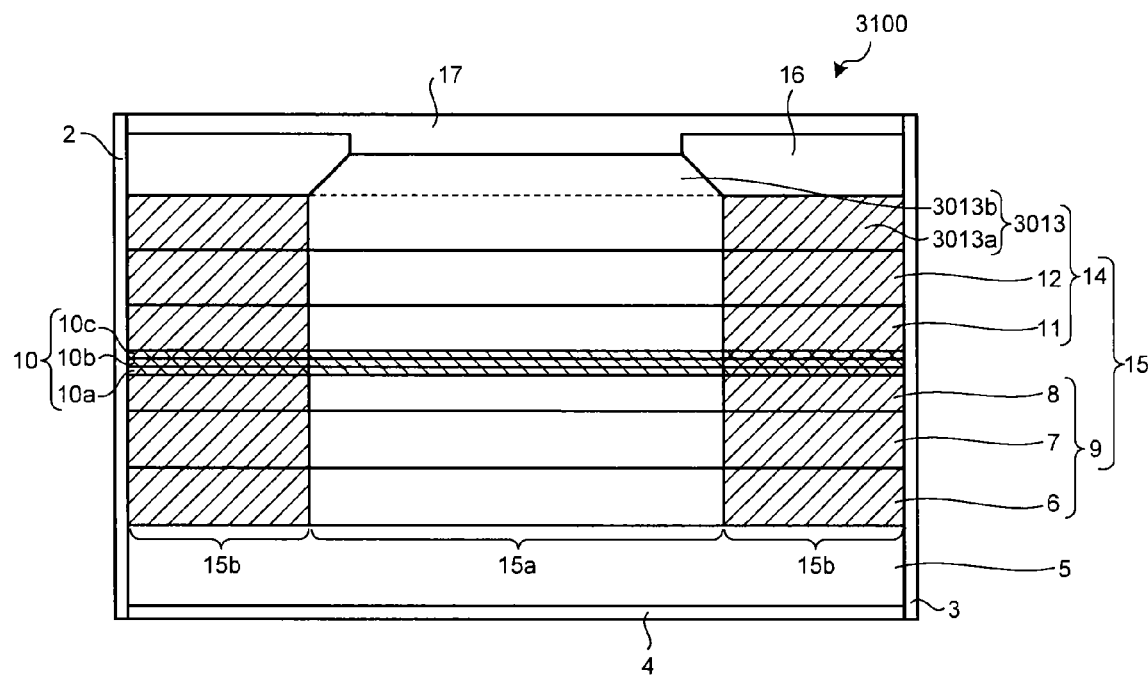
FIG. 80B is a cross-sectional view along the y-z plane in the semiconductor element that can be manufactured with the manufacturing method according to the f twelfth embodiment.

FIG. 80A is a cross-sectional view along the x-y plane in a semiconductor laser element that is a semiconductor element that can be manufactured with a method for manufacturing a semiconductor element according to a twelfth embodiment of the present invention. FIG. 80B is a cross-sectional view along the y-z plane in the semiconductor element that can be manufactured with the method for manufacturing a semiconductor element according to the twelfth embodiment. As illustrated in FIG. 80A, this semiconductor element 3100 is provided with the substrate 5 the bottom surface of which is provided with the lower electrode 4 that is the n-side electrode made of n-type gallium arsenide (GaAs), and the semiconductor layer portion 15 including the n-type semiconductor layer section 9, the active layer 10, and the p-type semiconductor layer section 14. The n-type semiconductor layer section 9 includes the n-type buffer layer 6, the n-type cladding layer 7, and the n-type guide layer 8. The p-type semiconductor layer section 14 includes the p-type guide layer 11, the p-type cladding layer 12, and a p-type contact layer 2013. The n-type semiconductor layer section 9, the active layer 10, and the p-type semiconductor layer section 14 are sequentially formed on the substrate 5. The p-type contact layer 3013 has a trapezoidal cross section, and has stripes extending in the z-axial direction. This p-type contact layer 3013 provides the ridge structure to the semiconductor element 3100. The semiconductor laser element 3100 also includes the insulating film 16 that is formed on the p-type semiconductor layer section 14, and the upper electrode 17 that is a p-side electrode that is brought into contact with the p-type contact layer 3013 via a part of the upper base of the trapezoidal ridge structure, the part being not provided with the insulating film 16.

The p-type contact layer 3013 has a p-type contact layer 3013a made of GaAs doped with C at a concentration of $1.0 \times 10^{17}$ cm$^{-3}$ to $5.0 \times 10^{19}$ cm$^{-3}$ to $5 \times 10^{20}$ cm$^{-3}$ or so, for example, and a p-type contact layer 3013b made of GaAs doped with Zn at a concentration of $1.0 \times 10^{17}$ cm$^{-3}$ to $5.0 \times 10^{19}$ cm$^{-3}$ to $5 \times 10^{20}$ cm$^{-3}$ or so, for example. C and Zn diffuse across the p-type semiconductor layer section 14 during the RTA in the manufacture process.

In the twelfth embodiment, C functions as the promoting species, and Zn functions as the suppressing species.

In the semiconductor element 3100, because the facet from which the laser light is output is disordered as the window region, the window region has larger band gap energy than the non-window region, and the window region has become transparent to the emission wavelength, so that a smaller amount of laser light is absorbed at the facet. Therefore, a reliable semiconductor laser element with a lower risk of COD is provided.

Figure 81:
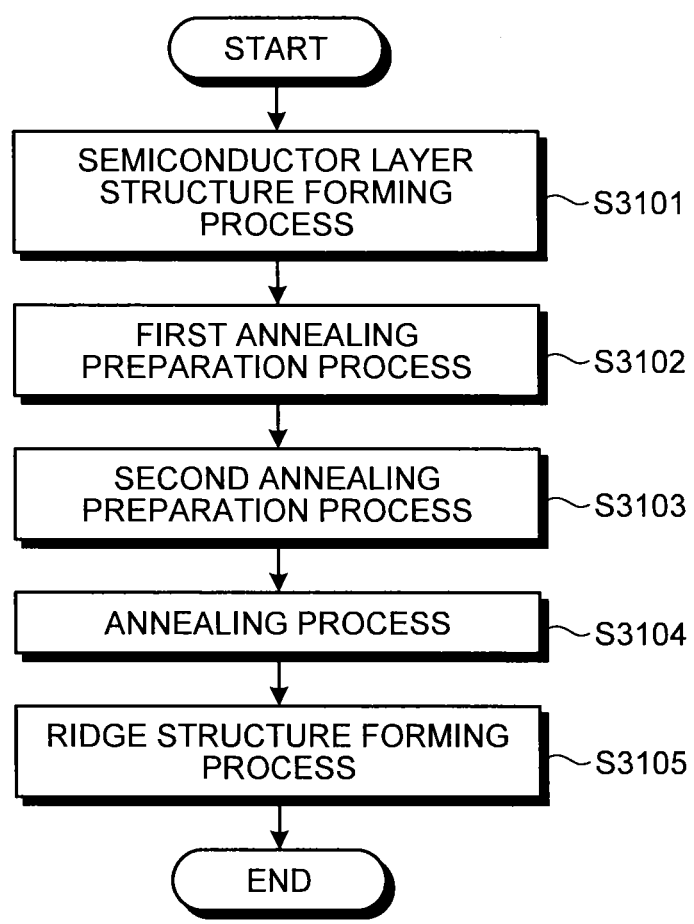
FIG. 81 is a flowchart of the method for manufacturing a semiconductor element.

As the twelfth embodiment, a method for manufacturing the semiconductor element 3100 will now be explained. FIG. 81 is a flowchart of the method for manufacturing the semiconductor element. As illustrated in FIG. 81, the method for manufacturing the semiconductor element 3100 according to the twelfth embodiment includes a semiconductor layer structure forming process (Step S3101), a first annealing preparation process (Step S3102), a second annealing preparation process (Step 3103), an annealing process (Step S3104), and a ridge structure forming process (Step S3105).

Each of these processes will now be explained. The values specified in these processes are merely exemplary, and the embodiment is not limited thereto.

Semiconductor Layer Structure Forming Process

Figure 82:
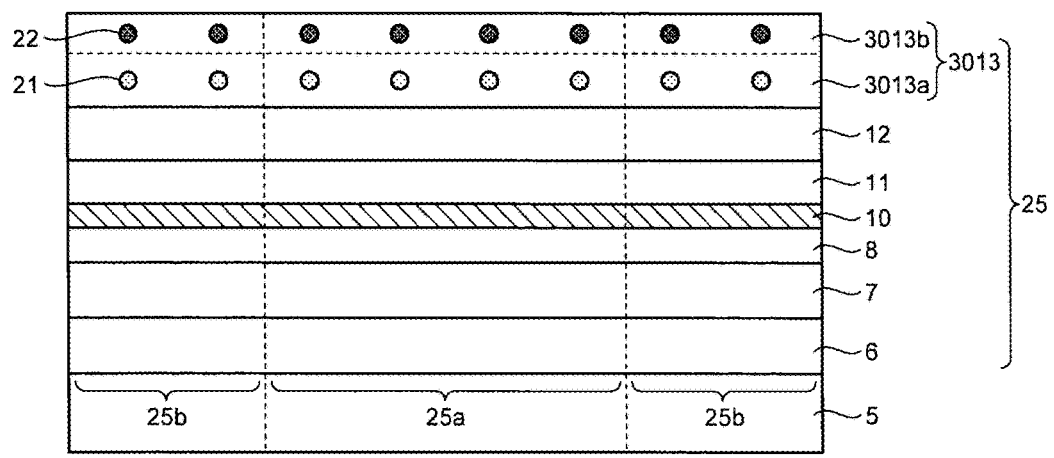
FIG. 82 is a schematic for explaining a method for manufacturing a semiconductor element according to the twelfth embodiment.

To begin with, the semiconductor layer structure forming process at Step S3101 will now be explained. In this process, to begin with, as illustrated in FIG. 82, the n-type buffer layer 6, the n-type cladding layer 7, the n-type guide layer 8, the active layer 10, the p-type guide layer 11, the p-type cladding layer 12, and the p-type contact layer 3013 are epitaxially grown on the substrate 5 through MOCVD. The p-type contact layer 3013a is doped with C 21, and the p-type contact layer 3013b is doped with Zn 22. In the semiconductor layer structure 25, the region that is to be the non-window region 15a is referred to as a first region 25a, and the region that is to be the window region 15b is referred to as a second region 25b. Through this process, the semiconductor layer structure 25 having the active layer 10 is produced.

First Annealing Preparation Process

The first annealing preparation process at Step S3102 will now be explained. In this process, a part of the semiconductor layer structure 25 is removed by etching, so that the second region 25b contains less Zn 22 that is the first impurity having a function of suppressing atomic vacancy diffusion than in the first region 25a. Preferably, the p-type contact layer 3013b containing Zn is completely removed from the second region 25b. With this process, disordering in the active layer 10 is promoted in the second region 25b that is to be the window region 15b, than in the first region 25a that is to be the non-window region 15a, during the subsequent annealing process, in the semiconductor layer structure 25.

Figure 83:
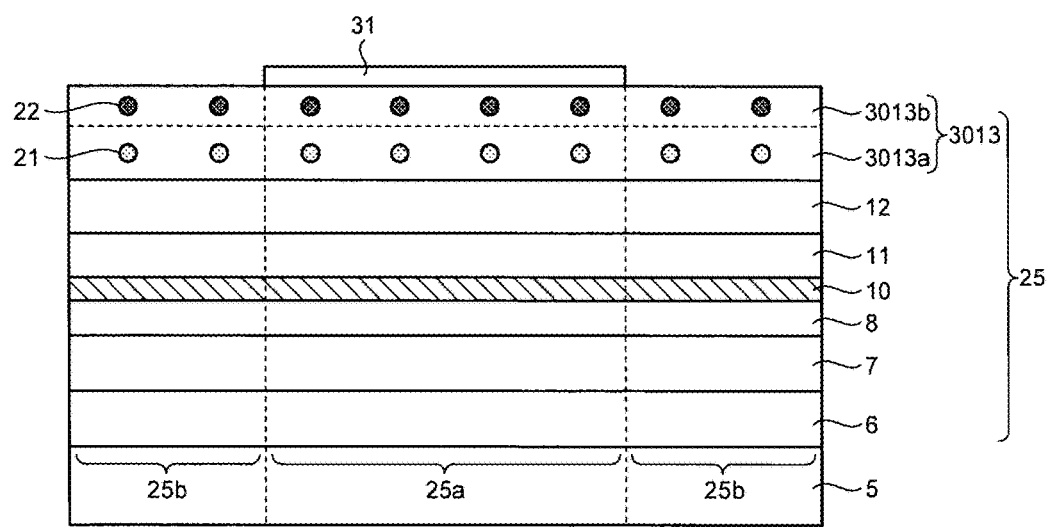
FIG. 83 is a schematic for explaining the method for manufacturing a semiconductor element according to the twelfth embodiment.
Figure 84:
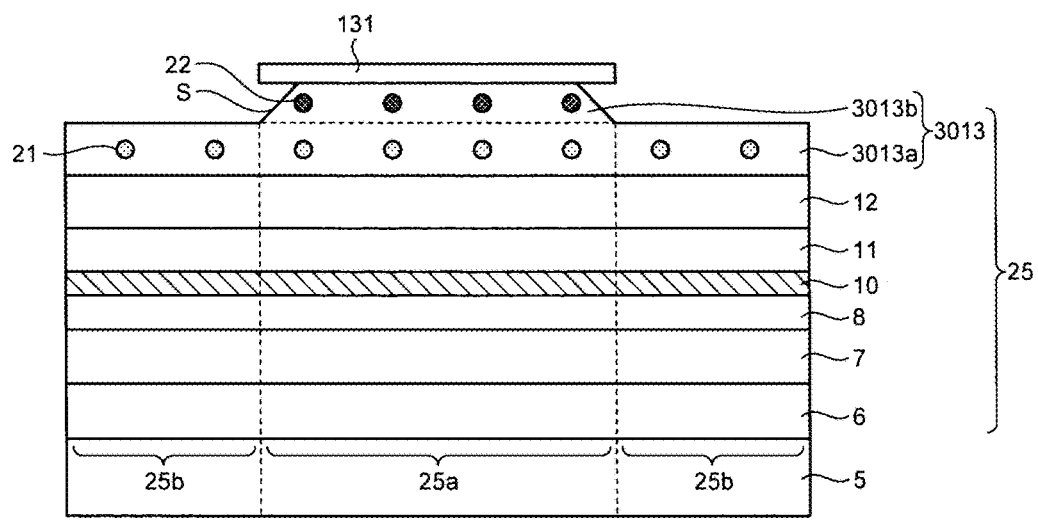
FIG. 84 is a schematic for explaining the method for manufacturing a semiconductor element according to the twelfth embodiment.

To begin with, as illustrated in FIG. 83, the photoresist 131 is applied to the top surface of the first region 25a of the semiconductor layer structure 25 with a photolithography process. The p-type contact layer 3013b in the second region 25b is then removed by etching, as illustrated in FIG. 84. An inclined surface S having an inclination with respect to the y axis is preferably provided along the border between the first region 25a and the second region 25b, as illustrated in FIG. 84. More preferably, the inclined surface S along the border is inclined by 30 degrees or more with respect to the y axis that is the deposition direction of the semiconductor layer structure 25. With an inclination of 30 degrees or more, a dielectric film having a film quality and a film thickness equivalent to that to be deposited on a planar surface can be achieved on the inclined surface S. The inclination with respect to the y axis can be increased by reducing the etching rate. In particular, the etching rate may be set to 3 nm/sec or lower to achieve an inclination of 30 degrees or more with respect to the y axis along the border between the first region 25a and the second region 25b.

The photoresist 131 is then removed. At this time, Zn 22 suppressing disordering is less contained in the second region 25b than in the first region 25a. Disordered crystals grow in the active layer 10 by the annealing more easily in the second region 25b than in the first region 25a as described later.

Second Annealing Preparation Process

Figure 85:
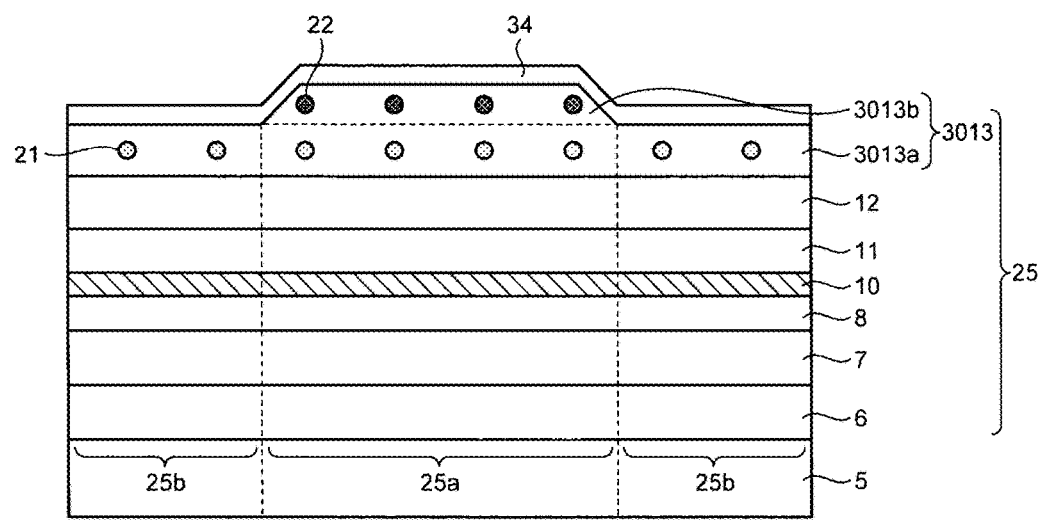
FIG. 85 is a schematic for explaining the method for manufacturing a semiconductor element according to the twelfth embodiment.

The second annealing preparation process at Step S3103 will now be explained. In this process, the topmost surface of the first region 25a and the topmost surface of the second region 25b are brought into contact with a uniform medium. In other words, as illustrated in FIG. 85, a dielectric film 34 that is a SiN insulating layer is uniformly deposited on the topmost surface of the semiconductor layer structure 25 that is partially etched. The areas other than the topmost surface of the first region and the topmost surface of the second region do not necessarily need to be brought into contact with the uniform medium. Before the dielectric film 34 is deposited, the top surface is preferably cleaned with sulfuric acid or the like to remove any substance attached on the surface.

Annealing Process

The annealing process at Step S3104 will now be explained. In this process, the semiconductor layer structure is annealed over a short time period with the RTA. The semiconductor layer structure is annealed with the RTA for 30 seconds at 850 degrees Celsius, for example. As the semiconductor layer structure is annealed with the RTA, the dielectric film 34 absorbs the Ga atoms, and atomic vacancies appear on the surface of the p-type contact layer 3013. The atomic vacancies diffuse as the diffusing species, resulting in disordering in the semiconductor layer portion, particularly in the active layer 10.

In the twelfth embodiment, C 21 functions as the second impurity that is the promoting species, and Zn 22 functions as the first impurity that is the suppressing species. In the first region 25a, C 21 promotes disordering in the active layer 10, and Zn 22 suppresses disordering in the active layer 10. In the second region 25b, C 21 promotes disordering in the active layer 10, but the process in which disordering in the active layer 10 is suppressed by Zn 22 does not take place. Therefore, the degrees of disordering in the active layer 10 are different in the first region 25a in which disordering in the active layer 10 is suppressed by Zn 22, and in the second region 25b not containing Zn 22. Specifically, the degree of disordering in the active layer 10 is higher in the second region 25b than that in the first region 25a. As a result, different levels of band gap energy can be achieved in the active layer 10 in the non-window region 15a formed from the first region 25a, and in the window region 15b formed from the second region 25b.

Figure 86:
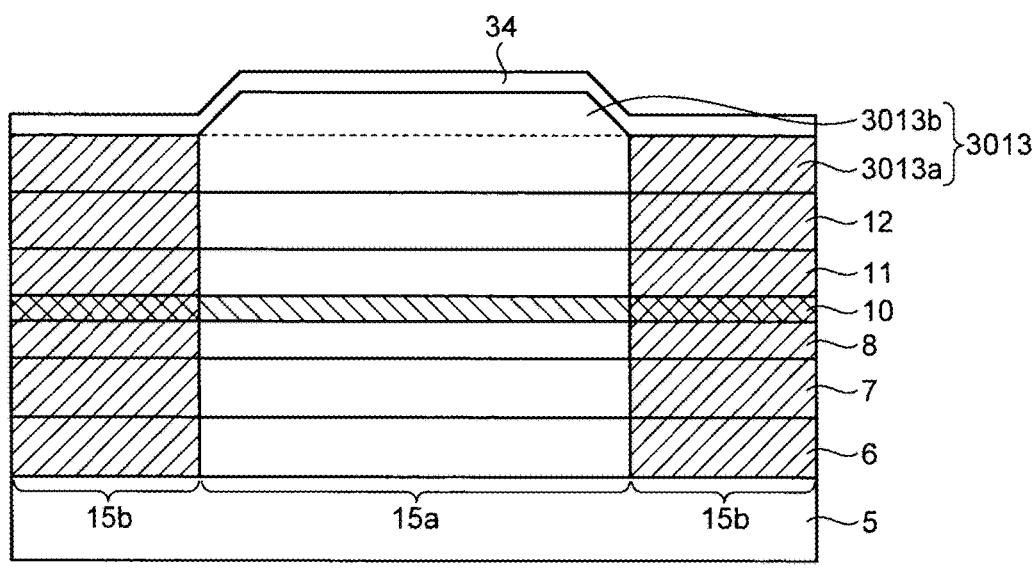
FIG. 86 is a schematic for explaining the method for manufacturing a semiconductor element according to the twelfth embodiment.

In the method for manufacturing a semiconductor element according to the twelfth embodiment, the dielectric film 34 is uniformly deposited on the first region 25a and the second region 25b, and the window region 15b is made transparent but not the non-window region 15a so that a semiconductor laser element with a lower risk of COD can be provided. Through this process, as illustrated in FIG. 86, the non-window region 15a and the window region 15b are formed. The dielectric film 34 is then removed.

When a method for forming the suppressing film and the promoting film made of a dielectric film is used to achieve the non-window region and the window region, two films of different compositions need to be formed.

By contrast, in the method for manufacturing a semiconductor element according to the twelfth embodiment, the first region 25a and the second region 25b in the semiconductor layer structure 25 are made a predetermined difference. With this structure, the non-window region 15a and the window region 15b can be achieved despite that provided on both the first region 25a and the second region 25b is only one dielectric film 34 having a uniform composition across the region to be contact with the topmost surface of the first region 25a and the region to be in contact with the topmost surface of the second region 25b. The method for manufacturing a semiconductor element according to the twelfth embodiment is therefore capable of dramatically reducing complexities in the manufacture process compared with the method in which two films with different compositions are formed.

Furthermore, if two films that are the suppressing film and the promoting film are formed on the planer semiconductor layer structure, a step is formed at the border between the suppressing film and the promoting film, and a rapture where the dielectric film becomes discontinuous may be formed. The topmost surface of the semiconductor layer structure might have some area immediately below the break not covered by the dielectric film. If the semiconductor layer structure is annealed with the area not covered, the topmost surface immediately below the break in the semiconductor layer structure may become rough. Such a surface roughness may deteriorate the performance of the manufactured semiconductor element.

In the method for manufacturing a semiconductor element according to the twelfth embodiment, because manufactured is only one dielectric film 34, a continuous film capable of seamlessly covering the surface of the semiconductor layer structure can be easily formed. Therefore, the annealing of the semiconductor layer structure is less likely to cause the evaporation of the semiconductor composition element from the surface immediately below the break not covered by the dielectric film 34, and to result in surface roughness. In this manner, the method for manufacturing a semiconductor element according to the twelfth embodiment is capable of preventing or reducing the risk of surface roughness resulting from the annealing process. Even when used is one dielectric film 34, the dielectric film 34 may break if the inclination at the border between the first region 25a and the second region 25b is steep. It is therefore preferable that the border is inclined by 30 degrees or more with respect to the y axis extending along the deposition direction of the semiconductor layer structure 25.

Furthermore, when the promoting film and the suppressing film are used, for example, the promoting film is uniformly deposited on the topmost surface of the semiconductor layer structure, and is removed from the topmost surface of the first region by the photolithography process and the etching process, and the suppressing film is then formed on the topmost surface of the first region. At this time, some of the promoting film may be left without being completely removed by etching. If the suppressing film is formed on the remaining promoting film, the suppressing film becomes incapable of providing the function of suppressing disordering in the active layer sufficiently, and therefore might become incapable of achieving a sufficient band gap energy difference between the non-window region and the window region, and of reducing the risk of COD.

By contrast, in the method for manufacturing a semiconductor element according to the twelfth embodiment, because the process of removing the dielectric film before the annealing process can be omitted, the chances of not being able to sufficiently reduce the risk of COD due to the lack of sufficient etching can be prevented or reduced.

Ridge Structure Forming Process

The ridge structure forming process at Step S3105 can be conducted in the same manner as in the first embodiment. The insulating film 16 is then deposited, and the opening 16a is formed.

The upper electrode 17 and the lower electrode 4 are then provided. The substrate 5 is then cleaved, and the low reflection film 2 and the high reflection film 3 are formed on the cleavage facets. The semiconductor layer structure is then diced into elements, and the semiconductor element 3100 is achieved thereby.

As described above, with the method for manufacturing the semiconductor element 3100 according to the twelfth embodiment, the regions with different degrees of disordering can be achieved with a more simplified process.

Example 10

Figure 87:
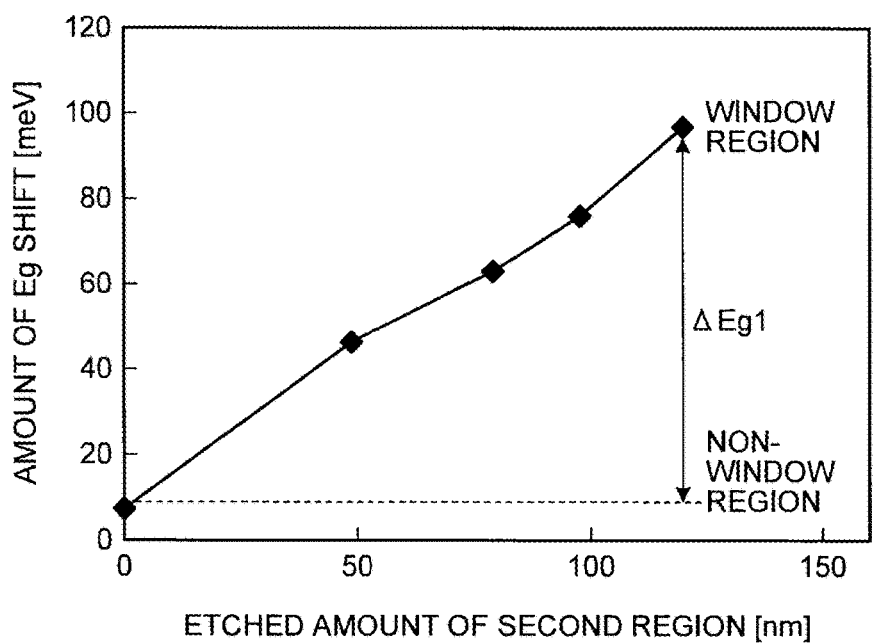
FIG. 87 is a schematic illustrating a relation between the etched amount of the p-type contact layer and the amount of gap energy shift in a second region in Example 10.

As Example 10 of the semiconductor element 3100 manufactured with the manufacturing method according to the twelfth embodiment, a relation between the etched amount of the p-type contact layer 3013b in the second region 25b and the degree of disordering in the active layer 10 was measured. FIG. 87 is a schematic illustrating a relation between the etched amount of the p-type contact layer in the second region and the amount of band gap energy shift in Example 10. When the p-type contact layer 3013b is removed from the second region 25b by etching, the Zn content of the second region 25b, Zn 22 being the suppressing species with the function of suppressing disordering, is reduced, and disordering in the active layer 10 grow more easily than when the p-type contact layer 3013b is not removed by etching. As a result, the amount of band gap energy shift is increased as illustrated in FIG. 87. The Zn 22 content of the p-type contact layer 3013b can be calculated as an integral of the dopant concentration with respect to the layer thickness.

By contrast, the first region 25a to be the non-window region 15a was not etched, so that, when the etched amount of the p-type contact layer 3013b in the second region 25b was increased, the band gap energy difference ΔEg1 between the non-window region 15a and the window region 15b was increased. When the second region 25b was etched by 120 nanometers, in particular, the band gap energy difference ΔEg1 between the non-window region 15a and the window region 15b was 90 million electron volts or higher. This result demonstrated that this structure can sufficiently reduce the risk of COD.

Figure 88:
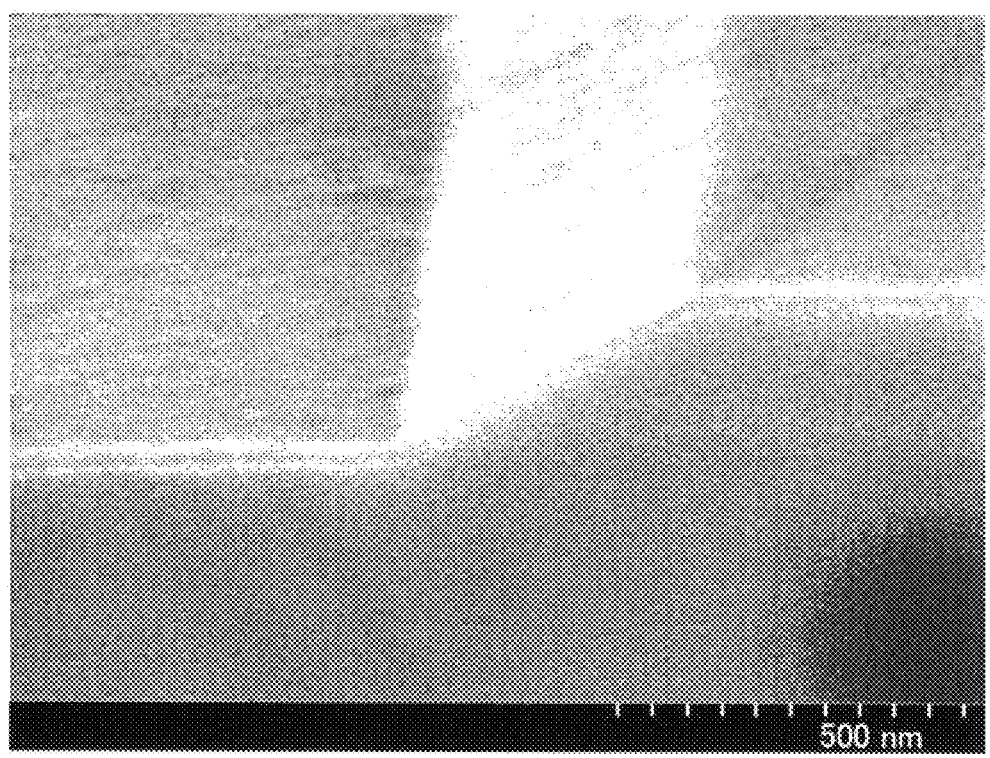
FIG. 88 is an SEM photograph representing how the dielectric film is uniformly formed across the topmost surfaces of the first region and the second region in the semiconductor layer structure according to Example 10.

Furthermore, in Example 10 according to the twelfth embodiment, no break was confirmed on the dielectric film 34. This result renders the issue related to the surface roughness at the position immediately below the break irrelevant in the Example 10. FIG. 88 is a scanning electron microscope (SEM) photograph representing how the dielectric film is uniformly formed across the topmost surfaces of the first region and the second region of the semiconductor layer structure according to the tenth embodiment. The inclination captured in FIG. 88 has a height of 200 nanometers and a width of 400 nanometers, and is inclined by 60 degrees with respect to the y axis extending along the deposition direction of the semiconductor layer structure 25. A SiN film with a thickness of 30 nanometers is provided as the dielectric film 34 on the semiconductor layer structure 25. The cross-sectional SEM photograph in FIG. 88 represents no break in the dielectric film 34, and that the dielectric film 34 is uniformly provided. In this manner, the method for manufacturing a semiconductor element according to the tenth embodiment does not have any surface roughness, because the dielectric film 34 has no rapture.

First Modification

A method for manufacturing a semiconductor element according to a first modification of the twelfth embodiment will now be explained.

Figure 89:
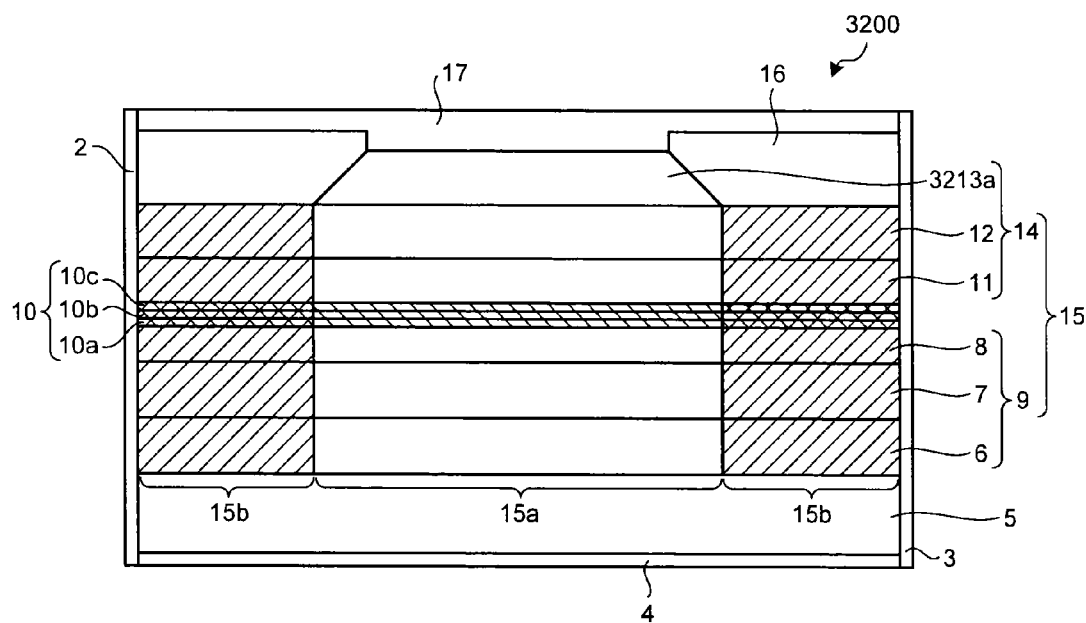
FIG. 89 is a cross-sectional view along the y-z plane in a semiconductor element manufactured with the manufacturing method according to a first modification.
Figure 90:
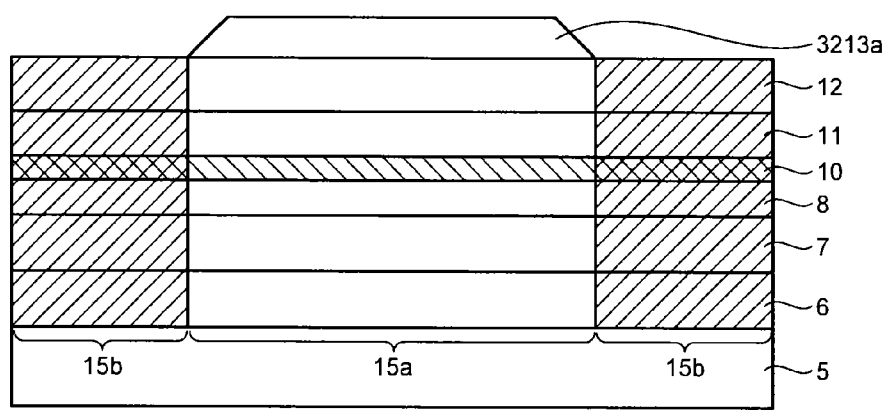
FIG. 90 is a schematic for explaining the method for manufacturing a semiconductor element according to the first modification.

A semiconductor element 3200 manufactured with the manufacturing method according to the first modification has a structure in which a p-type contact layer 3213b containing less Zn 22 after the annealing is removed by etching, as illustrated in FIG. 89. The method for manufacturing the semiconductor element 3200 according to the first modification follows the same process as the twelfth embodiment up to the annealing process. As illustrated in FIG. 90, the dielectric film 34 is then removed, in the same manner as in the ridge structure forming process in the method for manufacturing the semiconductor element 3100 according to the twelfth embodiment, and the p-type contact layer 3213b is removed by etching. The subsequent process is the same as that in the method for manufacturing the semiconductor element 3100 according to the twelfth embodiment. Through this process, the upper electrode 17 is brought into contact with the p-type contact layer 3213a doped with C 21 with a lower diffusion coefficient, and the final semiconductor element 3200 is achieved thereby.

Second Modification

Figure 91:
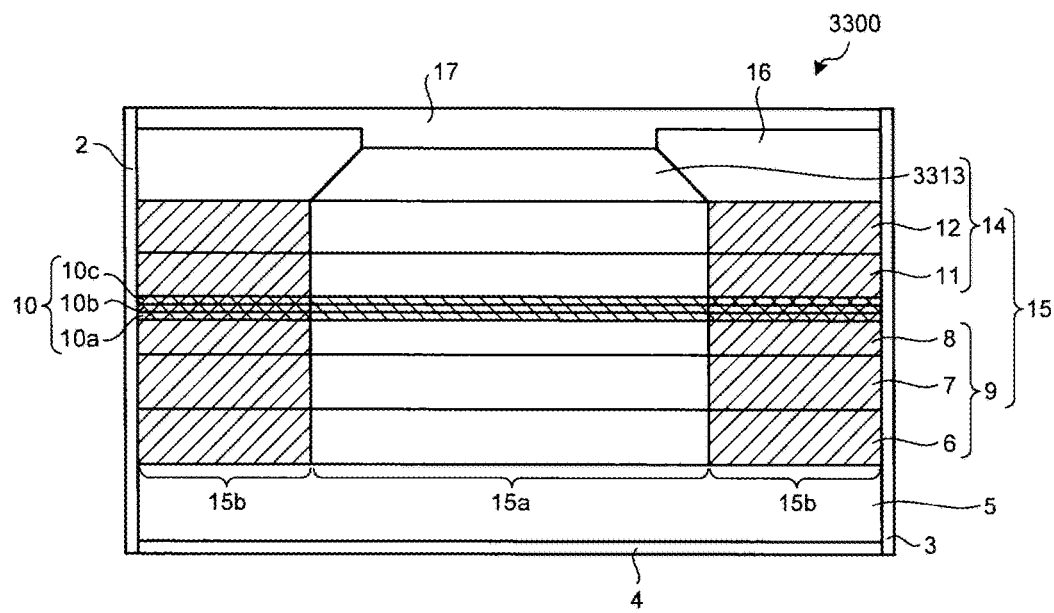
FIG. 91 is a cross-sectional view along the y-z plane in a semiconductor element manufactured with the manufacturing method according to a second modification.

A method for manufacturing a semiconductor element according to a second modification of the twelfth embodiment will now be explained. To begin with, semiconductor element that can be manufactured with the method for manufacturing a semiconductor element according to the second modification will now be explained. FIG. 91 is a cross-sectional view along the y-z plane in the semiconductor element manufactured with the manufacturing method according to the second modification. As illustrated in FIG. 91, this semiconductor element 3300 manufactured with the manufacturing method according to the second modification has a structure in which the p-type contact layer has only one p-type contact layer 3313 that is doped with Zn 22, unlike that in the semiconductor element 3100 according to the twelfth embodiment. While only one p-type contact layer 3313 is provided, a plurality of regions with different degrees of disordering can be achieved with one dielectric film 34 by providing the first region 25*a* and the second region 25*b* with different Zn 22 contents, Zn 22 functioning as the suppressing species.

Figure 92:
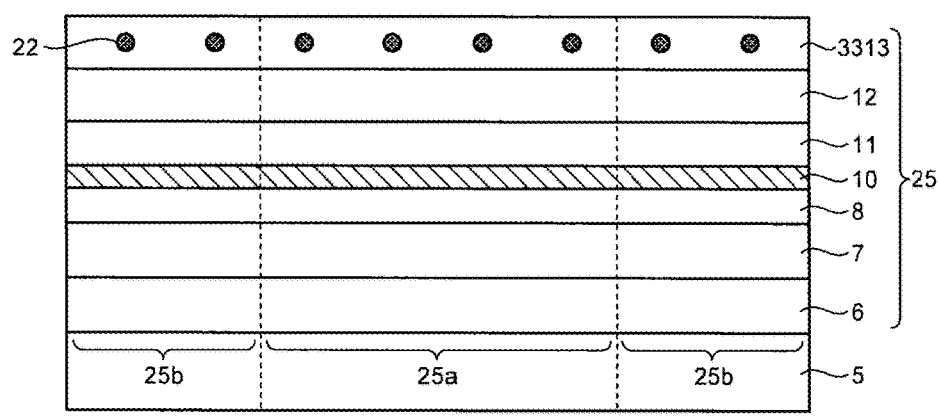
FIG. 92 is a schematic for explaining the method for manufacturing a semiconductor element according to the second modification.
Figure 93:
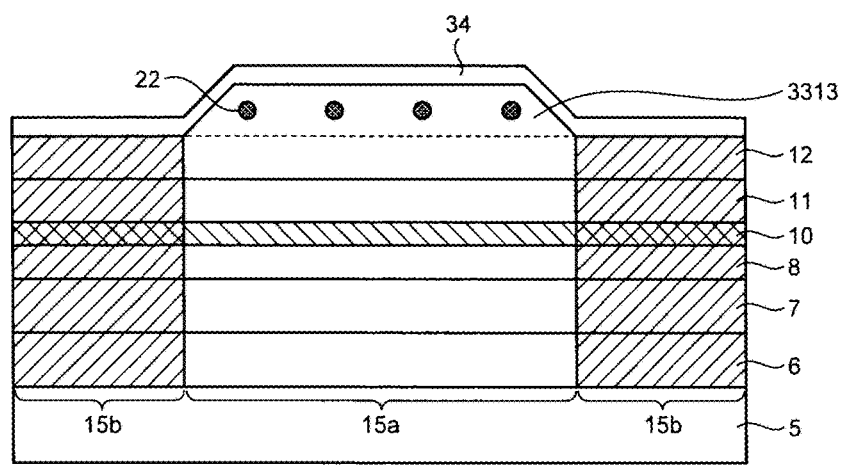
FIG. 93 is a schematic for explaining the method for manufacturing a semiconductor element according to the second modification.

The method for manufacturing the semiconductor element 3300 according to the second modification will now be explained. FIGS. 92 and 93 are schematics for explaining the method for manufacturing a semiconductor element according to the second modification. As illustrated in FIG. 93, the method for manufacturing the semiconductor element 3300 according to the second modification, only one layer that is the p-type contact layer 3313 doped with Zn 22 is formed on the p-type cladding layer 12, as a semiconductor layer structure. The p-type contact layer 3313 in the second region 25*b* is then removed in the photoresist process and the etching process, in the same manner as in the twelfth embodiment. The dielectric film 34 made of SiNx is then uniformly deposited on the etched area, and the semiconductor layer structure is annealed to achieve the non-window region 15*a* and the window region 15*b* with different degrees of disordering, as illustrated in FIG. 93. The ridge structure forming process is then conducted in the same manner as in the twelfth embodiment, and the final semiconductor element 3300 is achieved thereby.

Third Modification

Figure 94:
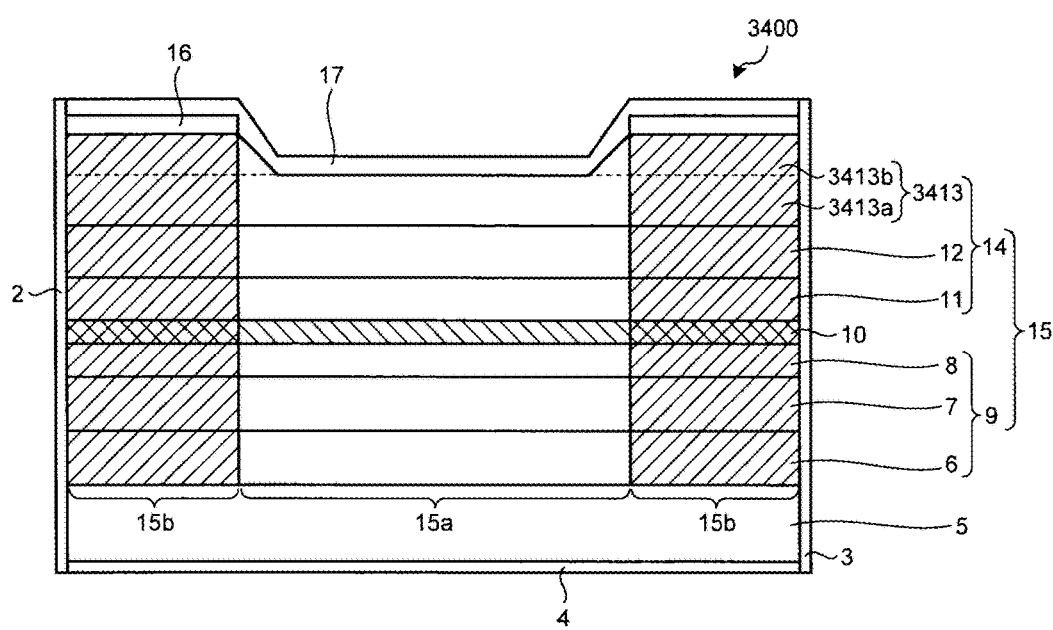
FIG. 94 is a cross-sectional view along the y-z plane in a semiconductor element according to a third modification.

A method for manufacturing a semiconductor element according to a third modification of the twelfth embodiment will now be explained. To begin with, a semiconductor element that can be manufactured with the method for manufacturing a semiconductor element according to the third modification will now be explained. FIG. 94 is a cross-sectional view along the y-z plane in the semiconductor element manufactured with the manufacturing method according to the third modification. As illustrated in FIG. 94, a semiconductor element 3400 according to the third modification has a structure in which a p-type contact layer 3413 has two layers, in the same manner as the semiconductor element 3100 according to the twelfth embodiment. Unlike in the semiconductor element 3100 according to the twelfth embodiment, in the semiconductor element 3400 according to the third modification, a p-type contact layer 3413*a* is doped with Zn 22, and a p-type contact layer 3413*b* is doped with C 21. Furthermore, unlike the twelfth embodiment in which the p-type contact layer 3013*b* in the window region 15*b* is removed by etching, the p-type contact layer 3413*b* in the non-window region 15*a* is removed by etching.

The risk of COD can be reduced by making the degrees of disordering in the active layer 10 different between the non-window region 15*a* and the window region 15*b*, and by setting the band gap energy of the window region 15*b* higher than that of the non-window region 15*a*. Therefore, the method may include a process of reducing the amount of Zn 22 that is the first impurity having function of suppressing atomic vacancy diffusion in the second region 25*b* to the level below that in first region 25*a*, or a process of reducing the amount of C 21 that is the second impurity having a function of promoting atomic hole diffusion from the first region 25*a* to the level below that in the second region 25*b*, before carrying out the annealing process. While the method according to the twelfth embodiment includes the process of reducing the amount of Zn 22 that is the first impurity having a function of suppressing atomic vacancy diffusion in the second region 25*b* to a level below that in the first region 25*a*, the method according to the third modification includes the process of reducing the amount of C 21 that is the second impurity having a function of promoting atomic vacancy diffusion in the second region 25*b* to the level below that in the first region 25*a*. With such a process included, the regions with different degrees of disordering can be achieved with one dielectric film 34 in the third modification.

Figure 95:
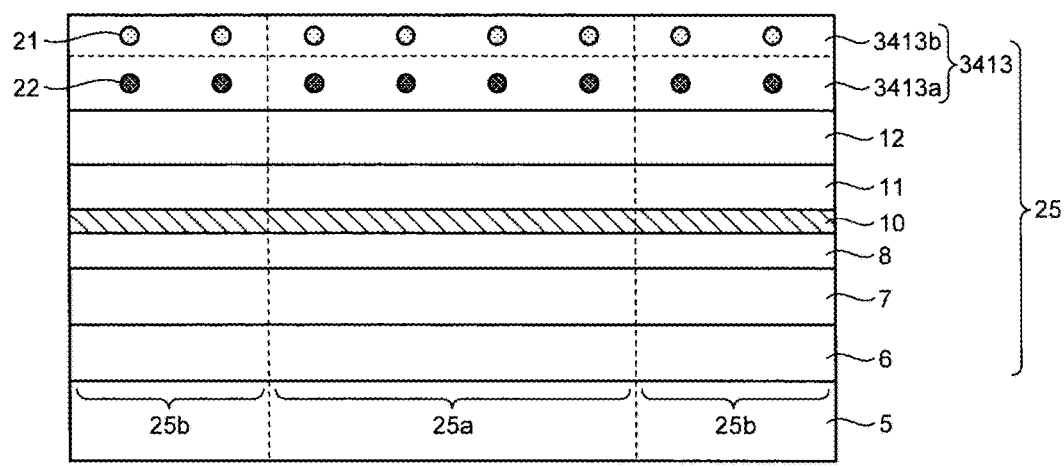
FIG. 95 is a schematic for explaining a method for manufacturing a semiconductor element according to the third modification.
Figure 96:
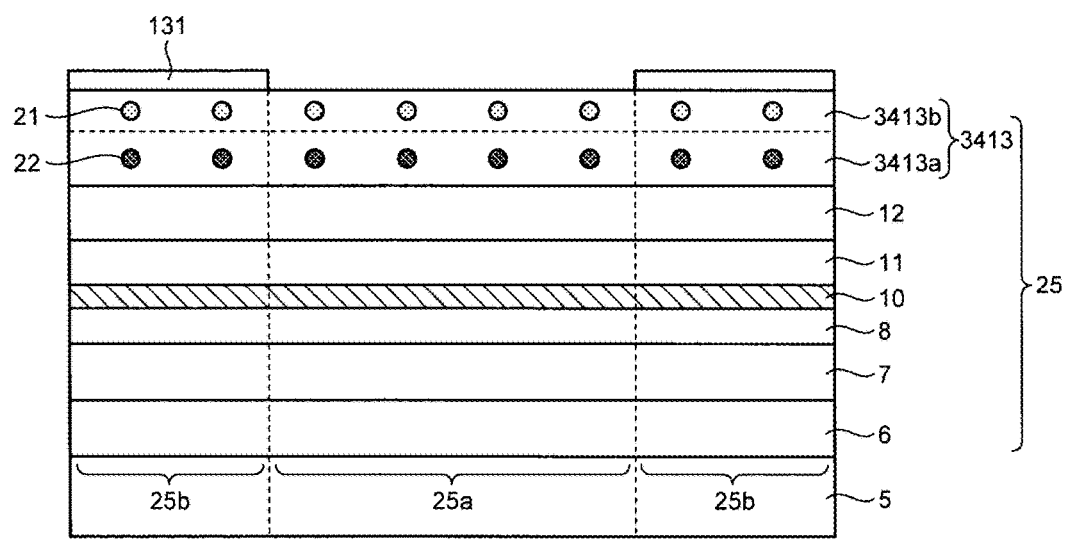
FIG. 96 is a schematic for explaining the method for manufacturing a semiconductor element according to the third modification.
Figure 97:
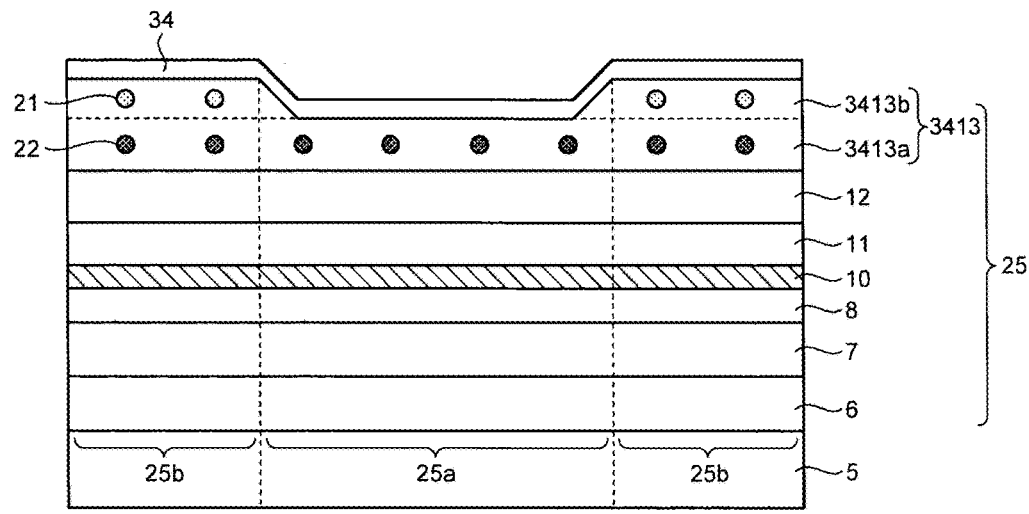
FIG. 97 is a schematic for explaining the method for manufacturing a semiconductor element according to the third modification.

The method for manufacturing the semiconductor element 3400 according to the third modification will now be explained. FIGS. 95 to 97 are schematics for explaining the method for manufacturing the semiconductor element according to the third modification. As illustrated in FIG. 95, in the method for manufacturing the semiconductor element 3400 according to the third modification, the p-type contact layer 3413 includes the p-type contact layer 3413*a* doped with Zn 22 and the p-type contact layer 3413*b* doped with C 21. As illustrated in FIG. 96, in the photolithography process, the photoresist 131 is applied on the top surface of the second region 25*b* in the semiconductor layer structure 25. The p-type contact layer 3413*b* in the first region 25*a* is then removed by etching, and the dielectric film 34 is uniformly deposited on the first region 25*a*, to achieve the structure illustrated in FIG. 97. When this structure is annealed, disordering in the active layer 10 is promoted in the second region 25*b* having the p-type contact layer 3413*b* containing C 21 that is the promoting species. As a result, the band gap energy of the window region 15*b* is increased to a level higher than that of the non-window region 15*a* in which the p-type contact layer 3413*b* is removed. The non-window region 15*a* and the window region 15*b* with different degrees of disordering are thus achieved using one dielectric film 34. The ridge structure forming process and the like are then carried out in the same manner as in the twelfth embodiment, and the final semiconductor element 3400 is achieved thereby.

Fourth Modification

Figure 98:
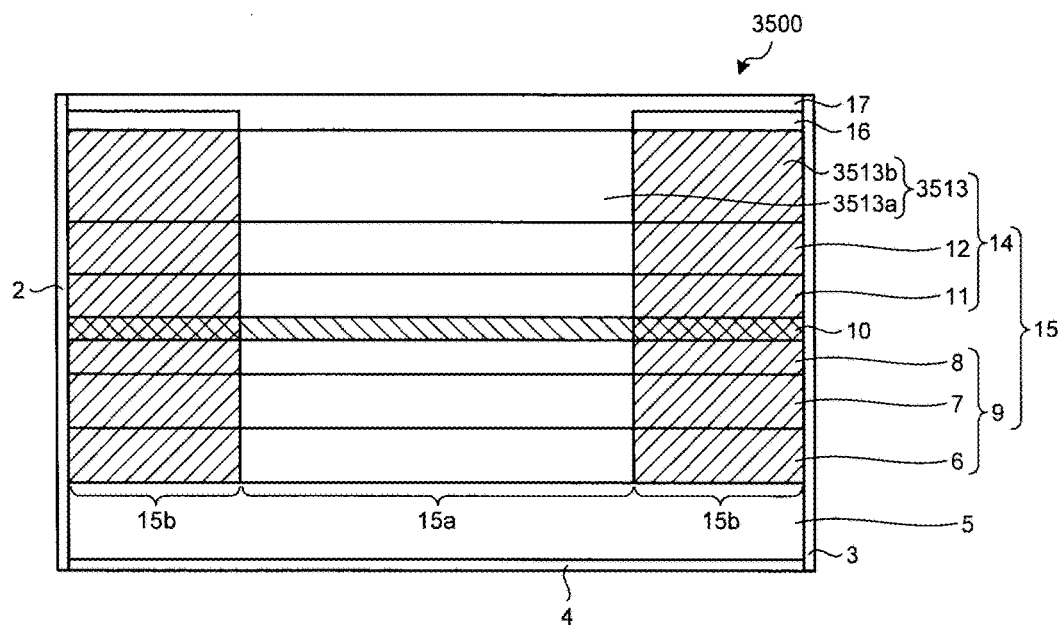
FIG. 98 is a cross-sectional view along the y-z plane in a semiconductor element according to a fourth modification.

A method for manufacturing a semiconductor element according to a fourth modification of the twelfth embodiment will now be explained. To begin with, a semiconductor element that can be manufactured with the method for manufacturing a semiconductor element according to the fourth modification will now be explained. FIG. 98 is a cross-sectional view along the y-z plane in the semiconductor element manufactured with the manufacturing method according to the fourth modification. As illustrated in FIG. 98, in this semiconductor element 3500 according to the fourth modification, a p-type contact layer 3513 has a p-type contact layer 3513*a* doped with Zn 22 in the non-window region 15*a*, and has a p-type contact layer 3513*b* doped with C 21 in the window region 15*b*, unlike that in the semiconductor element 3100 according to the twelfth embodiment. With this structure, because Zn 22 suppresses disordering in the active layer 10 in the non-window region 15*a*, and C 21 promotes disordering in the active layer 10 in the window region 15*b*, the effects achieved with the twelfth embodiment and the third modification can be achieved.

Figure 99:
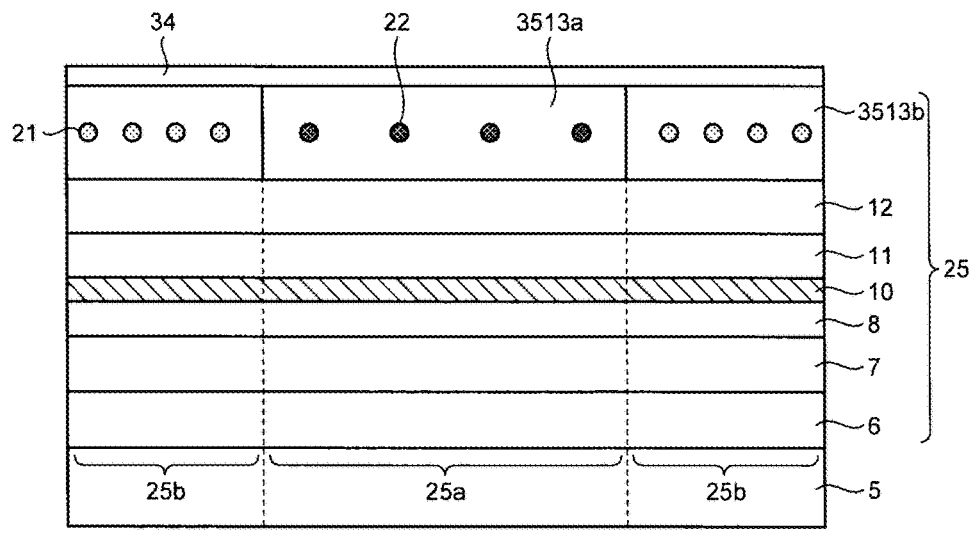
FIG. 99 is a schematic for explaining an exemplary method for manufacturing a semiconductor element according to the fourth modification.

The method for manufacturing the semiconductor element 3500 according to the fourth modification will now be explained. FIG. 99 is a schematic for explaining the method for manufacturing a semiconductor element according to the fourth modification. In the method for manufacturing the semiconductor element 3500 according to the fourth modification, to begin with, a p-type contact layer 3513*a* doped with Zn 22 is formed, and the photolithography process and the etching process are then performed to remove the p-type contact layer 3513*a* from the second region 25*b*. The p-type contact layer 3513*b* doped with C 21 is selectively formed again in the second region 25*b*. The dielectric film 34 is uniformly deposited on the p-type contact layer 3513b, to achieve the structure illustrated in FIG. 99. The annealing process, the ridge structure forming process, and the like are performed to this structure, in the same manner as in the twelfth embodiment, and the final semiconductor element 3500 is achieved thereby.

Fifth Modification

Figure 100:
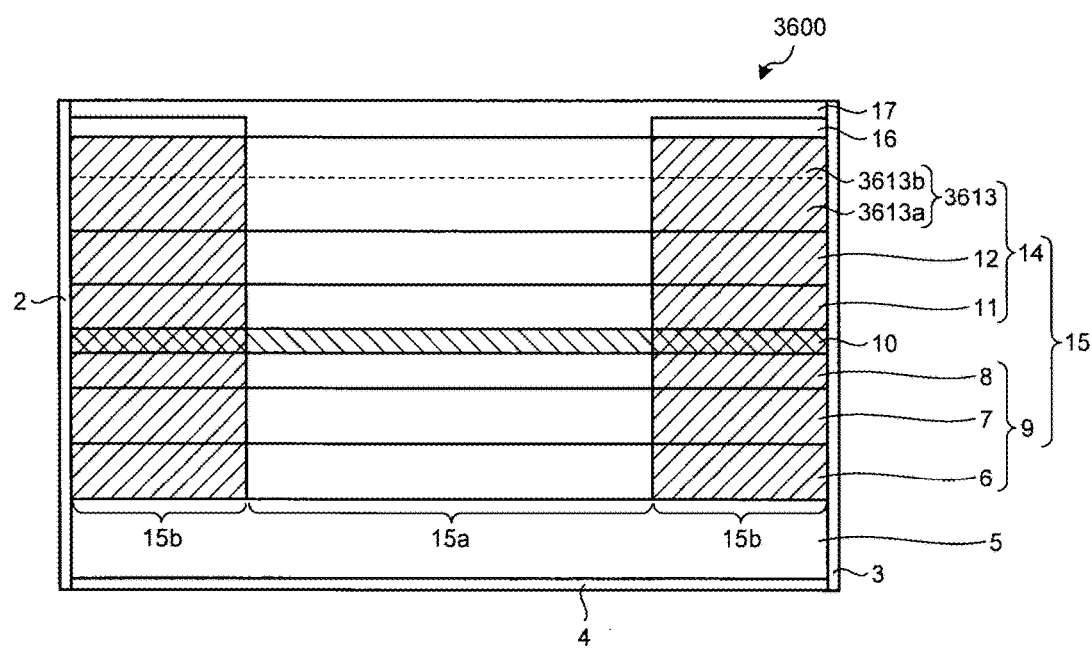
FIG. 100 is a cross-sectional view along the y-z plane in a semiconductor element according to a fifth modification.

A method for manufacturing a semiconductor element according to a fifth modification of the twelfth embodiment will now be explained. To begin with, a semiconductor element that can be manufactured with the method for manufacturing a semiconductor element according to the fifth modification will now be explained. FIG. 100 is a cross-sectional view along the y-z plane in the semiconductor element according to the fifth modification. As illustrated in FIG. 100, this semiconductor element 3600 according to the fifth modification has a p-type contact layer 3613 including a p-type contact layer 3613a doped with C 21 and a p-type contact layer 3613b doped with Zn 22, in the same manner as the semiconductor element 3100 according to the twelfth embodiment.

Figure 101:
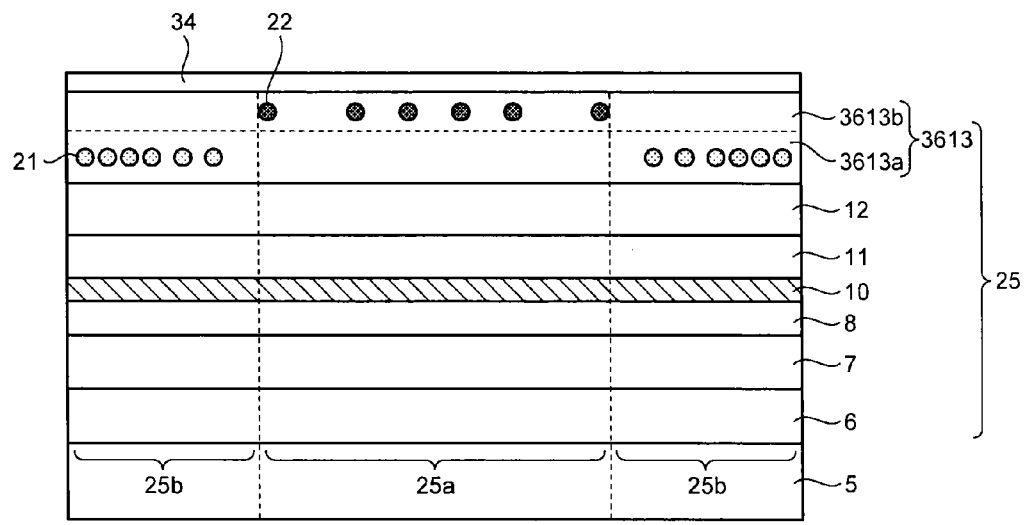
FIG. 101 is a schematic for explaining an exemplary method for manufacturing a semiconductor element according to the fifth modification.

The method for manufacturing the semiconductor element 3600 according to the fifth modification will now be explained. FIG. 101 is a schematic for explaining an exemplary method for manufacturing the semiconductor element according to the fifth modification. In the method for manufacturing the semiconductor element 3600 according to the fifth modification, the p-type contact layer 3613a and the p-type contact layer 3613b not doped with any impurity is formed as the p-type contact layer 3613. The p-type contact layer 3613a is then doped with C 21, and the p-type contact layer 3613b is doped with Zn 22 by ion implantation. At this time, the p-type contact layer 3613b is doped with Zn 22 that is the suppressing species so that a larger amount of Zn 22 is contained in the first region 25a, and the p-type contact layer 3613a is doped with C 21 that is the promoting species so that a larger amount of C 21 is contained in the second region 25b. The dielectric film 34 is then uniformly deposited on the p-type contact layer 3613, to achieve the structure illustrated in FIG. 101. The annealing process, the ridge structure forming process, and the like are performed to this structure in the same manner as in the twelfth embodiment, and the final semiconductor element 3600 is achieved thereby. The same layer may be doped with both C 21 and Zn 22 by the ion implantation.

In the twelfth embodiment, the different degrees of disordering in the non-window region 15a and the window region 15b are achieved by selectively removing the semiconductor layer containing the impurity by etching or the like, by allowing the impurity-containing layer with an intended impurity content to grow again, or by performing selective ion implantation. However, embodiments of the present invention are not limited thereto. Alternatively, the different degrees of disordering may be achieved in the non-window region 15a and the window region 15b by selectively depositing a simple substance of an element functioning as the suppressing species or the promoting species, or a compound containing the suppressing species or the promoting species on the semiconductor layer structure 25, and by causing diffusion by the annealing, for example.

Thirteenth Embodiment

Figure 102:
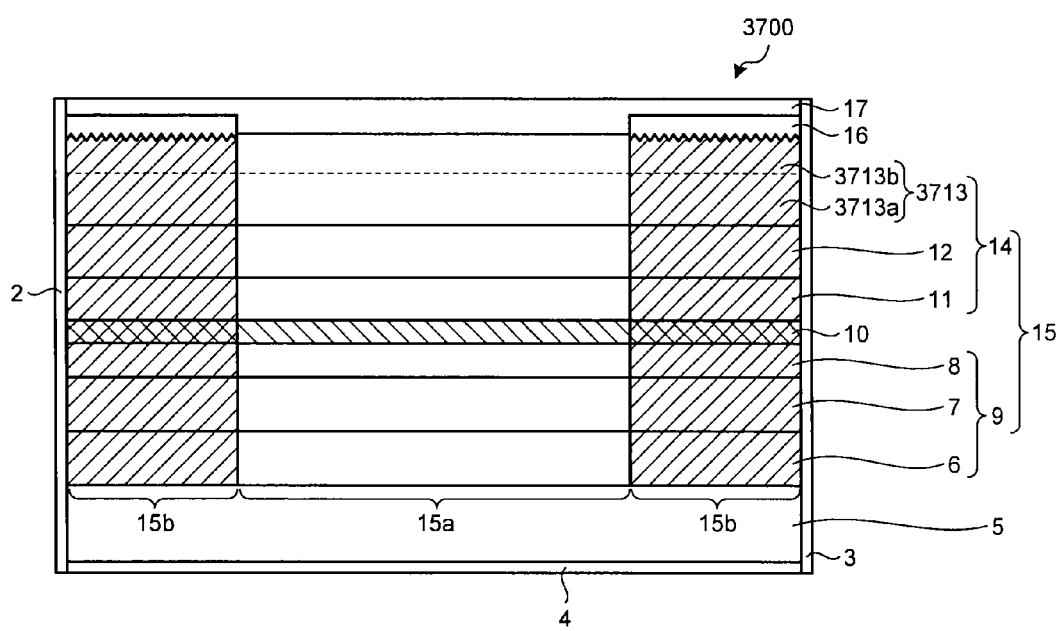
FIG. 102 is a cross-sectional view along the y-z plane in a semiconductor element that can be manufactured with the manufacturing method according to a thirteenth embodiment of the present invention.

A method for manufacturing a semiconductor element according to a thirteenth embodiment of the present invention will now be explained. To begin with, a semiconductor element that can be manufactured with the manufacture method according to the thirteenth embodiment will be explained. As illustrated in FIG. 102, a semiconductor element 3700 that can be manufactured with the manufacturing method according to the thirteenth embodiment has the same structure as the semiconductor element 3100 according to the twelfth embodiment except for a p-type contact layer 3713. The p-type contact layer 3713 includes a p-type contact layer 3713a doped with C 21 and a p-type contact layer 3713b doped with Zn 22, in the same manner as the semiconductor element 3100, but the p-type contact layer 3713b in the window region 15b is not removed by etching, unlike in the semiconductor element 3100. Furthermore, the topmost surface of the p-type contact layer 3713b in the window region 15b is rougher than the topmost surface of the p-type contact layer 3713b in the non-window region 15a. An operation of the semiconductor element 3700 is the same as that of the semiconductor element 3100, and the semiconductor element 3700 operates as a semiconductor laser element with a lower risk of COD.

An exemplary method for manufacturing the semiconductor element 3700 will now be explained. The method for manufacturing the semiconductor element 3700 according to the thirteenth embodiment includes the semiconductor layer structure forming process, the first annealing preparation process, the second annealing preparation process, the annealing process, and the ridge structure forming process illustrated in FIG. 81, in the same manner as in the twelfth embodiment.

Semiconductor Layer Structure Forming Process

Figure 103:
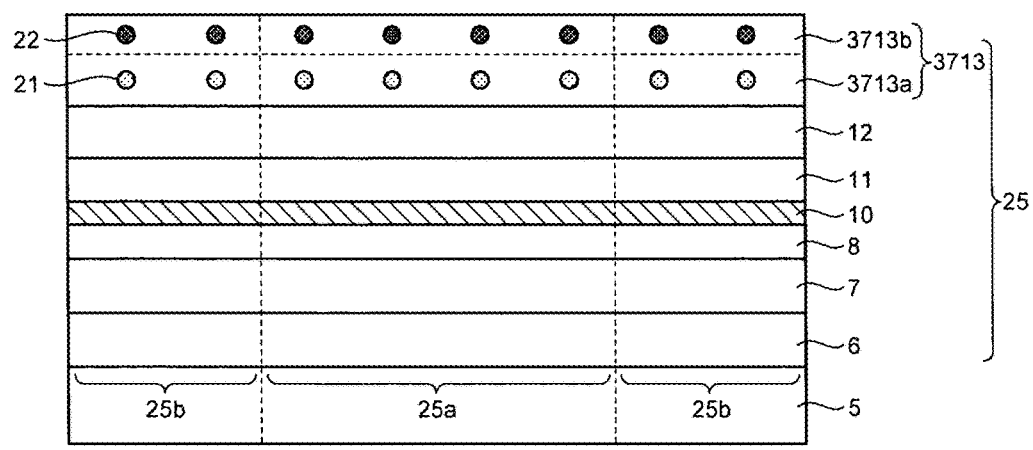
FIG. 103 is a schematic for explaining a method for manufacturing a semiconductor element according to the thirteenth embodiment.

To begin with, the semiconductor layer structure forming process will be explained. In this process, to begin with, as illustrated in FIG. 103, the semiconductor layer structure 25 including the active layer 10 is formed through MOCVD. The semiconductor layer structure 25 is the same as the semiconductor layer structure 25 in the semiconductor element 3100, and the p-type contact layer 3713a is doped with C 21, and the p-type contact layer 3713b is doped with Zn 22. In the semiconductor layer structure 25, the region that is to be the non-window region 15a is referred to as the first region 25a, and the region that is to be the window region 15b is referred to as the second region 25b.

First Annealing Preparation Process

The first annealing preparation process will now be explained. In this process, the surface roughness of the topmost surface of the first region 25a is made different from that of the topmost surface of the second region 25b. When the topmost surface of the semiconductor layer structure 25 that is brought into contact with the dielectric film 34 is rougher, atomic holes appear more easily on the interface with the dielectric film 34 in the semiconductor layer structure 25 when annealed, and disordering in the active layer 10 is promoted thereby.

Figure 104:
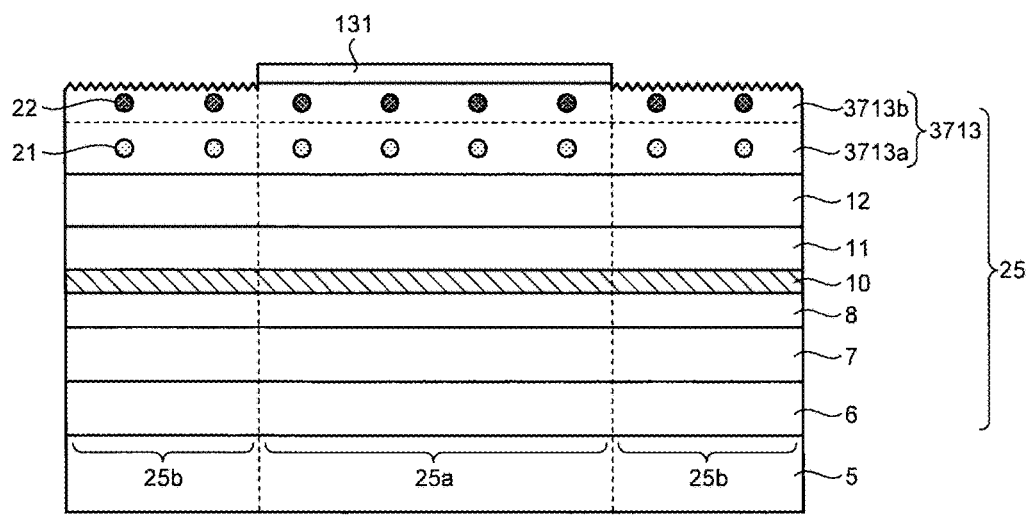
FIG. 104 is a schematic for explaining the method for manufacturing a semiconductor element according to the thirteenth embodiment.

To begin with, as illustrated in FIG. 104, the photoresist 131 is applied to the top surface of the first region 25a of the semiconductor layer structure 25 by the photolithography process. The topmost surface of the p-type contact layer 3713b in the second region 25b is selectively etched using a plasma process such as reactive ion etching (RIE) as a surface treatment that increases the surface roughness. As the etching gas for the RIE, $O_2$ plasma gas may be used, for example. Through this process, the surface roughness as average surface roughness of the topmost surface of the p-type contact layer 3713b is increased to 3 nanometers or more, for example, in the second region 25b. In the first region 25a that is not etched due to the masking with the photoresist 131, the surface roughness as average surface roughness of the topmost surface of the p-type contact layer 3713b is 1 nanometer or so.

The photoresist 131 is then removed. Through this process, the topmost surface of the second region 25b can made rougher than that of the topmost surface of the first region 25a. Disordered crystals grow in the active layer 10 more easily in the second region 25b than in the first region 25a when annealed. By allowing the topmost surface of the second region 25b to be rougher than the topmost surface of the first region 25a, the band gap energy difference can be achieved without etching out a large amount of the p-type contact layer 3713b in the second region 25b. The p-type contact layer 3713b may even be left unremoved in the second region 25b. The border between the first region 25a and the second region 25b can thus be kept covered more than in the twelfth embodiment. When used is an equipment into which samples with photoresist cannot be introduced, or when used is a process causing the photoresist to deteriorate, a dielectric film can be used as a mask in replacement of the photoresist 131. The surface roughness can be measured with a technique such as atomic force microscope (AFM) or X-ray reflectivity measurement.

Second Annealing Preparation Process

Figure 105:
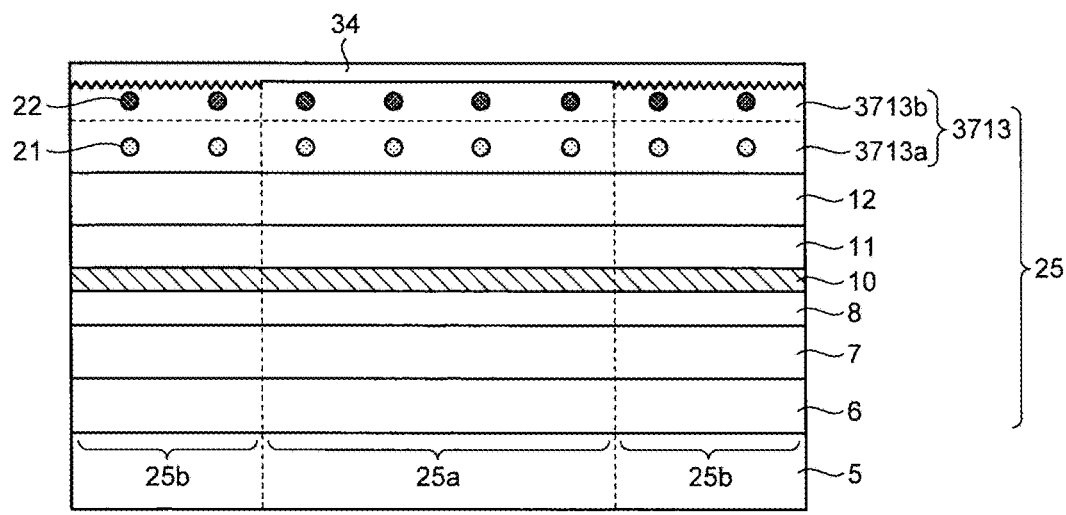
FIG. 105 is a schematic for explaining the method for manufacturing a semiconductor element according to the thirteenth embodiment.

The second annealing preparation process will now be explained. In this process, as illustrated in FIG. 105, the dielectric film 34 is uniformly deposited on the topmost surface of the semiconductor layer structure 25. Before the dielectric film 34 is deposited, the topmost surface is preferably cleaned with sulfuric acid or the like to remove any substance attached on the surface, while ensuring not to affect the surface roughness of the first region 25a and the second region 25b.

Annealing Process

The annealing process will now be explained. In this process, the RTA is carried out at a temperature of 850 degrees Celsius for 30 seconds, for example, in the same manner as in the twelfth embodiment. During the RTA, disordering in the active layer 10 is promoted in the second region 25b with higher surface roughness, and the second region 25b is turned into the window region 15b, while the first region 25a with low surface roughness is turned into the non-window region 15a.

Ridge Structure Forming Process

The ridge structure forming process can be conducted in the same manner as in the twelfth embodiment. The insulating film 16, the opening 16a, the lower electrode 4, and the upper electrode 17 are then formed. The substrate 5 is cleaved, and the low reflection film 2 and the high reflection film 3 are applied to the respective cleavage facets. The semiconductor layer structure is then diced into elements, achieving the semiconductor element 3700 thereby.

As described above, the method for manufacturing the semiconductor element 3700 according to the thirteenth embodiment is capable of producing the non-window region and the window region with different degrees of disordering with a more simplified process.

Example 11

Figure 106:
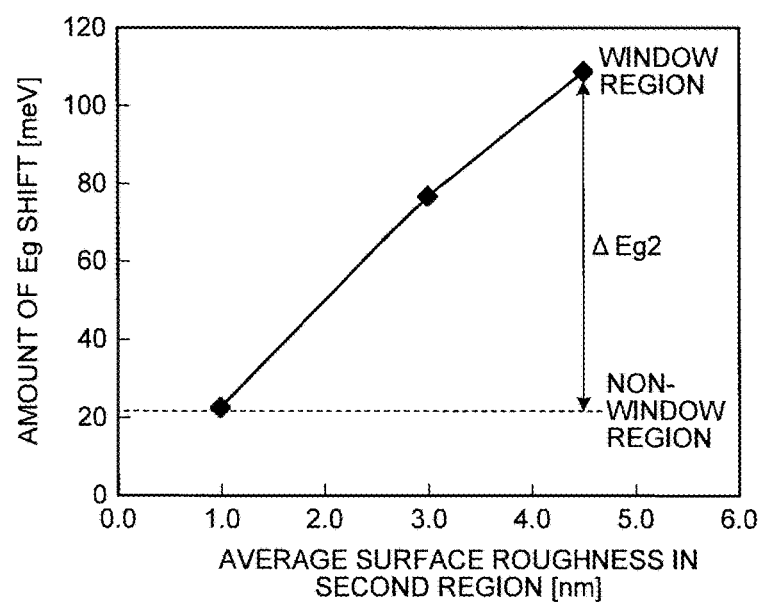
FIG. 106 is a schematic illustrating a relation between the average surface roughness of and the amount of band gap energy shift in the second region in Example 11.

As Example 11 of the semiconductor element 3700 manufactured with the manufacture method according to the thirteenth embodiment, a relation between the surface roughness and the degrees of disordering in the active layer 10 in the p-type contact layer 3713b of the second region 25b was measured. FIG. 106 is a schematic illustrating a relation between the average surface roughness of and the amount of band gap energy shift in the second region in Example 11. As indicated by FIG. 106, when the surface roughness of the topmost surface of the p-type contact layer 3713b in the second region 25b was increased, disordering in the active layer 10 was promoted, and the amount of band gap energy shift was increased.

Because the surface roughness in the first region 25a not etched and to be the non-window region 15a remains the same, when the surface roughness of the p-type contact layer 13b in the second region 25b is increased, the difference between the surface roughness in the first region 25a and the surface roughness in the second region 25b is increased, and the band gap energy difference $\Delta Eg2$ between the non-window region 15a and the window region 15b is increased. When the average surface roughness of the second region 25b was increased to 3.0 nanometers or more, while the first region 25a was 1.0 nanometer, ensuring an average surface roughness difference equal to or more than 2.0 nanometers between the first region 25a and the second region 25b, the resultant band gap energy difference $\Delta Eg2$ between the non-window region 15a and the window region 15b was 60 milli electron volts or more, so that the risk of COD can be sufficiently reduced. In particular, when the average surface roughness of the second region 25b was set to 4.5 nanometers, ensuring the average surface roughness difference of 3.5 nanometers between the first region 25a and the second region 25b, the resultant $\Delta Eg2$ was equal to or more than 85 milli electron volts, demonstrating that the risk of COD can be further reduced.

The RIE using $O_2$ plasma is described as an example of the surface process in the thirteenth embodiment. However, different levels of surface roughness on the first region and the second region can also be achieved using other techniques such as wet etching using sulfuric acid, hydrogen peroxide, or citric acid, for example, acid treatment with sulfuric acid, hydrochloric acid, hydrofluoric acid, phosphoric acid, or tartaric acid, for example, alkali treatment with ammonia or a developer (e.g., tetramethylammonium hydroxide), for example, organic cleaning using acetone, ethanol, methanol, methyl ethyl ketone, or isopropyl alcohol (IPA), for example, a mechanical process such as polishing, or a physical process using laser processing, or electron beam irradiation, for example. Furthermore, embodiments of the present invention are not limited thereto, and the regions with different degrees of disordering can be achieved with one dielectric film using any method for achieving different levels of surface roughness on the first region and the second region by means of some kind of surface treatment.

Fourteenth Embodiment

A method for manufacturing a semiconductor element according to a fourteenth embodiment of the present invention will now be explained. With the manufacturing method according to the fourteenth embodiment, a semiconductor element having the same structure as in the seventh embodiment can be manufactured.

Figure 107:
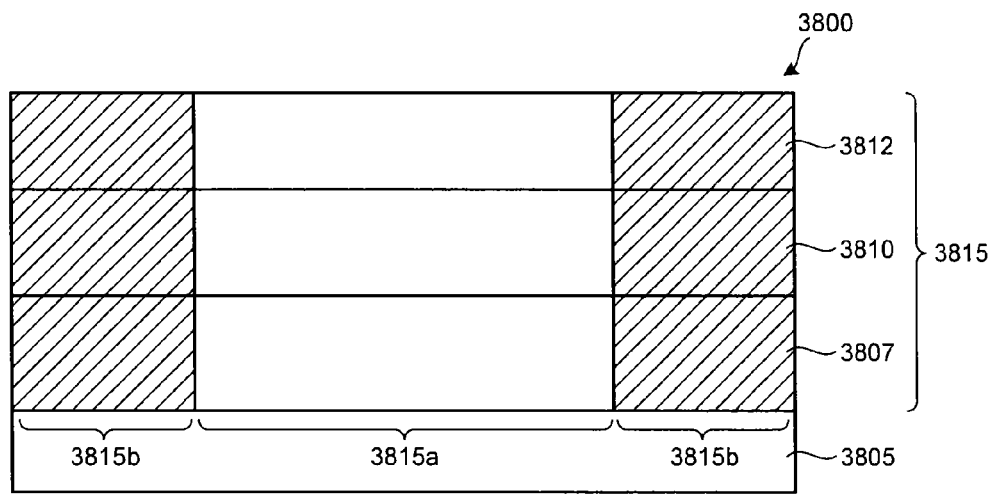
FIG. 107 is a cross-sectional view along the x-y plane in a semiconductor element that can be manufactured with the manufacturing method according to a fourteenth embodiment of the present invention.

FIG. 107 is a cross-sectional view along the x-y plane in the semiconductor element that can be manufactured with the manufacturing method according to the fourteenth embodiment. This semiconductor element 3800 is provided with a substrate 3805 and a semiconductor layer portion 3815 including a lower cladding layer 3807, a core layer 3810, and an upper cladding layer 3812 made of GaAs, for example, sequentially formed on the substrate 3805. The semiconductor layer portion 3815 also included a disordering suppressed region 3815a and a disordering promoted region 3815b.

The semiconductor element 3800 has a structure that confines light in the y-axial direction with the core layer 3810, and the lower cladding layer 3807 and the upper cladding layer 3812 between which the core layer 3810 is sandwiched and made of a semiconductor with a smaller refractive index than that of the core layer. The semiconductor element 3800 also has a structure that confines light in the x-axial direction by the disordering suppressed region 3815a and the disordering promoted region 3815b surrounding the disordering suppressed region 3815a and having a smaller refractive index than the disordering suppressed region 3815a. The semiconductor element 3800 thus functions as a semiconductor light waveguide guiding the light in the z-axial direction.

An exemplary method for manufacturing the semiconductor element 3800 will now be explained. The method for manufacturing the semiconductor element 3800 according to the fourteenth embodiment includes the semiconductor layer structure forming process, the first annealing preparation process, the second annealing preparation process, and the annealing process, as illustrated in FIG. 81, in the same manner as in the twelfth embodiment.

Semiconductor Layer Structure Forming Process

Figure 108:
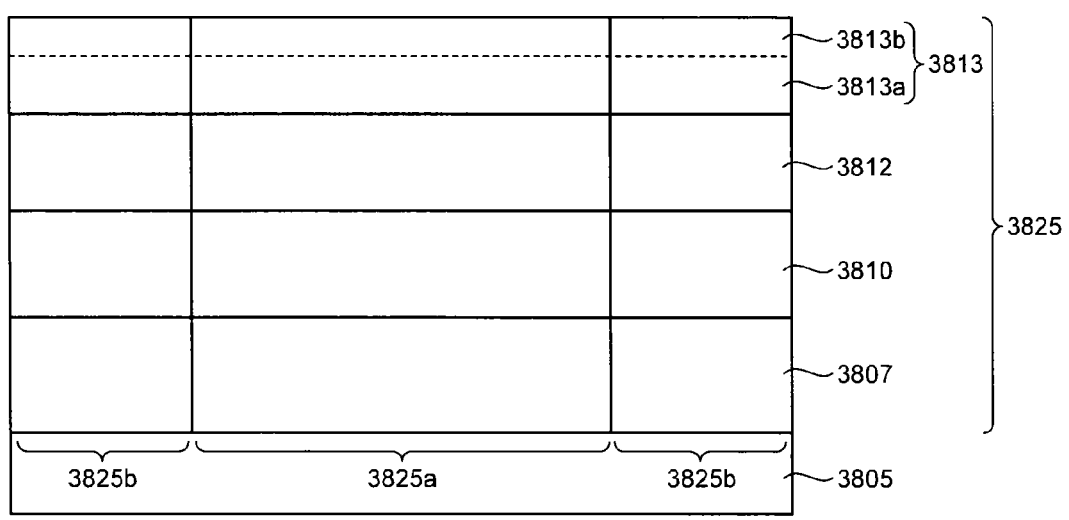
FIG. 108 is a schematic for explaining a method for manufacturing a semiconductor element according to the fourteenth embodiment.

In this process, to begin with, as illustrated in FIG. 108, the lower cladding layer 3807, the core layer 3810, and the upper cladding layer 3812 are deposited on the substrate 3805 through MOCVD. An impurity-containing layer 3813 including a promoting species containing layer 3813a doped with the promoting species and an suppressing species containing layer 3813b doped with the suppressing species is then further formed, to achieve a semiconductor layer structure 3825.

First Annealing Preparation Process

In this process, the suppressing species containing layer 3813b is removed from a second region 3825b in the semiconductor layer structure 3825 by etching, so that a less amount of the suppressing species is contained in the second region 3825b than in a first region 3825a. With this structure, disordered crystals grow more easily by the subsequent annealing in the second region 3825b to be the disordering promoted region 3815b, than the first region 3825a to be the disordering suppressed region 3815a, in the semiconductor layer structure 3825.

Figure 109:
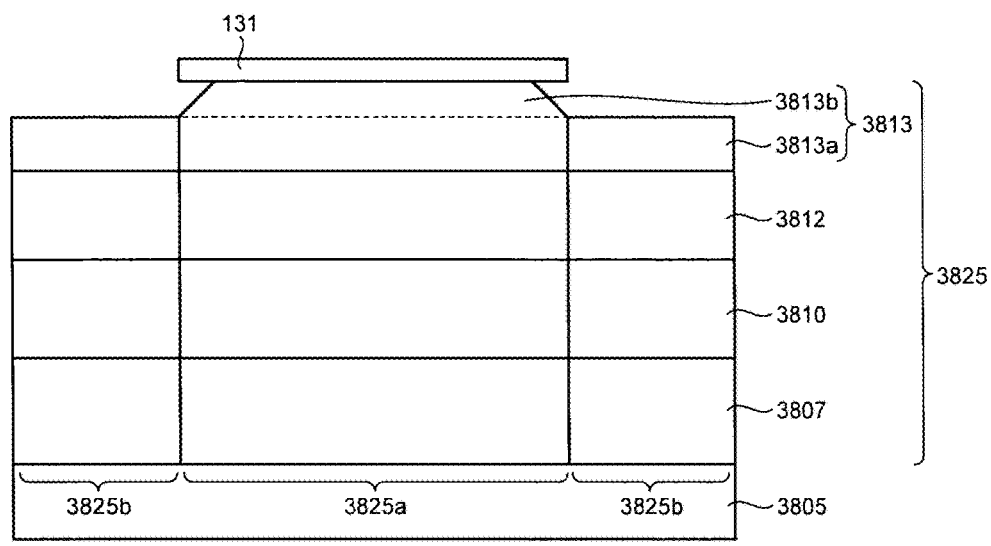
FIG. 109 is a schematic for explaining the method for manufacturing a semiconductor element according to the fourteenth embodiment.

To begin with, the photoresist 131 is applied on the top surface of the first region 3825a in the semiconductor layer structure 3825 by the photolithography process. The suppressing species containing layer 3813b in the second region 3825b is then removed by etching, as illustrated in FIG. 109.

The photoresist 131 is then removed. After this process, the second region 3825b contains a less amount of the suppressing species than the first region 3825a, so that disordered crystals grow in the semiconductor layer portion 3815 more easily in the second region 3825b than in the first region 3825a by the annealing. An inclined surface may be provided along the border between the first region 3825a and the second region 3825b, as illustrated, but no inclined surface may be provided. This is because the semiconductor layer structure 3825 is not affected by the surface roughness resulting from the annealing, because the impurity-containing layer 3813 is removed in the subsequent process.

Second Annealing Preparation Process

Figure 110:
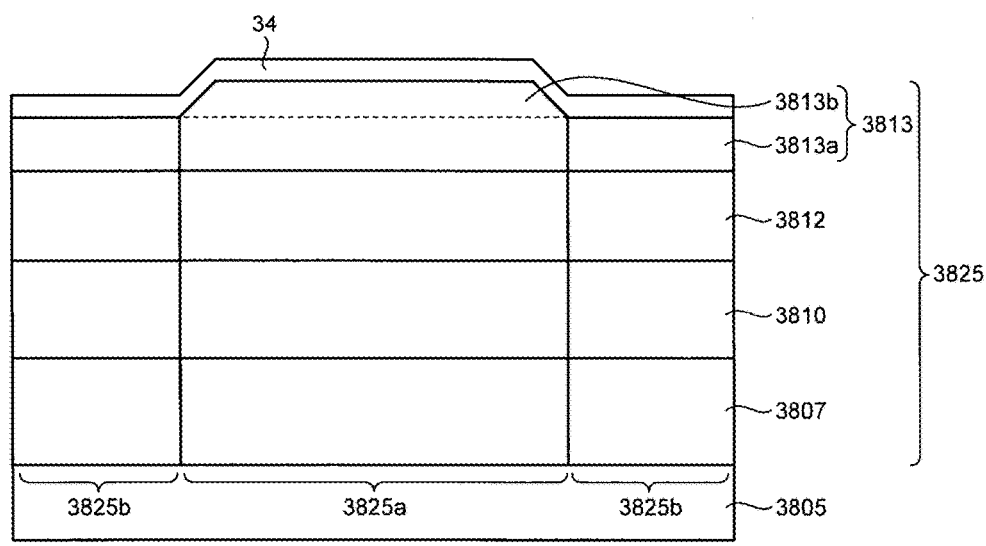
FIG. 110 is a schematic for explaining an exemplary method for manufacturing a semiconductor element according to the fourteenth embodiment.

In this process, as illustrated in FIG. 110, the dielectric film 34 is uniformly deposited on the topmost surface of the semiconductor layer structure 3825. Before the dielectric film 34 is deposited, the top surface is preferably cleaned with sulfuric acid or the like to remove any substance attached on the surface.

Annealing Process

In this process, the RTA is carried out at a temperature of 850 degrees Celsius for 30 seconds, for example, in the same manner as in the twelfth embodiment. When the RTA is carried out, the dielectric film 34 absorbs the Ga atoms, and atomic vacancies appear on the impurity-containing layer 3813. The atomic vacancies diffuse as the diffusing species, and disordering is induced in the semiconductor layer portion thereby. Through this process, the disordering suppressed region 3815a and the disordering promoted region 3815b with different degrees of disordering are formed (see FIG. 107). The impurity-containing layer 3813 is then removed by etching, for example, and the final semiconductor element 3800 is achieved thereby.

As described above, in the manufacture method according to the fourteenth embodiment, the regions with different degrees of disordering can be achieved with a more simplified process. In the manner described above, the present invention can be applied to a semiconductor light waveguide, such as that according to the fourteenth embodiment, without limitation to the semiconductor laser element as disclosed in the twelfth and the thirteenth embodiment, and to the semiconductor laser element or the semiconductor element according to the other embodiments.

In the fourteenth embodiment, a third region with a different degree of disordering may be provided outside of the second region, in the same manner as in the seventh embodiment, to improve the optical confinement in the x-axial direction. Furthermore, the degrees of disordering may be changed continuously by continuously changing the thickness of the suppressing species containing layer in the x-axial direction, for example. Such a structure can also achieve the regions with different degrees of disordering with one dielectric film, in the same manner as in the embodiments described above.

As the results described above indicate, the method for manufacturing the semiconductor element according to any one of the embodiments of the present invention was demonstrated to be capable of forming the regions with different degrees of disordering using one dielectric film, capable of providing a simple manufacture process, and capable of sufficiently reducing the risk of COD.

The manufacture of a semiconductor element is explained as those of a semiconductor laser element and of a semiconductor light waveguide in the embodiments, but the present invention is not limited thereto, and the present invention may be also used in manufacturing a semiconductor element as an electronic element such as a transistor or a diode.

Furthermore, in the embodiment described above, the topmost surface of the semiconductor layer structure is brought into contact with a dielectric film that is uniform SiNx before the annealing, but the present invention is not limited thereto. A semiconductor layer structure with different degrees of disordering may also be achieved by uniformly depositing a dielectric film made of SiOx, ZnOx, AlOx, AlNx, AlOxNy, TiOx, TiNx, TiOxNy, TaOx, or HfOx, a metallic film such as Ti, Ta, Al, Au, Ni, Zn, and Pt, or a semiconductor film such as Si, Ge, GaAs, AlGaAs, GaN, AlGaN, and ZnSe on the topmost surface of the semiconductor layer structure before the annealing. According to the present invention, the uniform medium is not limited to a uniform film. For example, the regions with different degrees of disordering may also be achieved in the semiconductor layer structure by bringing the topmost surface of the semiconductor layer structure into contact with uniform gaseous atmosphere such as $N_2$, As, As compounds such as arsine, and Ar, and annealing in the gaseous atmosphere.

Furthermore, in the twelfth and the fourteenth embodiments, the impurity-containing layer is selectively removed by etching so that disordered crystals grow in the active layer more easily by the annealing in the second region than that in the first region. In the thirteenth embodiment, different levels of surface roughness are provided to the topmost surface of the semiconductor layer structure with which the dielectric film is brought into contact so that disordered crystals grow in the active layer more easily in the second region than that in the first region by the annealing. However, the selective etching as disclosed in the twelfth and the fourteenth embodiments and providing different levels of surface roughness to the topmost surface as disclosed in the thirteenth embodiment may also be combined to achieve the regions with a larger difference in the degrees of disordering in the semiconductor layer structure in order to provide a semiconductor laser element with a lower risk of COD, for example.

Furthermore, in the embodiment described above, C and Zn are mentioned as examples of the p-type impurity, but the first impurity may be Mg and Be, for example, and the second impurity may be Si, Ge, Sn, S, and Se, for example, and two or more that are a plurality of impurities may be used as dopants.

Furthermore, used in the embodiments described above as an example is a semiconductor laser element having a ridge structure, but the present invention may be also used in any semiconductor laser element without limitation to those with a ridge structure. Explained in the embodiments described above is a structure in which the n-type buffer layer 6, the n-type cladding layer 7, the n-type guide layer 8, the active layer 10, the p-type guide layer 11, the p-type cladding layer 12, and the p-type contact layer 13 are formed on the substrate 5, but the structure may also include a p-type buffer layer, a p-type cladding layer, a p-type guide layer, an active layer, an n-type guide layer, an n-type cladding layer, and an n-type contact layer sequentially formed on the substrate 5. In such a structure, different impurity contents of the n-type semiconductor layer section, the impurity being the n-type dopant, may be provided to the non-window region 15a and the window region 15b. As the n-type dopant, Si, C, Ge, Sn, S, Se, or the like may be used.

Furthermore, the layer structure may include a substrate made of another material such as InP, or include other materials, depending on the desired oscillation wavelength.

Furthermore, the embodiments described above are not intended to limit the scope of the present invention in any way. Any appropriate combinations of the elements described above fall within the scope of the present invention. Furthermore, any further advantageous effects or modifications can be easily thought of by those skilled in the art. Therefore, a wider range of embodiments of the present invention is not limited to those described above, and various modifications of the present invention are still possible.

The semiconductor optical element, the semiconductor laser element, and the method for manufacturing the semiconductor optical element and the semiconductor laser element, and the method for manufacturing a semiconductor laser module and a semiconductor element according to the present invention are suitable for a semiconductor element employing a disordering technology.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser element that is an edge emitting semiconductor laser element, comprising:
   a semiconductor layer portion including an active layer, wherein
   the semiconductor layer portion has a non-window region including a part of the active layer and extending in a deposition direction, and a window region provided at least in a region adjacent to a facet from which laser light is output, the window region including another part of the active layer, having a higher band gap energy increased through atomic vacancy diffusion than that in the non-window region, and extending in the deposition direction,
   the semiconductor layer portion contains a first impurity having a function of suppressing the atomic vacancy diffusion and a second impurity having a function of promoting the atomic vacancy diffusion, between a topmost surface of the semiconductor layer portion and the active layer, and
   the non-window region has a higher content of the first impurity than in the window region, and contains the second impurity.

2. The semiconductor laser element according to claim 1, wherein the window region has a content of the first impurity lower by $3.5 \times 10^{13}$ $cm^{-2}$ or more than in the non-window region.

3. The semiconductor laser element according to claim 1, wherein the first impurity contains at least one of C, Zn, Mg, and Be.

4. The semiconductor laser element according to claim 1, wherein the second impurity contains at least one of Si, C, Zn, Ge, Sn, S, and Se.

5. The semiconductor laser element according to claim 1, wherein a thickness between the topmost surface and the active layer is different between the window region and the non-window region.

6. The semiconductor laser element according to claim 1, further comprising a current injection area that is positioned on the topmost surface of the non-window region in the semiconductor layer portion and is positioned away from the window region.

7. The semiconductor laser element according to claim 1, wherein the semiconductor layer portion includes a contact layer containing the first impurity as a topmost layer in the non-window region.

8. The semiconductor laser element according to claim 1, wherein a topmost layer region of the semiconductor layer portion contains the first impurity and the second impurity, and the topmost layer region has a higher content of one of the first impurity and the second impurity with a lower diffusion coefficient.

9. The semiconductor laser element according to claim 1, wherein a maximum optical power per micrometer of a current injection width is 80 mW/µm or higher.

10. A semiconductor laser module comprising the semiconductor laser element according to claim 1, and capable of operating without adjusting temperature of the semiconductor laser element.

11. A semiconductor laser element that is an edge emitting semiconductor laser element, comprising:
a semiconductor layer portion including an active layer, wherein
the semiconductor layer portion has a non-window region including a part of the active layer and extending in a deposition direction, and a window region provided at least in a region adjacent to a facet from which laser light is output, the window region including another part of the active layer, having a higher band gap energy increased through atomic vacancy diffusion than that in the non-window region, and extending in the deposition direction,
the semiconductor layer portion contains a first impurity having a function of suppressing the atomic vacancy diffusion and a second impurity having a function of promoting the atomic vacancy diffusion, between a topmost surface of the semiconductor layer portion and the active layer, and
the window region has a higher content of the second impurity than in the non-window region, and contains the first impurity.

12. The semiconductor laser element according to claim 11, wherein the window region has a content of the second impurity higher by $3.5 \times 10^{13}$ cm$^{-2}$ or more than in the non-window region.

13. A semiconductor laser element that is an edge emitting semiconductor laser element, comprising:
a semiconductor layer portion including an active layer, wherein
the semiconductor layer portion has a non-window region including a part of the active layer, and a window region provided at least in a region adjacent to a facet from which laser light is output, the window region including another part of the active layer and having a higher band gap energy increased through atomic vacancy diffusion than that in the non-window region, and
a topmost layer region of the non-window region in the semiconductor layer portion contains a first impurity of a first conductivity type having a function of suppressing atomic vacancy diffusion and a second impurity of the first conductivity type having a function of promoting atomic vacancy diffusion, and the topmost layer region has a higher content of one of the first impurity and the second impurity with a lower diffusion coefficient.

14. The semiconductor laser element according to claim 13, wherein one of the first impurity and the second impurity with a higher diffusion coefficient has a concentration distribution declining toward the active layer from the topmost surface in the non-window region, and a gross content of the impurity with a higher diffusion coefficient and the impurity with a lower diffusion coefficient in the topmost layer region of the non-window region is more than an amount of the impurity with a lower diffusion coefficient with which the topmost layer region of the window region is doped.

15. The semiconductor laser element according to claim 13, wherein the first impurity is contained more in the non-window region than in the window region.

16. The semiconductor laser element according to claim 13, further comprising a current injection area that is positioned on the topmost surface of the non-window region in the semiconductor layer portion and is positioned away from the window region.

* * * * *